US009449982B2

(12) United States Patent
Lu et al.

(10) Patent No.: US 9,449,982 B2
(45) Date of Patent: Sep. 20, 2016

(54) METHOD OF MAKING A VERTICAL NAND DEVICE USING A SACRIFICIAL LAYER WITH AIR GAP AND SEQUENTIAL ETCHING OF MULTILAYER STACKS

(71) Applicant: SanDisk Technologies, Inc., Plano, TX (US)

(72) Inventors: Zhenyu Lu, Milpitas, CA (US); Sateesh Koka, Milpitas, CA (US); James Kai, Santa Clara, CA (US); Raghuveer S. Makala, Campbell, CA (US); Yao-Sheng Lee, Tampa, FL (US); Jayavel Pachamuthu, San Jose, CA (US); Johann Alsmeier, San Jose, CA (US); Henry Chien, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/748,808

(22) Filed: Jun. 24, 2015

(65) Prior Publication Data

US 2015/0294978 A1 Oct. 15, 2015

Related U.S. Application Data

(63) Continuation-in-part of application No. 14/585,912, filed on Dec. 30, 2014, which is a continuation of application No. 13/933,743, filed on Jul. 2, 2013, now Pat. No. 8,946,023.

(60) Provisional application No. 61/776,953, filed on Mar. 12, 2013.

(51) Int. Cl.
*H01L 27/115* (2006.01)
*H01L 21/311* (2006.01)
(Continued)

(52) U.S. Cl.
CPC ....... *H01L 27/1157* (2013.01); *H01L 21/0332* (2013.01); *H01L 21/0335* (2013.01);
(Continued)

(58) Field of Classification Search
CPC .............. H01L 27/1157; H01L 27/11582; H01L 27/11578; H01L 27/11563; H01L 27/11551; H01L 29/66833; H01L 29/7889; H01L 29/7926
See application file for complete search history.

(56) References Cited

U.S. PATENT DOCUMENTS 7,177,191 B2 2/2007 Fasoli et al.
7,221,588 B2 5/2007 Fasoli et al.
(Continued)

FOREIGN PATENT DOCUMENTS

EP 1398831 A2 3/2004
WO WO02/15277 A2 2/2002
(Continued)

OTHER PUBLICATIONS

Office Action, U.S. Appl. No. 14/207,012, issued Nov. 9, 2015, pp. 36pgs.
(Continued)

*Primary Examiner* — Evan Pert
*Assistant Examiner* — Farid Khan
(74) *Attorney, Agent, or Firm* — The Marbury Law Group PLLC

(57) ABSTRACT

A method of making a vertical NAND device includes forming a lower portion of a memory stack over a substrate, forming a lower portion of memory openings in the lower portion of the memory stack, and forming a sacrificial material portion including an encapsulated cavity. The method also includes forming an upper portion of the memory stack over the lower portion of the memory stack and over the sacrificial material, forming an upper portion of the memory openings in the upper portion of the memory stack to expose the sacrificial material in the lower portion of the memory openings, removing the sacrificial material portion to connect the lower portion of the memory openings with a respective upper portion of the memory openings to form continuous memory openings, and forming a semiconductor channel in each continuous memory opening.

20 Claims, 52 Drawing Sheets

US 9,449,982 B2

Page 2

(51) Int. Cl.
*H01L 21/033* (2006.01)
*H01L 21/822* (2006.01)
*H01L 29/66* (2006.01)
*H01L 27/06* (2006.01)
*H01L 29/788* (2006.01)
*H01L 29/792* (2006.01)

(52) U.S. Cl.
CPC ..... *H01L21/0337* (2013.01); *H01L 21/31105* (2013.01); *H01L 21/31144* (2013.01); *H01L 21/822* (2013.01); *H01L 21/8221* (2013.01); *H01L 27/0688* (2013.01); *H01L 27/11551* (2013.01); *H01L 27/11556* (2013.01); *H01L 27/11563* (2013.01); *H01L 27/11573* (2013.01); *H01L 27/11578* (2013.01); *H01L 27/11582* (2013.01); *H01L 29/66825* (2013.01); *H01L 29/66833* (2013.01); *H01L 29/7889* (2013.01); *H01L 29/7926* (2013.01); *H01L 27/11519* (2013.01); *H01L 27/11565* (2013.01)

(56) References Cited

U.S. PATENT DOCUMENTS

| | | |
|---|---|---|
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,394,716 B2 | 3/2013 | Hwang et al. |
| 8,445,347 B2 | 5/2013 | Alsmeier |
| 8,614,126 B1 | 12/2013 | Lee et al. |
| 8,658,499 B2 | 2/2014 | Makala et al. |
| 8,741,761 B2 | 6/2014 | Lee et al. |
| 8,828,884 B2 | 9/2014 | Lee et al. |
| 8,847,302 B2 | 9/2014 | Alsmeier et al. |
| 8,878,278 B2 | 11/2014 | Alsmeier et al. |
| 8,884,357 B2 | 11/2014 | Wang et al. |
| 8,946,023 B2 | 2/2015 | Makala et al. |
| 2006/0003531 A1 | 1/2006 | Chang et al. |
| 2006/0258076 A1 | 11/2006 | Mizushima et al. |
| 2007/0210338 A1 | 9/2007 | Orlowski |
| 2007/0252201 A1 | 11/2007 | Kito et al. |
| 2008/0067583 A1 | 3/2008 | Kidoh et al. |
| 2008/0169496 A1 | 7/2008 | Keller et al. |
| 2009/0026561 A1 | 1/2009 | Reichenbach et al. |
| 2009/0121271 A1 | 5/2009 | Son et al. |
| 2009/0242967 A1 | 10/2009 | Katsumata et al. |
| 2010/0044778 A1 | 2/2010 | Seol |
| 2010/0059811 A1 | 3/2010 | Sekine et al. |
| 2010/0109065 A1 | 5/2010 | Oh et al. |
| 2010/0112769 A1 | 5/2010 | Son et al. |
| 2010/0120214 A1 | 5/2010 | Park et al. |
| 2010/0155810 A1* | 6/2010 | Kim ................ H01L 27/11548 257/316 |
| 2010/0155818 A1 | 6/2010 | Cho |
| 2010/0171162 A1 | 7/2010 | Katsumata et al. |
| 2010/0181610 A1 | 7/2010 | Kim et al. |
| 2010/0207195 A1 | 8/2010 | Fukuzumi et al. |
| 2010/0213458 A1 | 8/2010 | Prall |
| 2010/0320528 A1 | 12/2010 | Jeong et al. |
| 2011/0002178 A1 | 1/2011 | Hwang et al. |
| 2011/0057251 A1 | 3/2011 | Higashi |
| 2011/0065270 A1* | 3/2011 | Shim ................ H01L 27/11556 438/589 |
| 2011/0076819 A1 | 3/2011 | Kim et al. |
| 2011/0133606 A1 | 6/2011 | Yoshida et al. |
| 2011/0163449 A1 | 7/2011 | Kelly et al. |
| 2011/0266606 A1 | 11/2011 | Park et al. |
| 2011/0287612 A1 | 11/2011 | Lee et al. |
| 2011/0312174 A1* | 12/2011 | Lee ................ H01L 27/11582 438/595 |
| 2012/0001247 A1* | 1/2012 | Alsmeier ......... H01L 27/11551 257/316 |
| 2012/0001249 A1 | 1/2012 | Alsmeier |
| 2012/0001250 A1* | 1/2012 | Alsmeier ......... H01L 27/11551 257/319 |
| 2012/0003800 A1* | 1/2012 | Lee ................ H01L 27/11551 438/261 |
| 2012/0052674 A1* | 3/2012 | Lee ................ H01L 27/11578 438/591 |
| 2012/0068242 A1 | 3/2012 | Shin et al. |
| 2012/0140562 A1 | 6/2012 | Choe et al. |
| 2012/0153376 A1 | 6/2012 | Alsmeier et al. |
| 2012/0256247 A1* | 10/2012 | Alsmeier ............. H01L 21/764 257/319 |
| 2012/0261638 A1 | 10/2012 | Sills et al. |
| 2012/0276719 A1* | 11/2012 | Han ................ H01L 29/7926 438/478 |
| 2013/0044531 A1 | 2/2013 | Baek et al. |
| 2013/0059422 A1* | 3/2013 | Lee ................ H01L 21/764 738/268 |
| 2013/0248974 A1* | 9/2013 | Alsmeier ............. G11C 16/04 257/321 |
| 2013/0264631 A1 | 10/2013 | Alsmeier et al. |
| 2013/0313627 A1 | 11/2013 | Lee et al. |
| 2013/0313717 A1 | 11/2013 | Holmes et al. |
| 2014/0008714 A1* | 1/2014 | Makala ............. H01L 21/28273 257/324 |
| 2014/0264525 A1* | 9/2014 | Takahashi ............. H01L 27/115 257/314 |
| 2014/0273373 A1 | 9/2014 | Makala et al. |

FOREIGN PATENT DOCUMENTS

| | | |
|---|---|---|
| WO | WO2008/118433 A1 | 10/2008 |
| WO | WO2009/085078 A1 | 7/2009 |
| WO | WO2012/003301 A2 | 1/2012 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).

(56) References Cited

OTHER PUBLICATIONS

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

International Search Report and Written Opinion, International Application No. PCT/US2014/023276, issued Jun. 30, 2014 (13 pages).

International Search Report and Written Opinion, International Application No. PCT/US2014/020290, issued Jun. 25, 2014.

\* cited by examiner

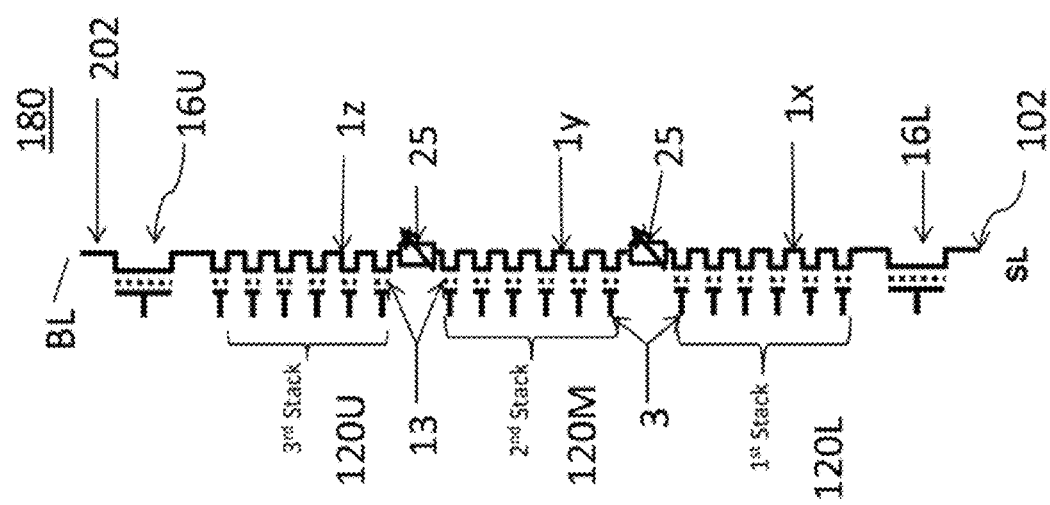

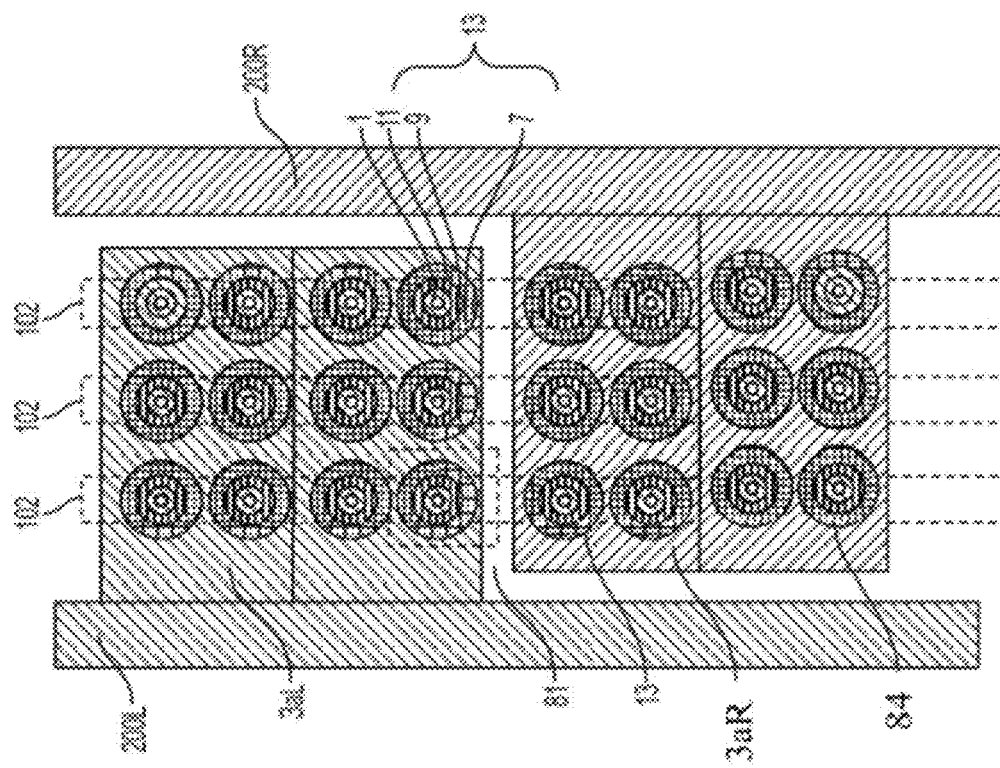

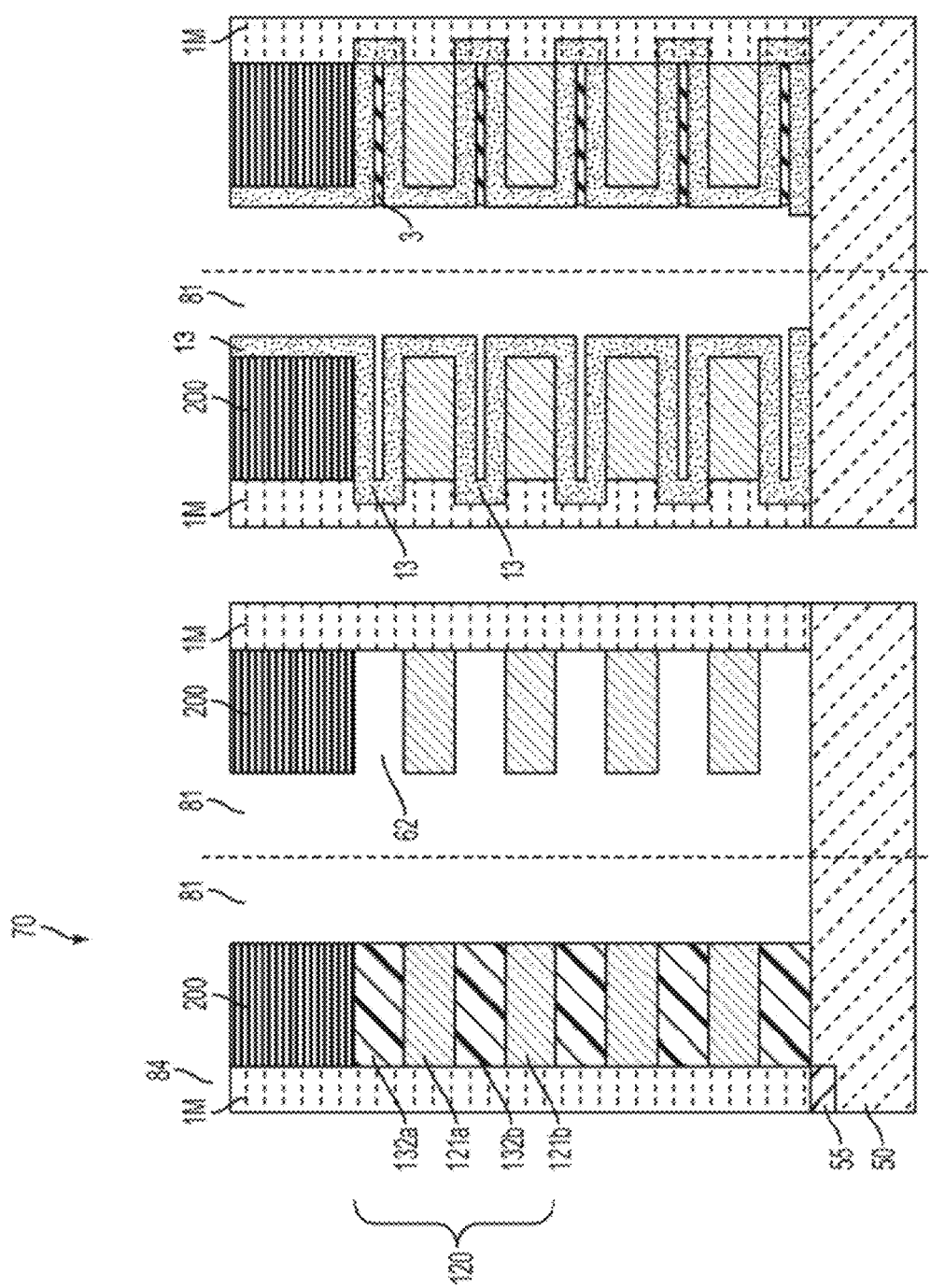

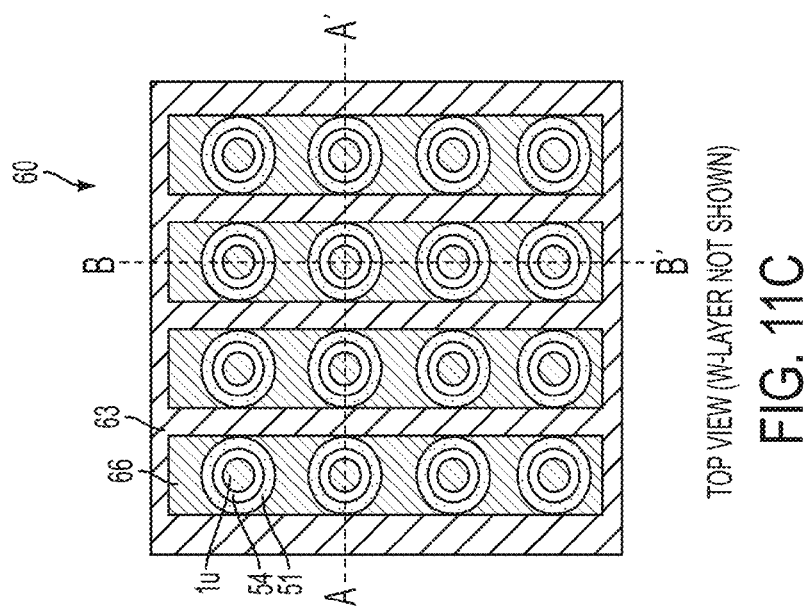
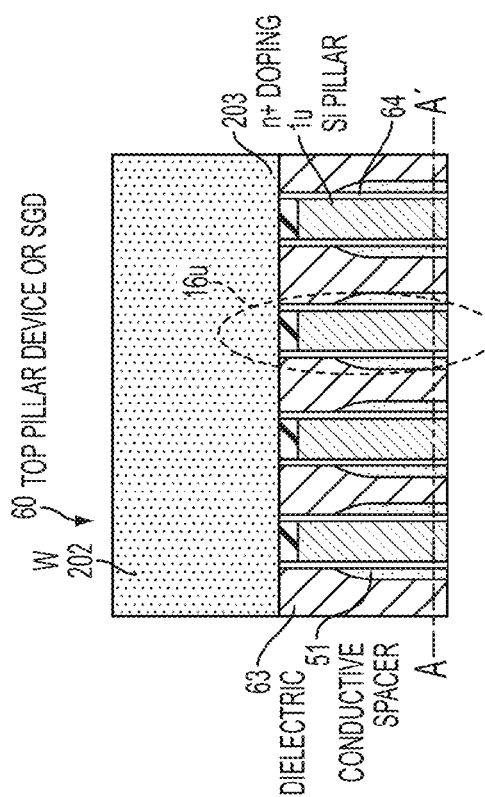
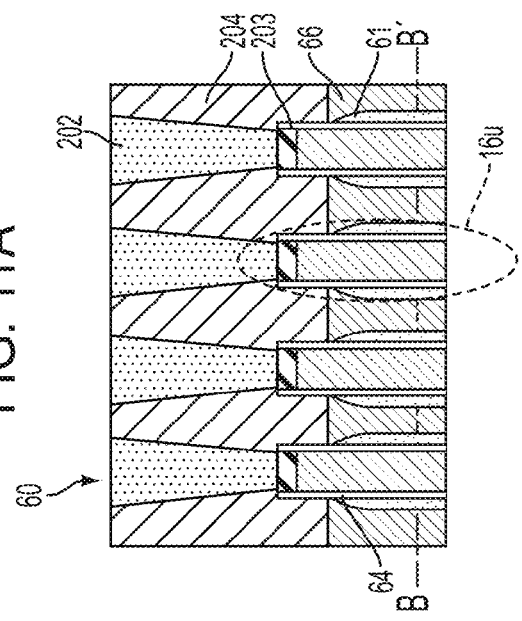

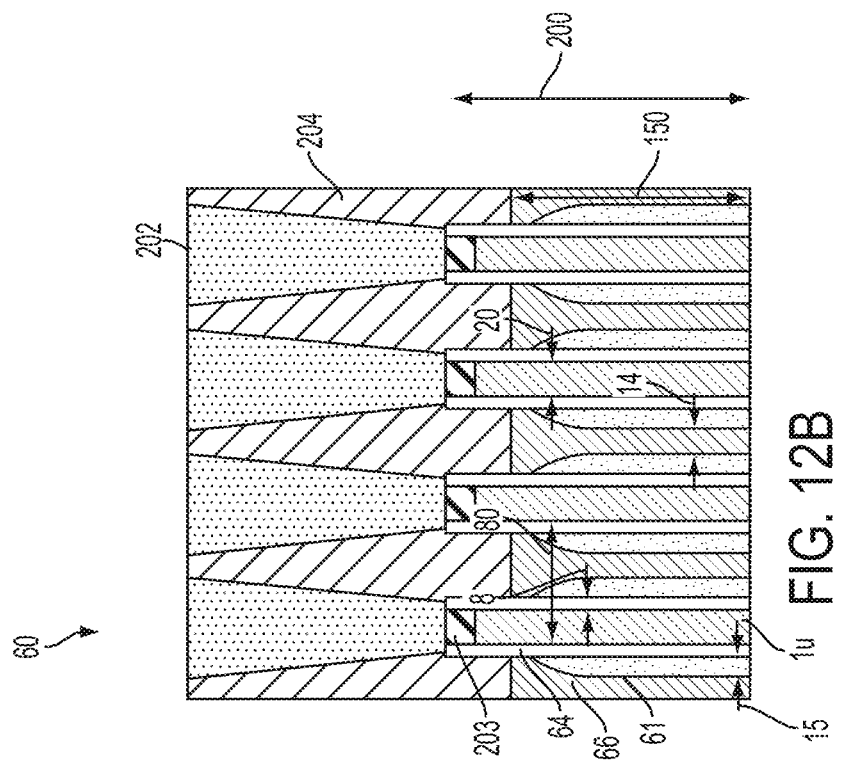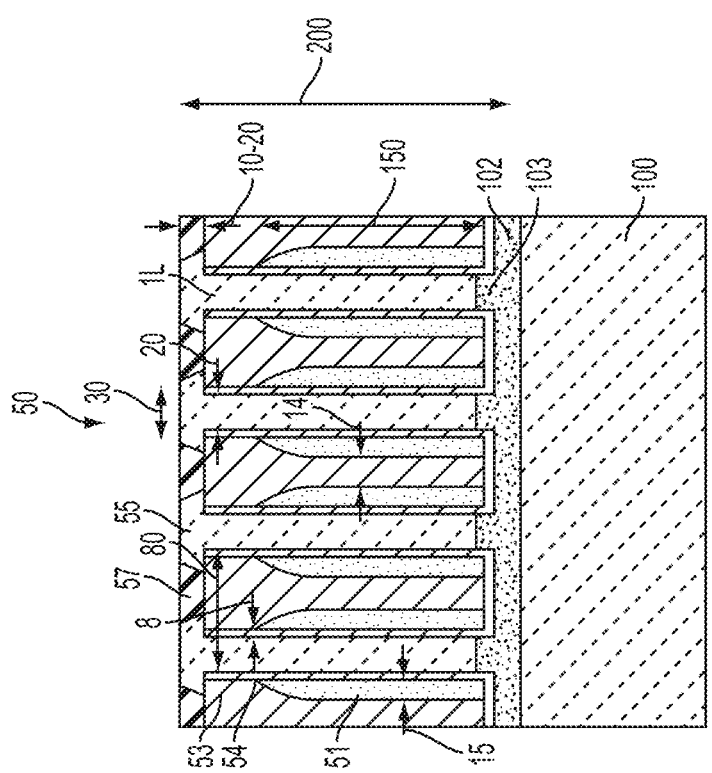

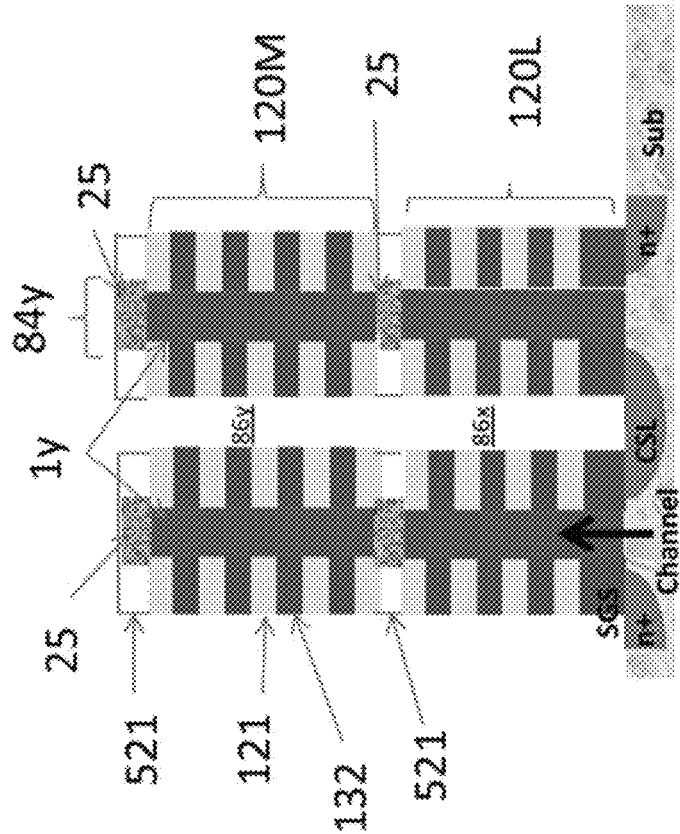
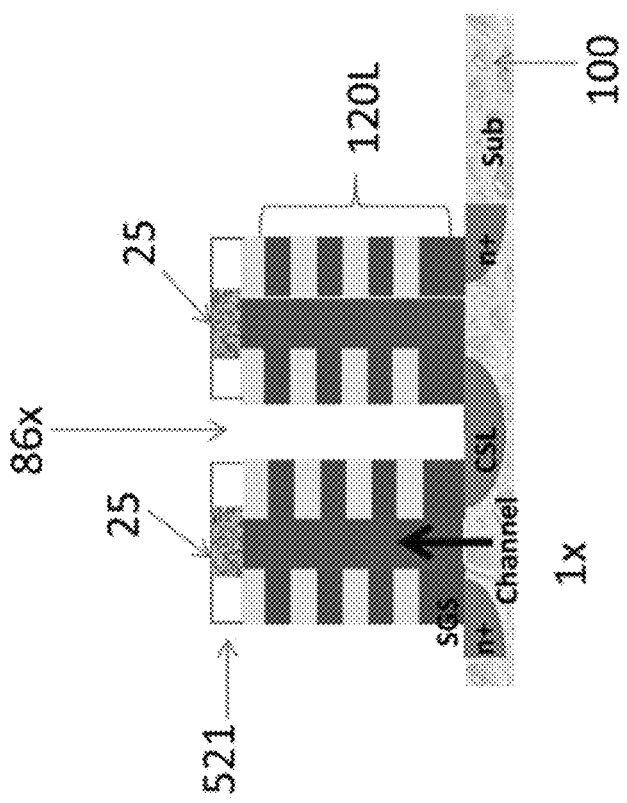

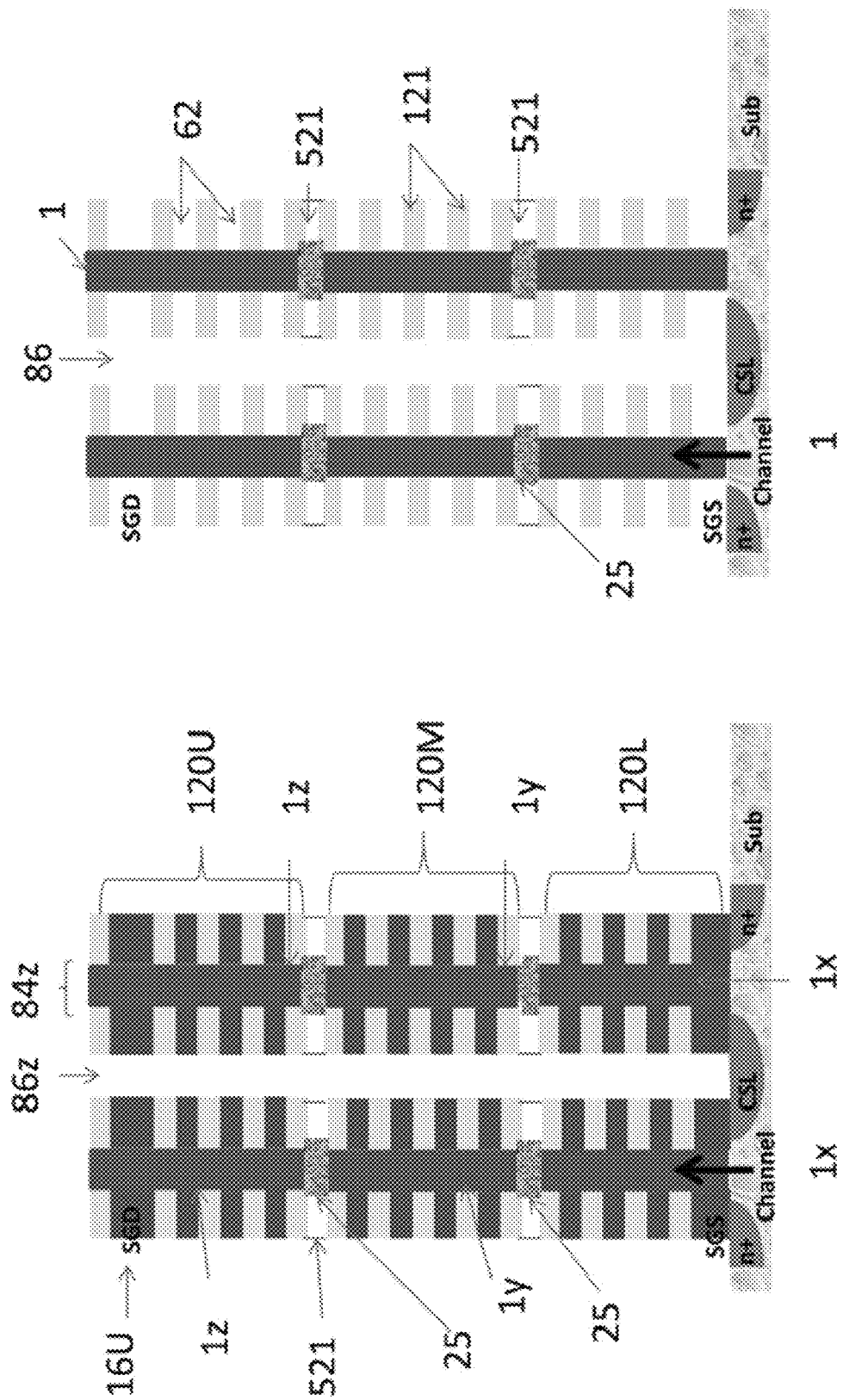

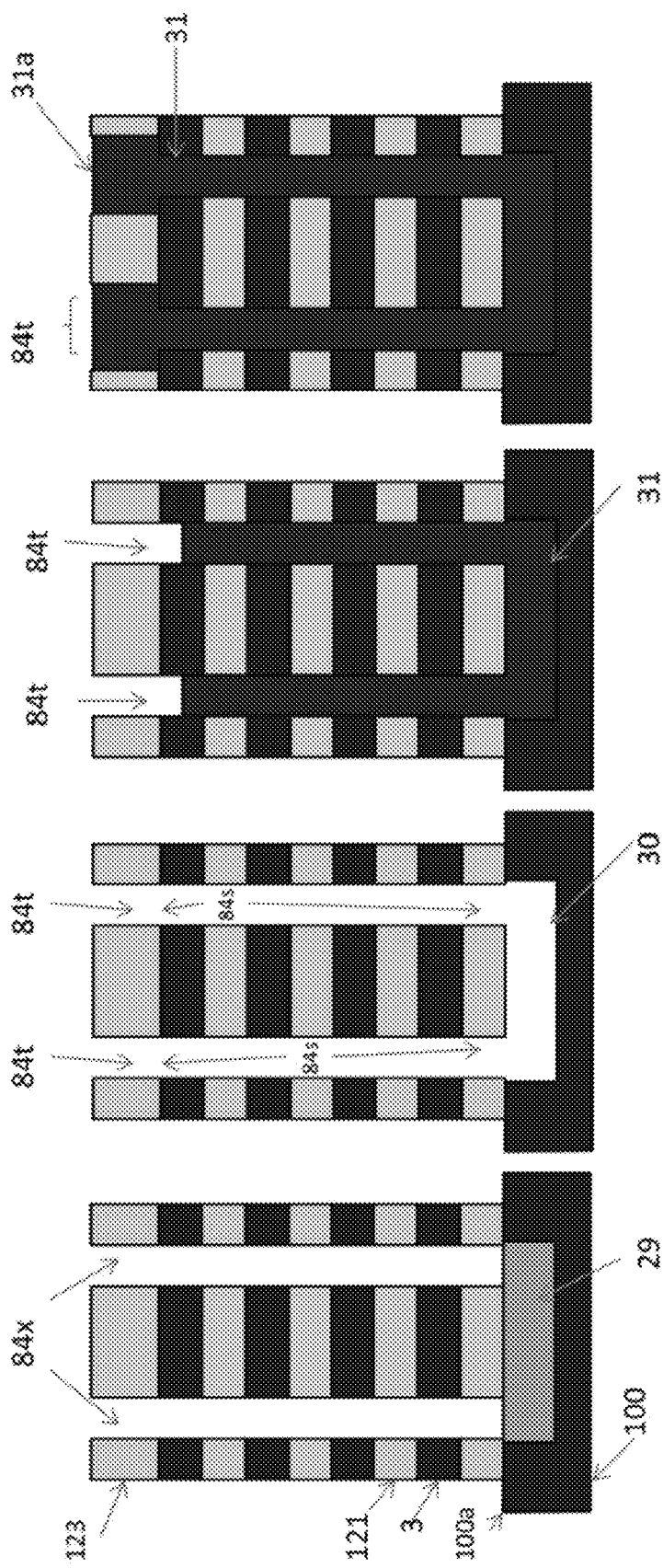

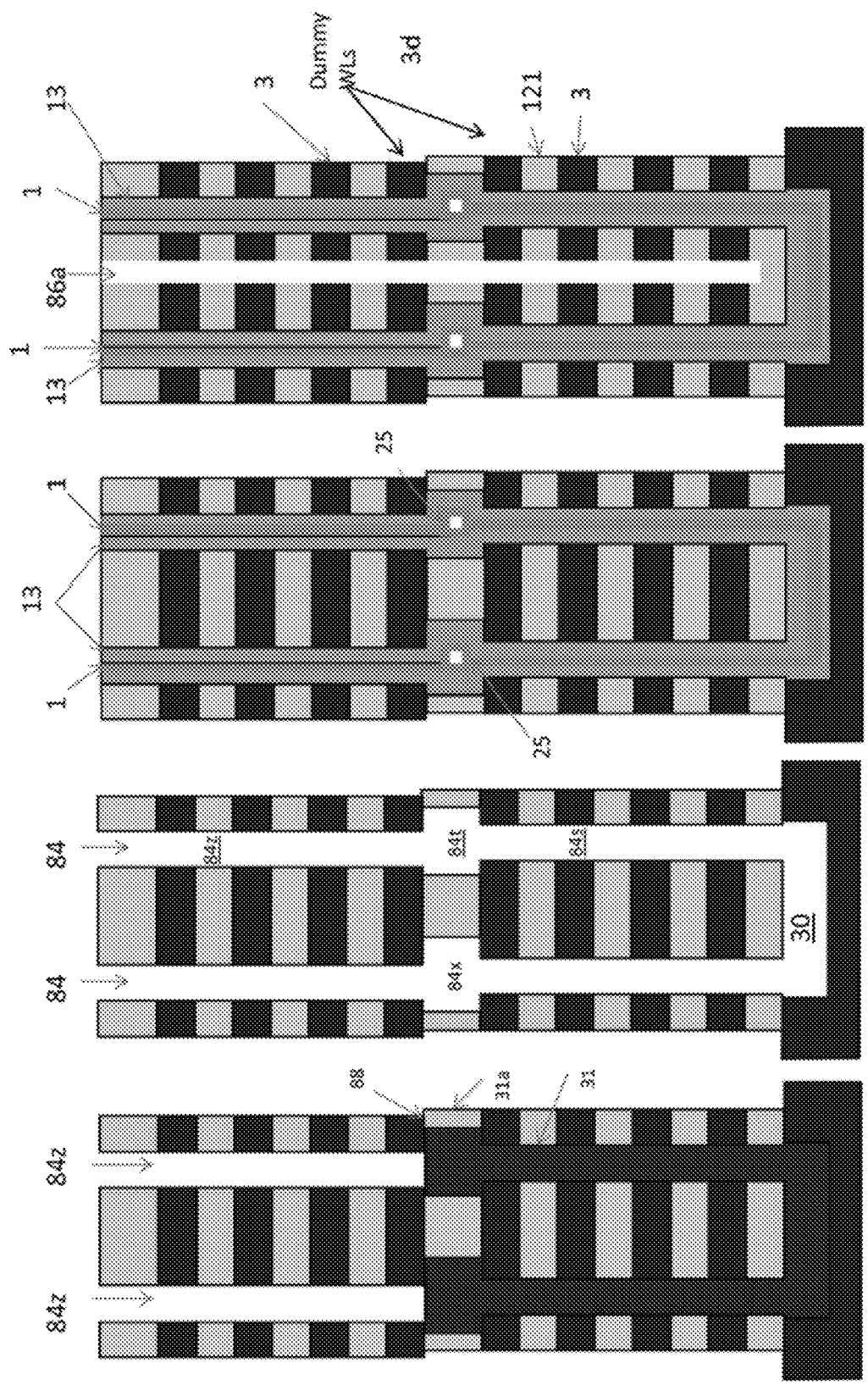

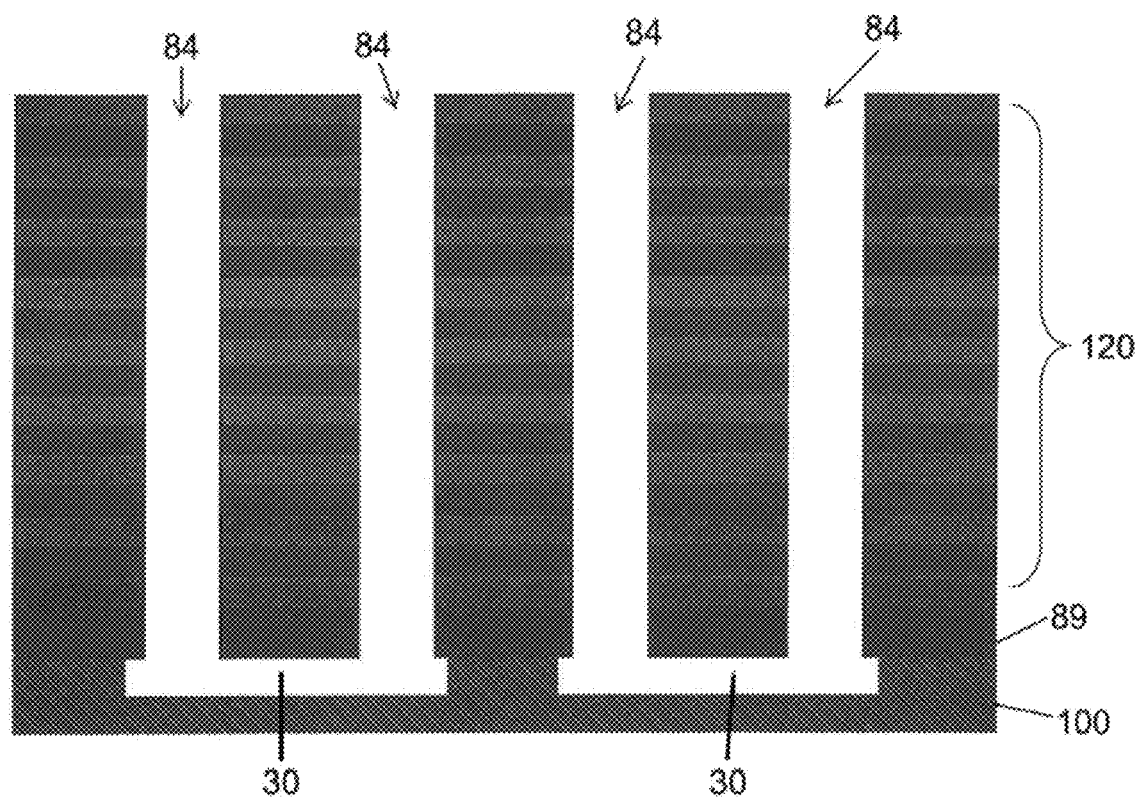

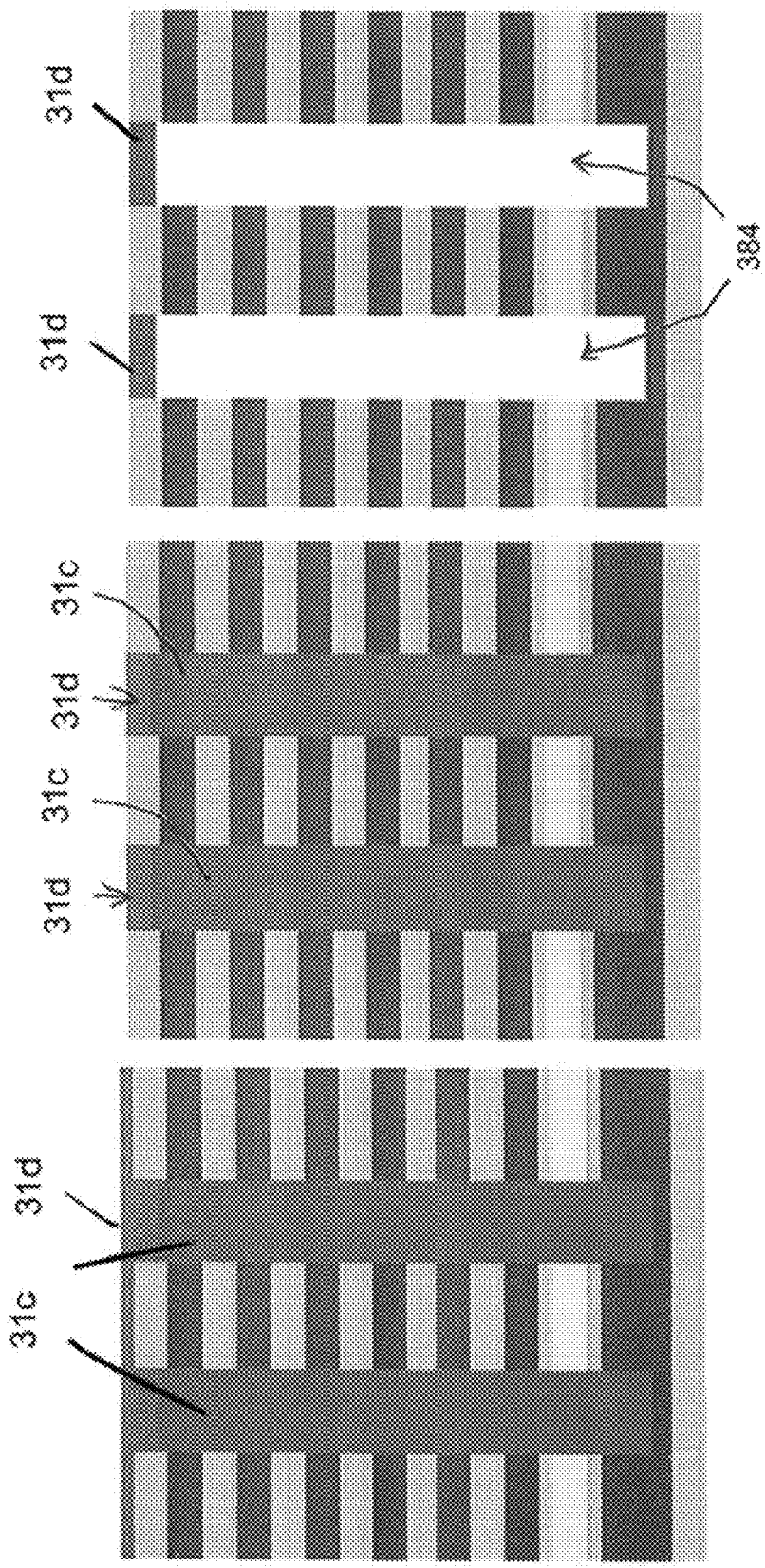

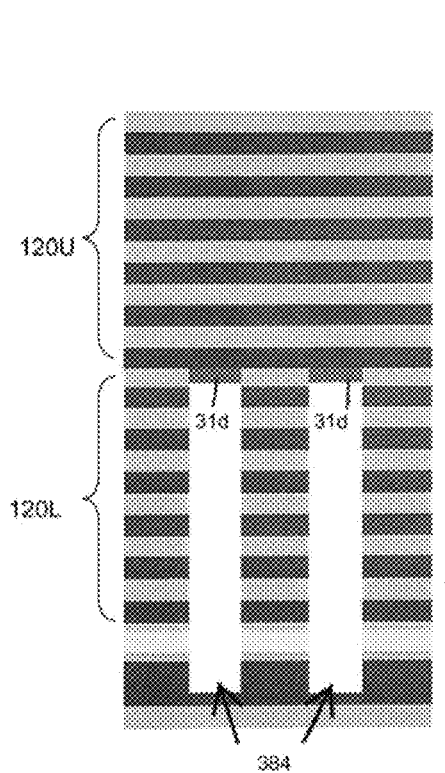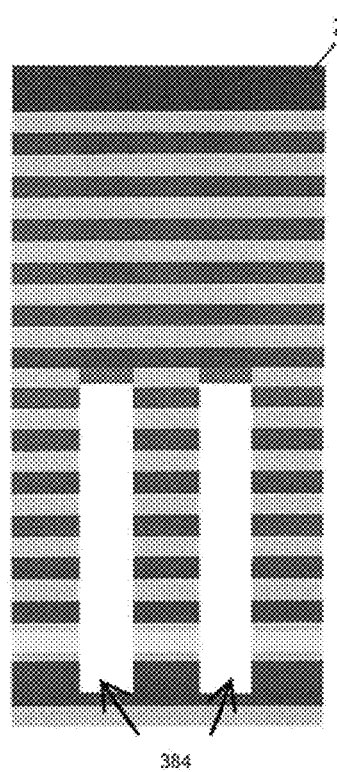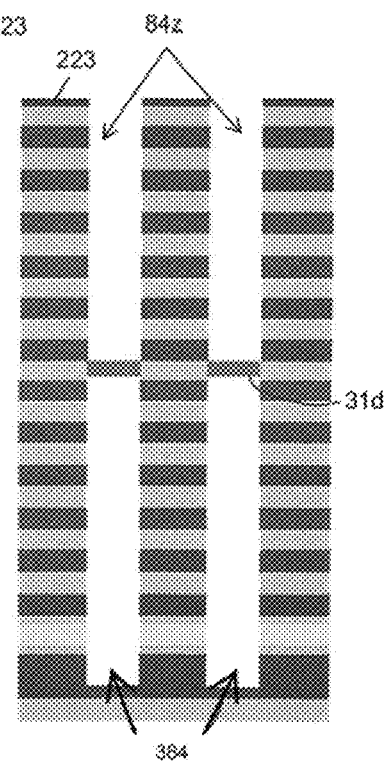

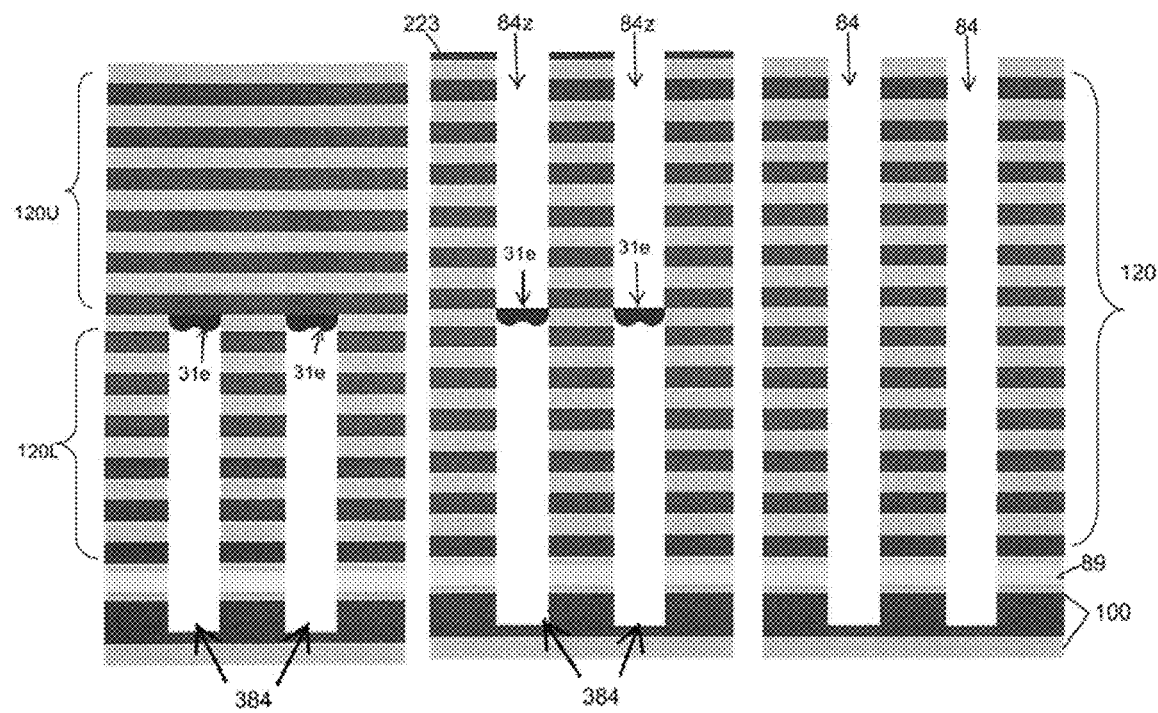

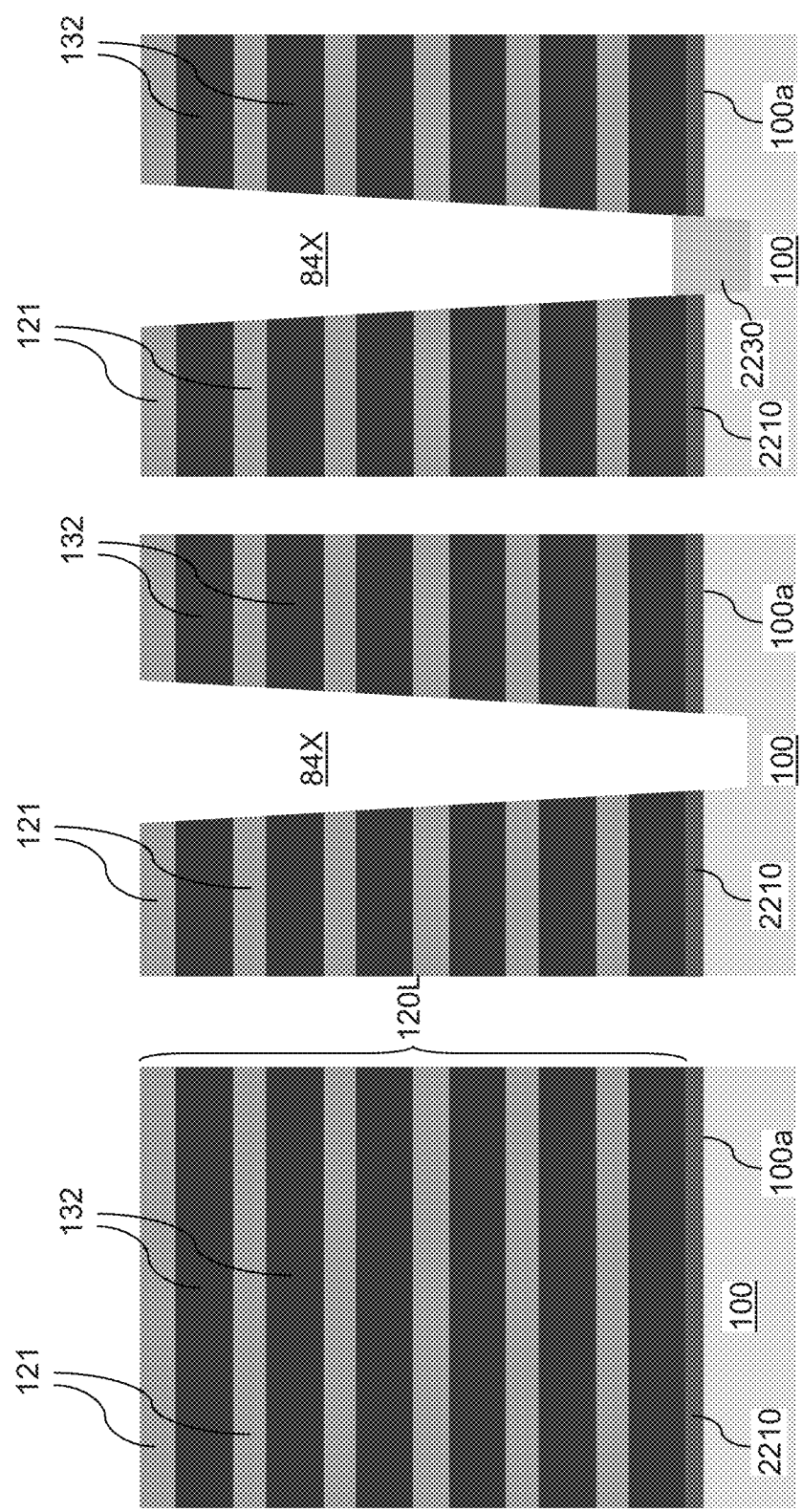

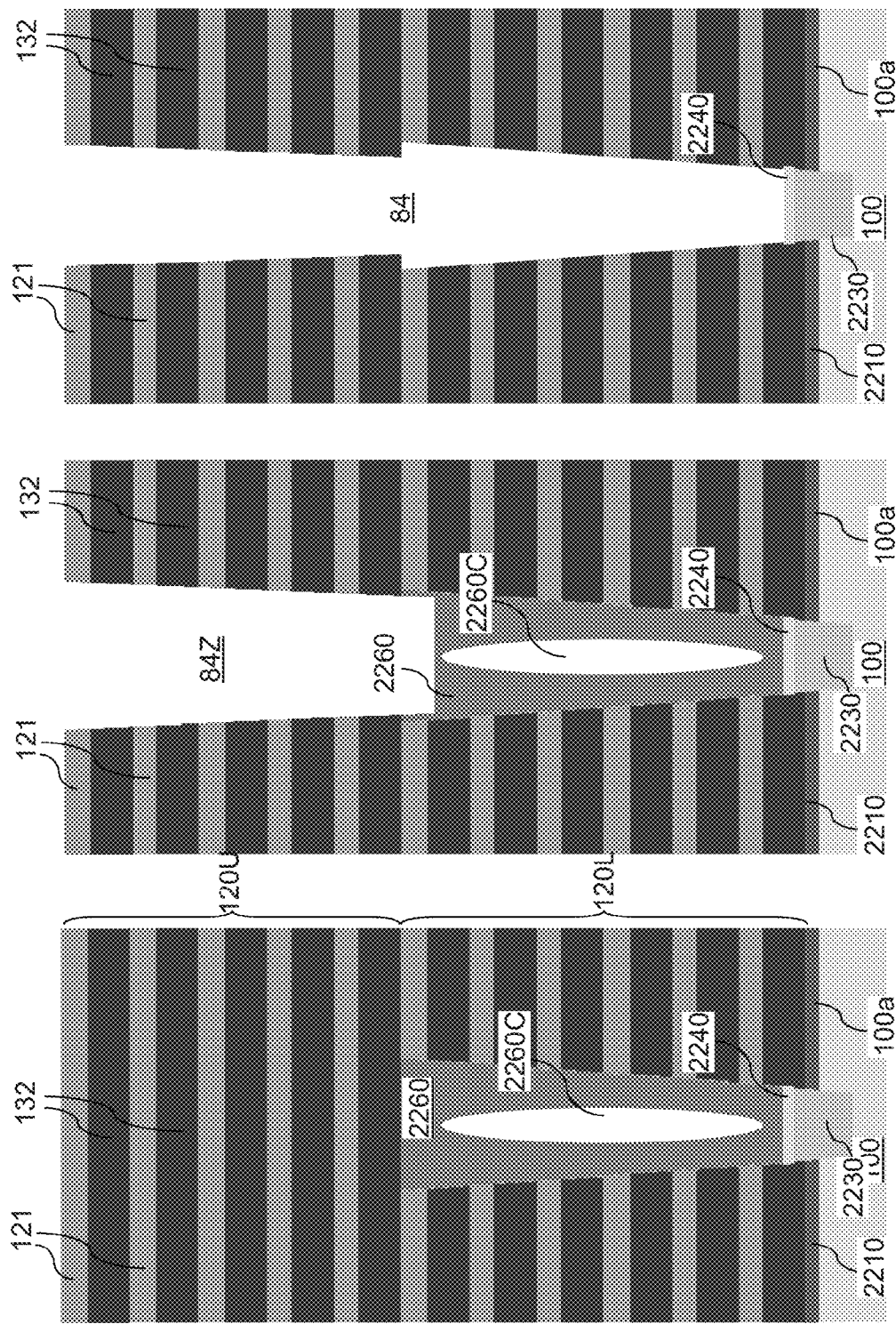

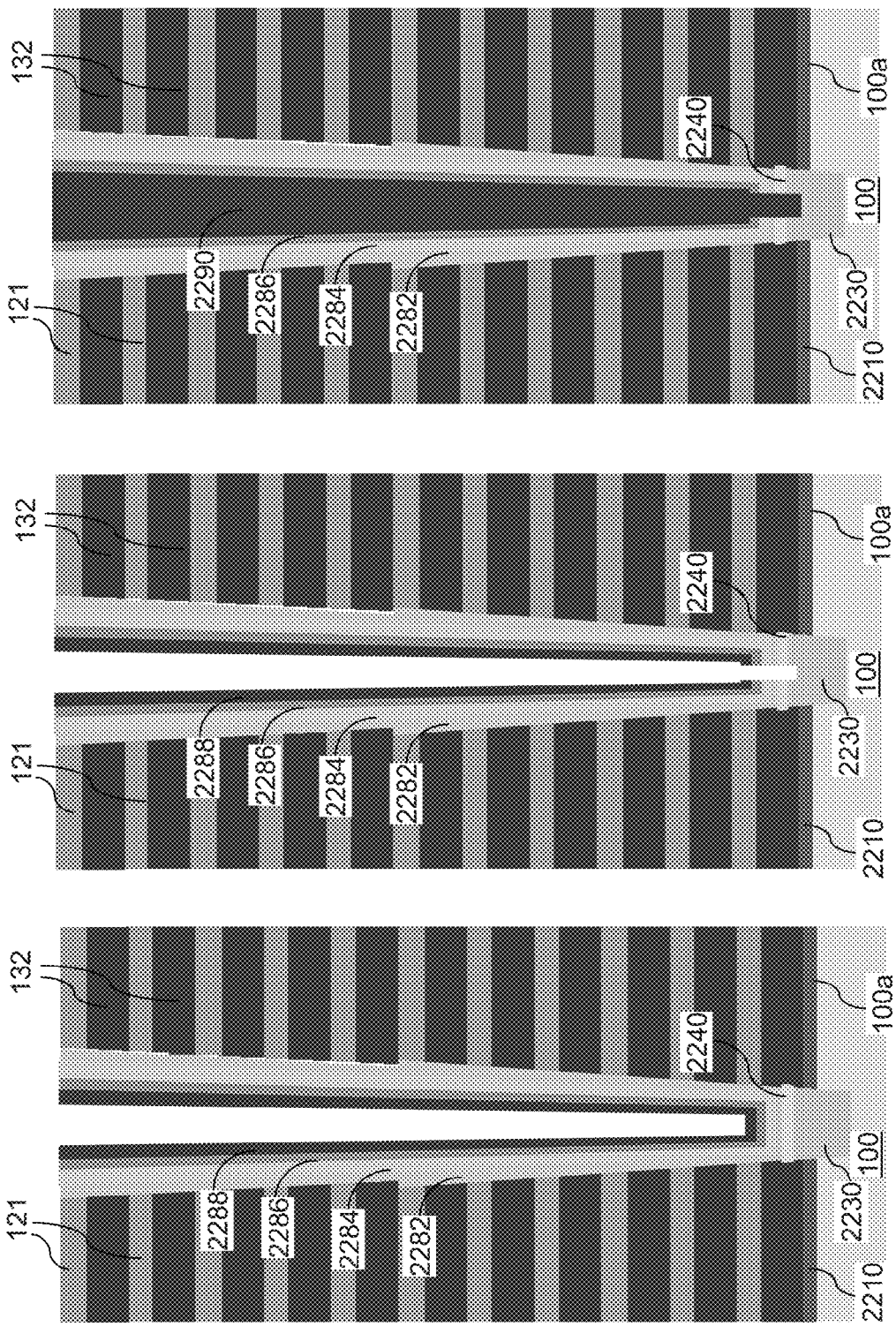

1

METHOD OF MAKING A VERTICAL NAND DEVICE USING A SACRIFICIAL LAYER WITH AIR GAP AND SEQUENTIAL ETCHING OF MULTILAYER STACKS

CROSS-REFERENCE TO RELATED APPLICATIONS

This application is a continuation-in-part of U.S. non-provisional application Ser. No. 14/585,912 filed on Dec. 30, 2014, which is a continuation of U.S. non-provisional application Ser. No. 13/933,743 filed on Jul. 2, 2013, which claims benefit of U.S. provisional patent application Ser. No. 61/776,953 filed on Mar. 12, 2013, and which applications are incorporated herein by reference in their entireties.

FIELD

The present disclosure relates generally to the field of semiconductor devices and specifically to three dimensional vertical NAND strings and other three dimensional devices and methods of making thereof.

BACKGROUND

Examples of prior art three dimensional vertical NAND strings are illustrated in FIGS. 1A and 1B. The device shown in FIG. 1A is known in the art as terabit cell array transistor ("TCAT") array. It includes damascened metal gate SONOS type cells in the vertical NAND flash string formed by a gate replacement process (see Jang, et al., "Vertical cell array using TCAT (Terabit Cell Array Transistor) technology for ultra high density NAND flash memory," 2009 Symposium on VLSI Technology Digest of Technical Papers, pages 192-193, Jun. 16 2009, Honolulu, Hi., incorporated herein by reference in its entirety).

The device shown in FIG. 1B is known in the art as Pipe-shaped Bit Cost Scalable ("P-BiCS") flash memory (see Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pages 136-137, Jun. 16 2009, Honolulu, Hi., incorporated herein by reference in its entirety).

SUMMARY

According to one embodiment of the present disclosure, a method of making a vertical NAND device is provided. A lower portion of a memory stack is formed over a substrate. A lower portion of memory openings is formed in the lower portion of the memory stack. Each lower portion of the memory openings is partially filled with a sacrificial material to leave an air gap in each lower portion of the memory openings below the sacrificial material. An upper portion of the memory stack is formed over the lower portion of the memory stack and over the sacrificial material and an upper portion of the memory openings is formed in the upper portion of the memory stack to expose the sacrificial material in the lower portion of the memory openings. The sacrificial material are removed to connect the lower portion of the memory openings with a respective upper portion of the memory openings to form continuous memory openings extending through the upper and the lower portions of the memory stack, and a semiconductor channel is formed in each continuous memory opening.

Another embodiment of the disclosure includes a method of making a vertical NAND device includes forming a lower portion of a memory stack over a substrate, forming a lower portion of memory openings in the lower portion of the memory stack, and at least partially filling the lower portion of the memory openings with a sacrificial material. The method also includes forming an upper portion of the memory stack over the lower portion of the memory stack and over the sacrificial material, forming an upper portion of the memory openings in the upper portion of the memory stack to expose the sacrificial material in the lower portion of the memory openings, removing the sacrificial material to connect the lower portion of the memory openings with a respective upper portion of the memory openings to form continuous memory openings extending through the upper and the lower portions of the memory stack, and forming a semiconductor channel in each continuous memory opening.

BRIEF DESCRIPTION OF THE DRAWINGS

FIGS. 2A, 2B, 3A and 3B are side cross sectional views of a NAND memory device of embodiments of the disclosure. FIGS. 2D and 2E are schematic circuit diagrams of the devices of FIGS. 2A and 2B, respectively.

FIG. 4B is a top cross sectional view of the device of FIG. 4A.

FIGS. 7, 8, 9 and 10 are side cross sectional views of steps in the method of making the memory device levels of the NAND memory device of an embodiment of the disclosure.

FIGS. 11A and 11B are perpendicular side cross sectional views along lines A-A' and B-B' in FIG. 11C of an upper select gate device level of the NAND memory device of an embodiment of the disclosure. FIG. 11C is a top cross sectional view of the device of FIGS. 11A and 11B.

FIGS. 12A and 12B are side cross sectional views of respective lower and upper select gate device level of the NAND memory device of an embodiment of the disclosure.

FIGS. 15A to 15H are side cross sectional views of steps in the method of making the NAND memory device shown in FIG. 2A.

FIGS. 17A to 17H are side cross sectional views of steps in the method of making the NAND memory device shown in FIG. 2B.

FIGS. 19A to 19H are side cross sectional views of steps in the method of making the NAND memory device according to an embodiment.

FIGS. 20A to 20J are side cross sectional views of steps in the method of making the NAND memory device according to an embodiment.

FIGS. 21A to 21F are side cross sectional views of steps in the method of making the NAND memory device according to an embodiment.

FIGS. 22A to 22L are side cross sectional views of steps in the method of making the NAND memory device according to an embodiment.

DETAILED DESCRIPTION OF THE EMBODIMENTS

Figure 1B:
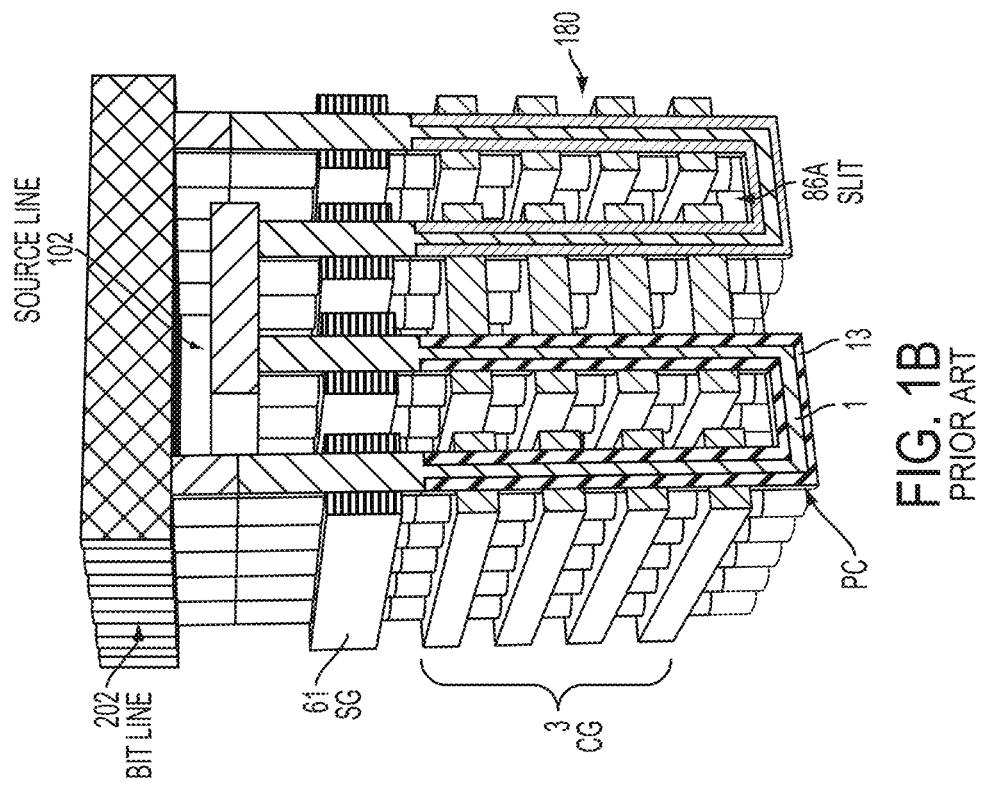
FIG. 1B is a perspective cross sectional view of another prior art NAND memory device.

Three dimensional (3D) vertical NAND (VNAND) devices (i.e., devices in which at least a part of the channel extends perpendicular to the major substrate surface) requires etching of deep, high aspect ratio memory openings or holes for formation of the vertical channel due to a high number of stacked memory layers surrounding the vertical channels. The terms "memory hole" and "memory opening" are used interchangeably herein. A memory layer includes a control gate and associated charge storage region (e.g., a dielectric isolated floating gate, an ONO stack, etc.) and at least a portion of two dielectric isolation layers located above and below each control gate.

However, the hard mask thickness used during high aspect ratio etching limits of the maximum number of stacked memory layers in the VNAND because the amount of hard mask thickness consumed increases during memory opening etching with increasing amount of memory layers stacked in the memory structure. For example, for a 1500 nm thick hard mask, at most 35 memory layers may be etched using reactive ion etching (RIE) to form the memory opening before all of the hard mask thickness is consumed by the etching. Increasing the hard mask thickness to increase the number of stacked memory levels is also not highly desirable because an increase in the hard mask thickness undesirably increases the aspect ratio of the opening.

Furthermore RIE energy also limits the number of stacked memory layers in the VNAND. The reactive ions are scattered within the high aspect memory opening during the etching, which leads to a decrease in the RIE energy. For a sufficiently deep, high aspect ratio opening, the RIE energy will eventually be reduced to an extent at which the RIE process loses the capability to etch the memory opening. Therefore, with a smaller RIE energy, a lower number of memory layers can be etched at the same time. However, increasing the RIE energy is also not highly desirable because it leads to increased back sputtering effects which may lead to control gate to control gate (i.e., word line to word line) shorts. Therefore, the RIE energy also limits the number of stacked memory layers in the VNAND.

The present inventors realized that the number of stacked memory layers in a VNAND may be increased if the portions of each memory openings are etched sequentially. Due to the limited depth of the opening in sequential etching, the high etching aspect etching ratio challenges noted above may be decreased.

In the sequential memory opening etching method, a lower portion of the memory stack is formed over a substrate. This portion includes only a part of the memory layers that will be used in the VNAND. The lower portions of the memory openings are etched in the lower portion of the memory stack. Then, at least one additional portion of the memory stack is formed over the lower portion of the memory stack. The at least one additional portion of the memory stack contains additional memory levels. Then, additional portions of the memory openings are then etched in the at least one additional portion of the memory stack.

If the stack contains two portions, then the at least one additional portion comprises an upper portion of the stack and the additional portions of the memory openings comprise upper portions of the memory openings. If the stack contains more than two portions, then the above process may be repeated several times. In this case, the at least one additional portion comprises one or more middle portions and an upper portion of the stack and the additional portions of the memory openings comprise one or more middle portions and upper portions of the memory openings.

The separate etching of memory opening portions in each portion of the stack may be conducted with separate hard masks. Thus, each hard mask used during each etching step may be relatively thin and the hard mask thickness does not limit the total number of memory layers in the stack. Likewise, because each RIE step of each memory opening portions forms an opening that has a limited depth, the RIE energy also does not limit the total number of memory layers in the stack.

However, because the different portions of the memory openings are etched during different etching steps using different lithography steps and different hard mask layers, it may be difficult to align the different portions of each memory opening (i.e., lower portion, upper portion and optionally one or more middle portions) to form a continuous memory opening through the entire stack due to photolithography misalignment issues, especially if each memory opening has more than two portions (i.e., the stack is etched three or more times to form a memory opening). The misalignment of the memory opening portions may lead to channel discontinuity which results in an open NAND string.

The present inventors realized that the memory opening alignment challenges may be reduced or avoided by adding a landing pad between the memory stack portions. The landing pad is wider (e.g., had a larger diameter) than the channel in the horizontal direction. The landing pad may be 10-100% wider, such as 25-75% wider than the channel (i.e., for disc shaped pads and cylindrical channels, the pad diameter is larger than the channel diameter by 10-100%). For example, for a 25-150 nm, such as a 45-50 nm diameter cylindrical channel, the pad diameter (i.e., width) may be 30-300 nm, such as 55-100 nm. The pad may be 20-50 nm, such as 30-40 nm thick. Thus, the landing pad connects adjacent channel portions in adjacent memory opening portions of the same memory opening even if the memory opening portions are misaligned with respect to each other.

The landing pad may comprise any suitable semiconductor or electrical conductor material, such as silicon, metal, metal alloy, etc. Preferably, the landing pad is made of the same semiconductor material as the channel of the VNAND. For example, the landing pad may comprise a polysilicon landing pad if the channel is a polysilicon channel. A semiconductor landing pad may be intrinsic or have the same conductivity type (e.g., p or n) as the channel. The semiconductor landing pad may be heavier doped than the channel (e.g., heavily doped landing pad and lightly doped channel), have the same doping concentration as the channel or may be lighter doped than the channel. In other words, the pad resistivity may be less than, greater than or the same as the resistivity of the channel material. Alternatively, the landing pad may comprise a metal (e.g., Ti, W, etc.) or conductive metal alloys (e.g., TiN, WN, a metal silicide, such as titanium, tungsten, nickel, cobalt or platinum silicide, etc.).

The landing pad may be formed over each channel portion (except over the upper most channel portion if desired) during the same deposition step as the channel deposition step or during subsequent deposition step. Then, the next overlying channel portion is formed on the landing pad.

Since the landing pad adds an amount of resistance to the VNAND string, the landing pad may also be considered a resistor built into the vertical channel of the VNAND string. The impact of the increase in resistance on the VNAD read performance due to the presence of the resistor should not be great.

For example, for a heavily doped landing pad/resistor comprising heavily doped polysilicon (e.g., $10^{19}$ cm$^{-3}$ doping concentration) having a thickness is 30 nm, the resistance value is 1.35 kOhm. If the stack includes five landing pads per channel or ten landing pads per U-shaped channel in a P-BiCS VNAND, then the total resistance is 13.5 kOhm for a 50 nm diameter memory opening. If a 400 nA read current is used in the NAND string, then the bit line voltage needs to increase by only 5 mV due to the ten additional series resistors/landing pads. Likewise, an additional thermal budget (e.g., MONOS anneal) may be added due to the presence of the landing pads. However, the thermal budget impact on the NAND string characteristics should be manageable.

VNAND devices containing a landing pad/built-in resistor may have any suitable configuration. FIGS. 2A through 4B illustrate various non-limiting, exemplary VNAND devices containing a landing pad/built-in resistor.

Figure 2A:
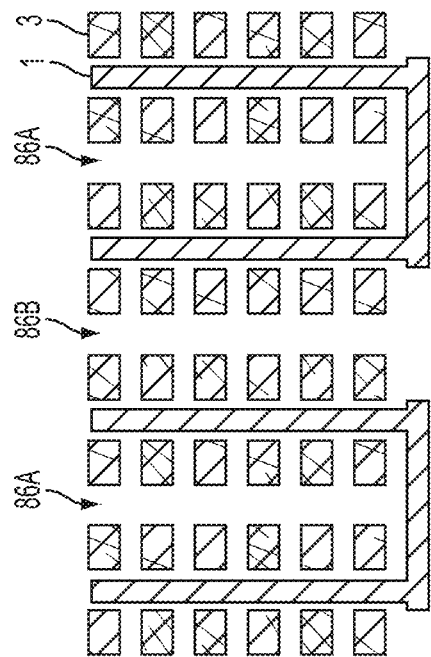
FIGS. 2A and 2B are side cross sectional views of a prior art NAND memory device.
Figure 2B:
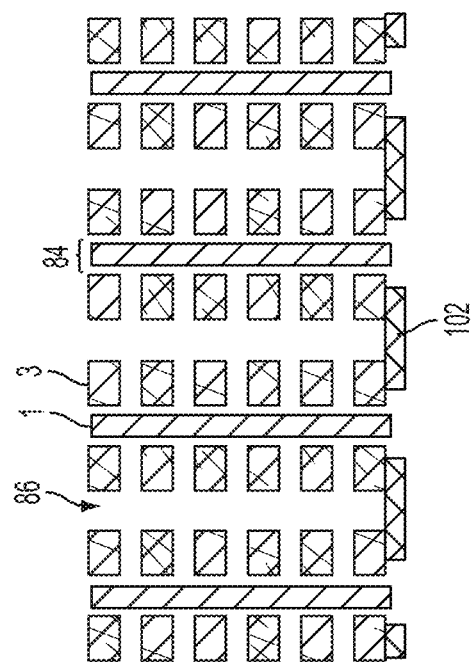
Figure 2C:
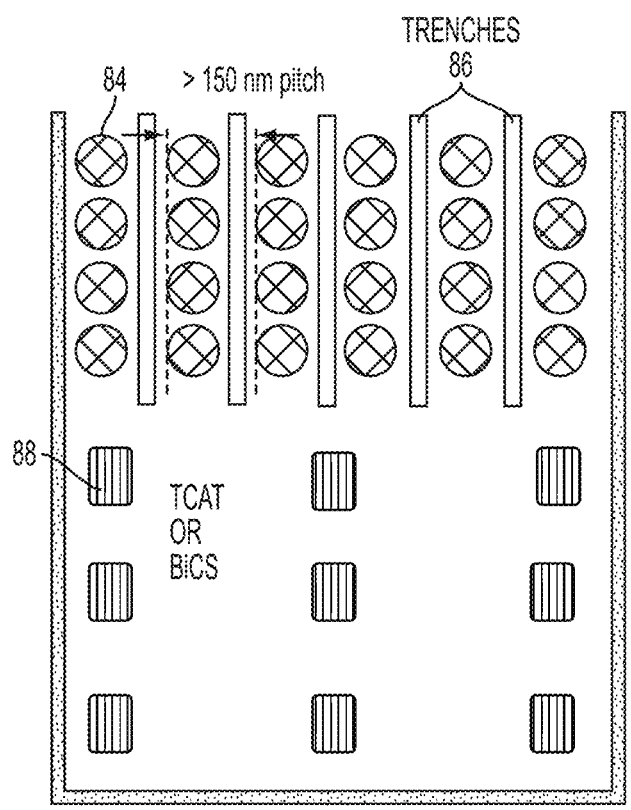
FIG. 2C is a top cross sectional view of NAND memory devices of FIGS. 2A and 2B.
Figure 2E:
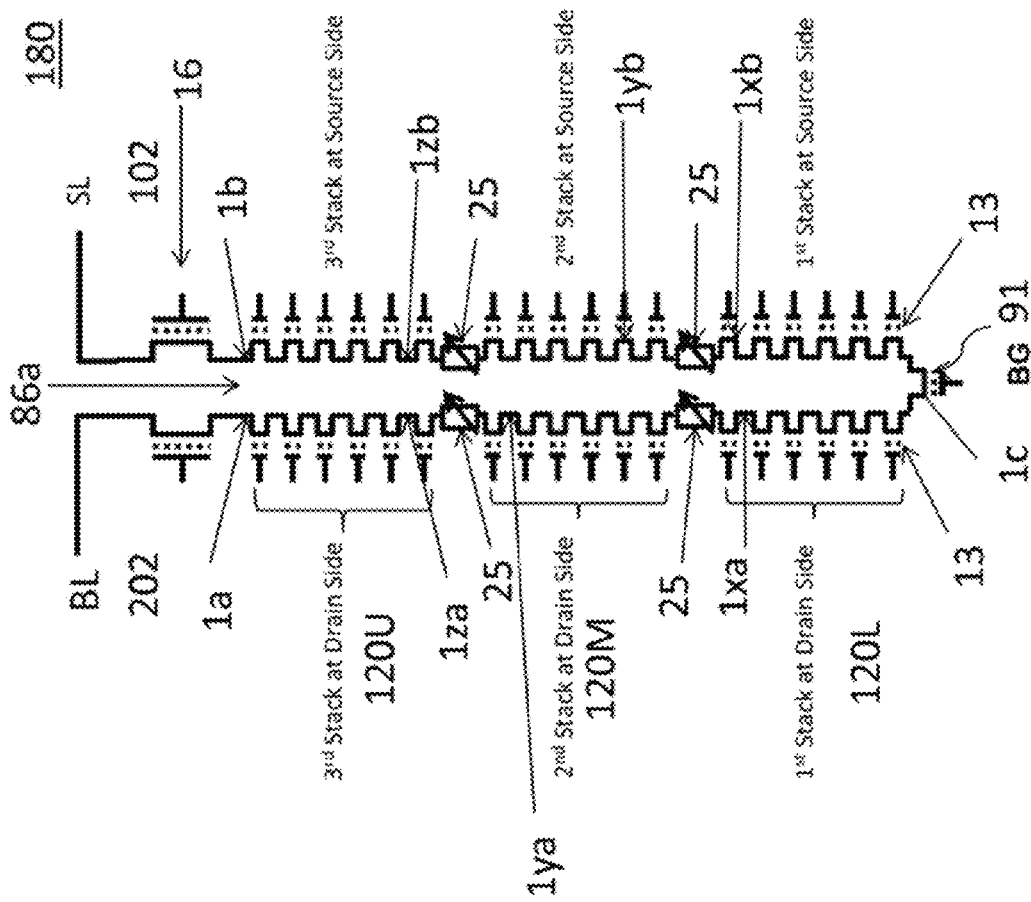

FIGS. 2A and 2D illustrate a VNAND containing a landing pad/built-in resistor having a single vertical channel having a "TCAT" type configuration. FIGS. 2B and 2E illustrate a VNAND containing a landing pad/built-in resistor having a U-shaped (e.g., pipe shaped) channel having a "P-BiCS" type configuration. FIG. 2C illustrates a top view of the devices in FIGS. 2A and 2B. FIGS. 3A through 4B illustrate a VNAND containing a landing pad/built-in resistor having a compact VNAND ("CVNAND") type configuration, which will be described in more detail below. The CVNAND device is also described in more detail in U.S. patent application Ser. No. 13/754,293, filed on Jan. 30, 2013 and incorporated herein by reference in its entirety.

In an embodiment, the NAND string 180 illustrated in FIGS. 2A-4B may be formed with a vertical channel. In one aspect, the vertical channel 1 has a solid, rod shape as shown in FIGS. 2A, 2B, 3B, 3A and 4B. In this aspect, the entire channel comprises a semiconductor material. In another aspect, the vertical channel has a hollow cylinder shape as shown in FIG. 4A. In this aspect, the vertical channel includes a non-semiconductor core 2 surrounded by a semiconductor channel 1 shell. The core may be unfilled or filled with an insulating material, such as silicon oxide or silicon nitride.

In some embodiments, the monolithic three dimensional NAND string 180 comprises a semiconductor channel 1 having at least one end portion extending substantially perpendicular to a major surface 100a of a substrate 100, as shown in FIGS. 2A, 2D, 3A and 3B. For example, the semiconductor channel 1 may have a pillar shape and the entire pillar-shaped semiconductor channel extends substantially perpendicularly to the major surface 100a of the substrate 100. In these embodiments, the source/drain electrodes of the device can include a lower electrode 102 (e.g., a heavily doped semiconductor region source electrode in the major surface 100a of a semiconductor substrate 100) provided below the semiconductor channel 1 (optionally in contact with a doped source region 103), and an upper electrode 202 (e.g., bit line) formed over the doped drain region 203 in the semiconductor channel 1, as shown in FIG. 2A. The lower electrode 102 contacts a metal interconnect outside of the view shown in FIGS. 2A and 3A or contacts metal wires of circuitry under the array. Thus, the drain/bit line electrode 202 contacts the pillar-shaped semiconductor channel 1 (via the drain region 203) from above, and the source electrode 102 contacts the pillar-shaped semiconductor channel 1 from below (e.g., via source region 103). For example, as illustrated in FIG. 2E, the device shown in FIGS. 2A and 2D contains two levels of landing pads 25, which divide the channel and the stack into three portions: lower portion of the stack 120L containing the lower portions 1xa, 1xb of the wings 1a, 1b; middle portion of the stack 120M containing the middle portions 1ya, 1yb of the wings 1a, 1b; and upper portion of the stack 120U containing the upper portions 1za, 1zb of the wings 1a, 1b.

Figure 4A:
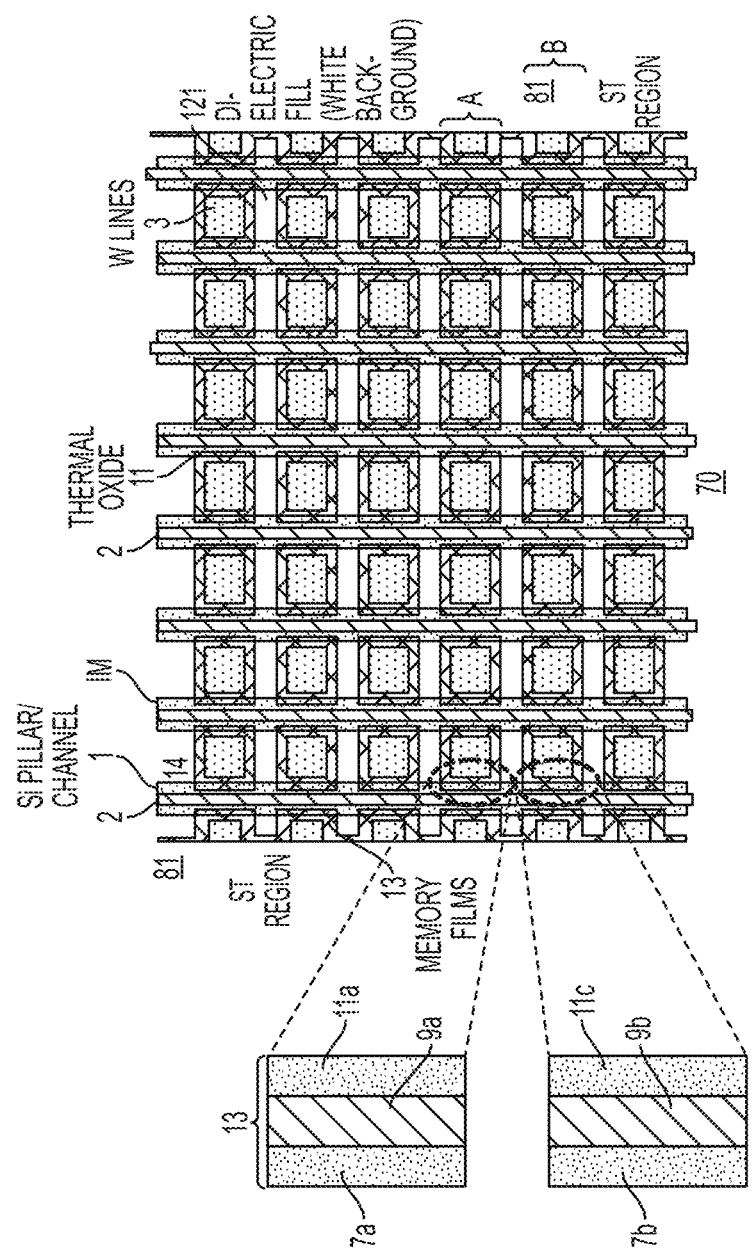
FIG. 4A is a side cross sectional views of a NAND memory device of an embodiment of the disclosure.

Alternatively, as shown in FIG. 2B, the NAND string may have a U shape (also known as a "pipe" shape) with two vertical channel wing portions connected with a horizontal channel connecting the wing portions. In one aspect, the U shaped or pipe shaped channel may be solid, as in the solid rod shaped vertical channel NAND as shown in FIG. 2B. In another aspect, the U shaped or pipe shaped channel may be hollow cylinder shaped, (similar to the hollow cylinder pipe shaped vertical channel NAND as shown in FIG. 4A). The U-shaped pipe channel may be filled or unfilled. Separate front side and back side methods for fabricating both single vertical channel and U shaped channel NAND strings are taught in U.S. Pat. No. 8,187,936, hereby incorporated by reference in its entirety for teaching of the separate front and back side processing methods.

The two wing portions 1a and 1b of the U-shape semiconductor channel may extend substantially perpendicular to the major surface of the substrate, and a connecting portion 1c of the U-shape semiconductor channel 1 connects the two wing portions 1a, 1b extends substantially perpendicular to the major surface of the substrate. The wing portions 1a, 1b of the channel 1 contain the built-in landing pads/resistors 25. For example, the device shown in FIGS. 2B and 2E contains two levels of landing pads 25, which divide the channel and the stack into three portions: lower portion of the stack 120L containing the lower portions 1xa, 1xb of the wings 1a, 1b; middle portion of the stack 120M containing the middle portions 1ya, 1yb of the wings 1a, 1b; and upper portion of the stack 120U containing the upper portions 1za, 1zb of the wings 1a, 1b.

In these embodiments, one of the source or drain electrodes 202 (e.g., bit line) contacts the first wing portion of the semiconductor channel from above, and another one of a source or drain electrodes (e.g., source line) 102 contacts the second wing portion of the semiconductor channel 1 from above. An optional body contact electrode 91 may be disposed over or in the substrate to provide body contact to the connecting portion of the semiconductor channel 1 from below. The NAND string's select or access transistors 16 are shown in FIGS. 2B and 2E. These transistors and their operation are described in U.S. Pat. No. 8,187,936, which is incorporated by reference for a teaching of the select transistors. The device of FIGS. 2B and 2E is described in more detail below with reference to the method of making the P-BiCS type VNAND, as shown in FIGS. 17A-17H.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, indium antimonide, or other compound semiconductor materials, such as III-V or II-VI semiconductor materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 in FIG. 4A may comprise any electrically insulating material, such as silicon oxide, silicon nitride, silicon oxynitride, or other insulating materials.

Each monolithic three dimensional NAND string 180 further comprises a plurality of control gate electrodes 3, as shown in FIGS. 2A, 2B, 3A, 3B and 4A-4B. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A, as shown in FIGS. 2A, 2B, 3A and 4A. The control gate material may comprise any one or more suitable conductive or semiconductor control gate material known in the art, such as doped polysilicon or a metal, such as tungsten, copper, aluminum, tantalum, titanium, cobalt, titanium nitride or alloys thereof.

Each channel 1 shown in FIGS. 2A-4B contains one or more landing pads/built-in resistors 25 described above. Preferably, each landing pad 25 is located in a vertical position of the channel between control gates 3 (i.e., having one control gate above and one control gate below). Thus, the landing pad is located between the first device level (e.g., level A) and the second device level (e.g., level B). A lower portion of the semiconductor channel (e.g., 84x) located in the first device level contacts a bottom surface of the landing pad 25. A middle or upper portion (e.g., 84y) of the semiconductor channel located in the second device level contacts a top surface of the same landing pad 25.

The landing pad 25 may extend horizontally beyond the memory hole 84 diameter or width to be located over and under adjacent control gates 3 inside the dielectric fill material 121. Thus, the landing pad 25 may extend into the insulating layer 121 between the first 3a and the second 3b control gate electrodes 3. The fill material 121 isolates the landing pad 25 from direct contact with the control gate electrodes 3. Alternatively, the landing pad 25 may be relatively thick and contact dummy control gate electrodes 3d, as shown in FIGS. 17G and 17H. Dummy control gate electrodes 3d (i.e., dummy word lines) are not connected to outside control circuitry and are not provided with a current or voltage during NAND operation.

Figure 3A:
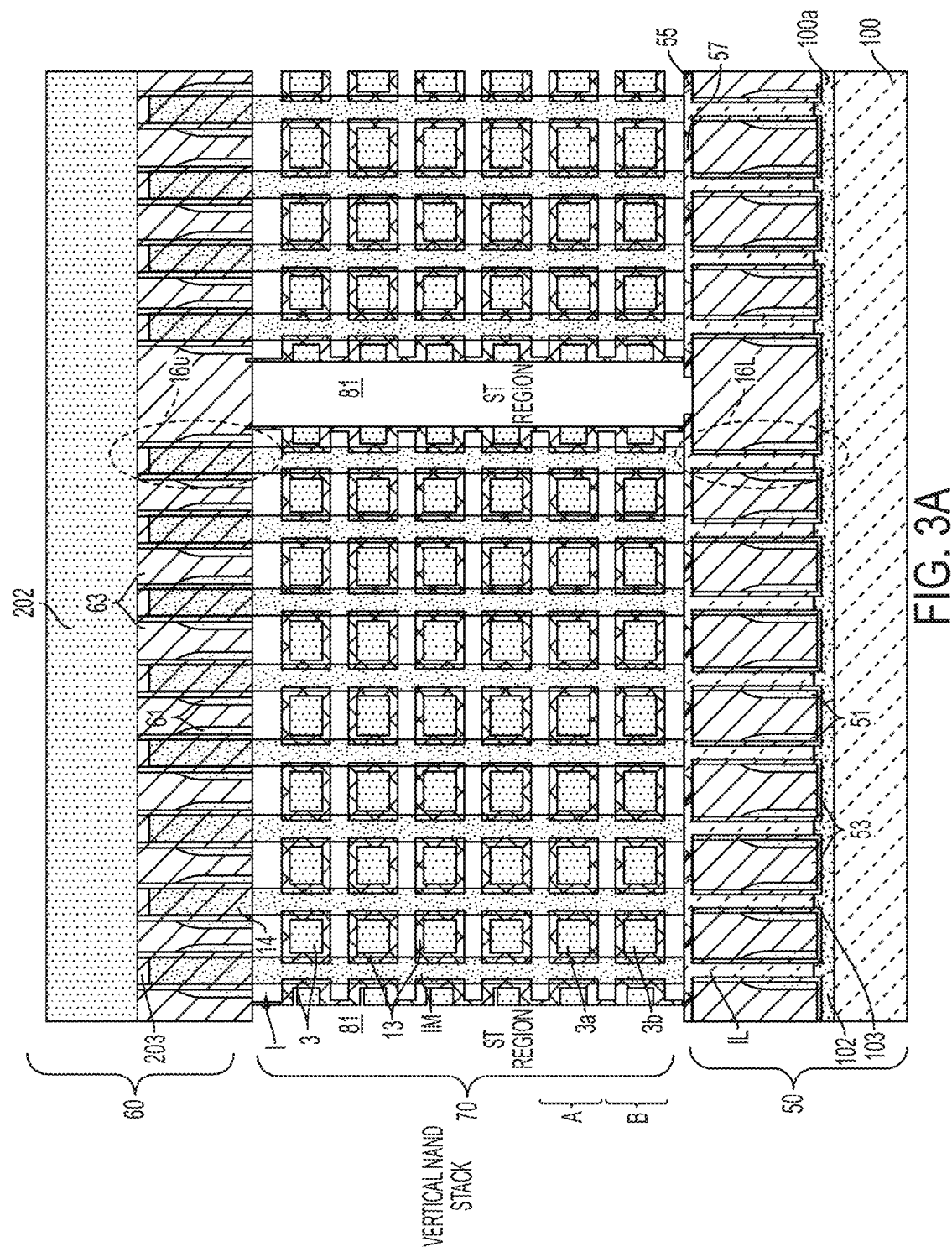
FIGS. 3A and 3B are side cross sectional views of a NAND memory device of embodiments of the disclosure

A blocking dielectric 7 is located adjacent to and may be surrounded by the control gate(s) 3. The blocking dielectric 7 may comprise a continuous layer or a plurality of blocking dielectric segments located in contact with a respective one of the plurality of control gate electrodes 3. For example, a first dielectric segment 7a located in device level A and a second dielectric segment 7b located in device level B are in contact with control electrodes 3a and 3b, respectively, as shown in FIG. 4A. In some embodiments, at least a portion of each of the plurality of blocking dielectric segments 7 surrounds the top, bottom, and two edge portions of a control gate electrode 3 between two adjacent NAND strings, as shown in FIGS. 3A and 4A.

The NAND devices also comprise one or more charge storage regions 9 located between the channel 1 and the blocking dielectric 7. The charge storage regions 9 may comprise a continuous vertical charge storage layer adjacent to plural control gate electrodes 3, as shown in FIGS. 2A and 2B or the plurality of discrete charge storage regions 9 comprise at least a first discrete charge storage segment 9a located in the device level A and a second discrete charge storage segment 9b located in the device level B, as shown in FIG. 4A.

A tunnel dielectric 11 is located between the charge storage region(s) 9 and the semiconductor channel 1. The blocking dielectric 7 and the tunnel dielectric 11 may be independently selected from any one or more same or different electrically insulating materials, such as silicon oxide, silicon nitride, silicon oxynitride, or other insulating materials.

The charge storage region(s) 9 may comprise a conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate(s), conductive nanoparticles, or a charge storage dielectric layer or segment (e.g., silicon nitride or another dielectric). For example, in some embodiments, the charge storage regions comprise silicon nitride, where the silicon oxide blocking dielectric 7, the nitride charge storage region 9 and the silicon oxide tunnel dielectric 11 form oxide-nitride-oxide (ONO) memory film 13 of the NAND string shown in FIGS. 2A, 2B, 3A and 4A. Alternatively, the blocking dielectric may comprises a tri-layer ONO dielectric, such that the memory film 13 comprises ONO (11)-N (9)-O (7).

As shown in FIG. 4B, the tunnel dielectric 11 comprises a cylinder which surrounds the semiconductor channel 1, the charge storage region 9 comprises a cylinder which surrounds the tunnel dielectric, and the blocking dielectric 7 comprises a cylinder which surrounds the charge storage region. The first 3a and the second 3b control gate electrodes 3 surround the blocking dielectric in each NAND string.

The CVNAND configuration shown in FIGS. 3A-4B provides a denser memory design than the TCAT and P-BiCS configurations shown in FIGS. 2A and 2B, respectively, for the following reasons. For example, as shown in FIG. 2A, each TCAT NAND string 180 is separated from adjacent strings by a word line cut or trench 86. The bottom source select gate (SGS) device 16L in TCAT requires a cut space or trench 86 between the lower select gate electrodes which are built from the bottom of the stack metal layer. Furthermore, the source line 102 formation process and p-well 300 contact requires additional space in the TCAT device.

Likewise, as shown in FIG. 2B, each U-shaped P-BiCS NAND string 180 contains a dielectric 87 filled slit trench 86A between the select gates 3 and the wings or arms of the U-shaped channel 1 which extends between upper source line 102 and bit line 202. Furthermore, as shown in FIG. 2B, adjacent U-shaped NAND strings 180 are also separated by a word line cut or trench 86B not to lose active holes and to reduce word line R. The top view of the filled memory holes 84 (i.e., containing the NAND string channels 1 and a film 13 comprising tunnel dielectric, charge storage region and blocking dielectric) and the trenches 86 in TCAT and P-BiCS devices is illustrated in FIG. 2C. The control gates are omitted from FIG. 2C for clarity and the supporting columns 88 which prevent the device levels from collapsing on each other during removal of sacrificial material are shown in the bottom of the figure. The trenches result in a higher than desired pitch between adjacent filled memory holes (e.g., a pitch of about 150 nm) and reduces the array efficiency by more than 50%.

The word line (i.e., control gate) trenches or cuts 86 in an array of vertical NAND strings may be eliminated to increase the device density and reduce the filled memory hole 84 pitch. Embodiments include monolithic three dimensional NAND strings and methods of making three dimensional NAND devices (e.g., CVNAND devices) having at least one 3×3 array of vertical NAND strings in which the control gate electrodes are continuous in the array and do not have an air gap or a dielectric filled trench 86 in the array. The NAND device is formed by first forming a lower select gate level having separated lower select gates, then forming plural memory device levels containing a plurality of NAND string portions, and then forming an upper select gate level over the memory device levels having separated upper select gates.

Figure 3B:
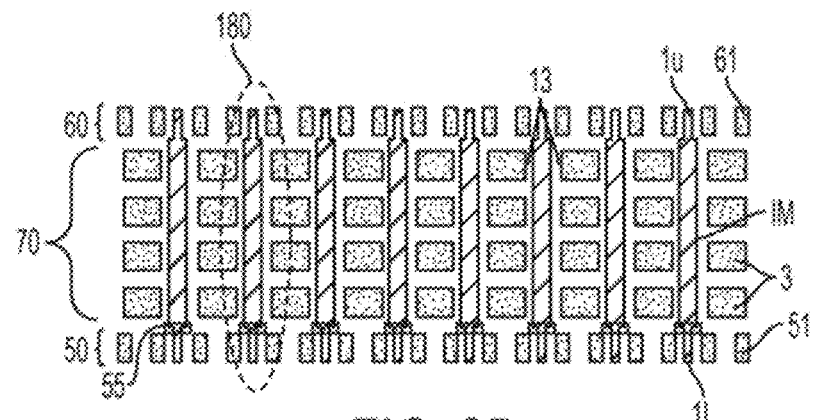
Figure 3C:
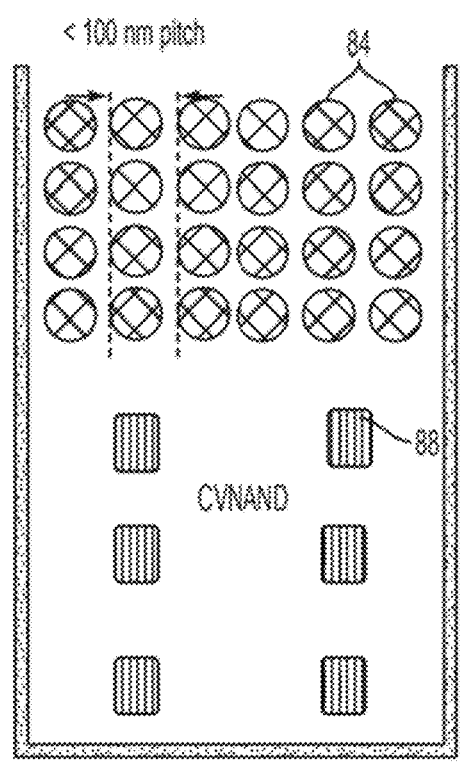
FIG. 3C is a top cross sectional view of the device of FIGS. 3A and 3B.

Embodiments of the compact vertical NAND (i.e., CVNAND) device are shown in FIGS. 3A, 3B, 3C, 4A and 4B. FIG. 3A schematically illustrates a side cross sectional view of the entire CVNAND device, including the lower 50 and upper 60 select gate device levels located below and above the memory device levels 70 shown in FIG. 4A. FIG. 3B schematically illustrates a side cross sectional view of the memory levels 70 and select gate device levels 50, 60 of one CVNAND array and FIG. 3C schematically illustrates the top view location of the filled memory holes 84 and supporting pillars 88. FIG. 4A illustrates a side cross sectional view of the memory device levels 70 (i.e., levels containing the control gate electrodes/word lines) in one NAND string array. FIG. 4B schematically illustrates the top cross sectional view of the relationship between the continuous control gate electrodes 3 and the filled memory holes 84 in each array block.

As shown in FIGS. 3A, 4A and 4B the first control gate electrode 3a and the second control gate electrode 3b are continuous in the array, such that these electrodes do not have an air gap or a dielectric filled trench in the array. As shown in FIG. 4B, the control gate electrodes 3 when viewed from the top comprise a "mesh" which is continuous except for the memory holes 84 which are completed filled with the channel 1, an optionally the tunnel dielectric 11, charge storage region 9, blocking dielectric 7 and optional insulating fill 2. In other words, the control gate electrodes 3 may be considered to be a mesh in which all openings are filled FIG. 4B shows two control gate electrodes 3aL and 3aR (i.e., left and right electrodes) located in the first device level A. Each electrode forms a continuous mesh around an exemplary 4×3 array of filled memory holes 84. Each electrode 3aL and 3aR contacts a respective word line 200L and 200R of an array block. An array block includes plural arrays (e.g., plural 4×3 arrays) which are connected by their respective control gate electrodes (e.g., 3aL) to a common word line (e.g., 200L). Only one array is shown as being connected to each word line via a respective control gate electrode in FIG. 4B for clarity. However, it should be understood that the pattern shown in FIG. 4B repeats along the word lines. Thus, each array is located in a respective array block, where the left control gate electrode 3aL in one block in device level A is separated from the right control gate electrode 3aR in the same level A in an adjacent array block by an air gap (if the slit trench 81 is not filled) or a dielectric filled trench 81. The same configuration is used in the other memory levels shown in FIGS. 4A and 3A.

The CVNAND string's select or access transistors 16L, 16U are shown in FIGS. 3A, 3B, 5, 6 and 11. As shown in FIGS. 3A and 5A-5C, a lower select gate electrode 51 is located adjacent to a lower portion 1L of the pillar-shaped semiconductor channel 1 below the control gate electrodes 3 (e.g., 3a, 3b) in the lower select gate electrode level 50. Level 50 may be a source select gate level and electrode 51 may be a source side select gate electrode. Each lower select gate electrode 51 is separated from adjacent lower select gate electrodes 51 in the array in level 50 by an air gap or a dielectric filled trench 53.

Furthermore, as shown in FIGS. 3A and 11A-C, an upper select gate electrode 61 is located adjacent to an upper portion 1U of the pillar-shaped semiconductor channel 1 above the first 3a and the second 3b control gate electrodes. Electrode 61 may comprise a drain side select gate electrode located in the drain upper select gate level 60. Each upper select gate electrode 61 is separated from adjacent upper select gate electrodes 61 in the array in level 60 by an air gap or a dielectric filled trench 63.

In one non-limiting embodiment, each semiconductor channel 1 comprises a first portion 1U adjacent to the upper select gate electrode 61, a second portion 1L adjacent to the lower select gate electrode 51, a third (i.e., middle or memory) portion 1M located at least in the first (A) and the second (B) device levels between the first and the second portions, and an optional, additional landing pad portion 55 located between the second 1L and the third 1M channel 1 portions.

In one embodiment shown in FIG. 3B, the third (middle) portion 1M of the channel 1 has a larger diameter or width than the first (upper) 1U and the second (lower) 1L channel 1 portions because these three portions are formed in separate process steps as described below. The thinner upper 1U and lower 1L channel 1 portions allow the space for the air gap or a dielectric filled trench 53, 63 to be added between adjacent upper 61 and lower 51 select gates in respective levels 60 and 50. In contrast, since the control gates 3 are continuous and do not require air gap or trench adjacent to the middle (memory) portions 1M of the channel 1, the channel portions 1M may be thicker than channel portions 1U and 1L.

Finally, as shown in FIGS. 3A, 3B, 5 and 6 and as will be explained in more detail below, the channel 1 may optionally contain additional landing pad portions 55 between the lower select gate level 50 and the memory levels 70 and between the memory level 70 and the upper select gate level 60. The landing pad portion has a larger diameter or width than the second 1L and the third 1M portions of the channel 1.

Figure 5C:
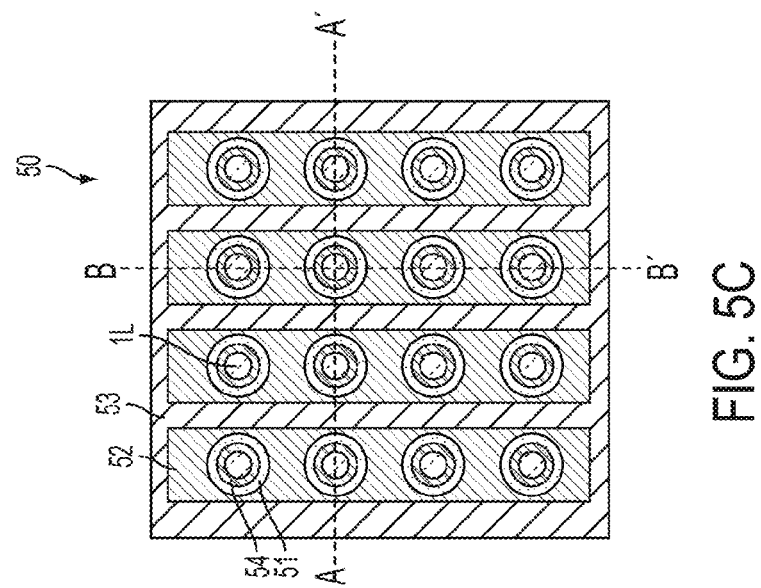
FIG. 5C is a top cross sectional view of the device of FIGS. 5A and 5B.
Figure 5A:
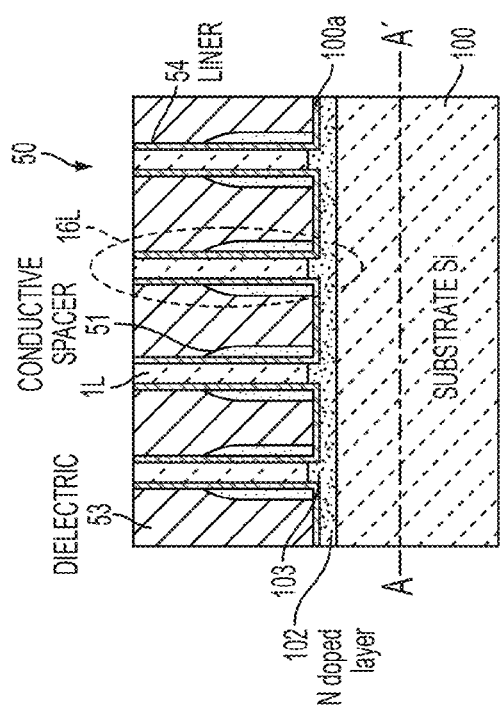
FIGS. 5A and 5B are perpendicular side cross sectional views along lines A-A' and B-B' in FIG. 5C of a lower select gate device level of the NAND memory device of an embodiment of the disclosure.
Figure 5B:
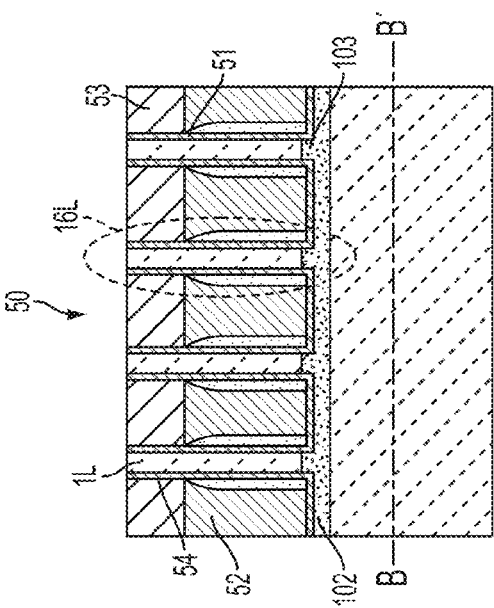

FIGS. 5A-5C illustrate a lower select gate level 50 of the CVNAND device. FIG. 5C shows a top view and FIGS. 5A and 5B illustrate side cross sectional views along lines A-A' and B-B' in FIG. 5C. The lower select gate level 50 is located over the substrate 100. The lower select gate level 50 includes the lower portions 1L of the plurality of semiconductor channels 1 (containing source regions 103 on the bottom), and a plurality of lower source electrodes 102. Each lower source electrode is electrically connected to each of the plurality of lower portions 1L of the semiconductor channels through a respective source region 103. Level 50 also includes the plurality of lower select gate electrodes 51, located adjacent to a gate dielectric 54 contacting the lower portion 1L of each semiconductor channel 1. The channel 1L, gate dielectric 54 and select gate 51 form the lower (source) select transistor 16L of each NAND string. Strip shaped lower select gate lines 52 connect the select gates 51 in rows to input/outputs (not shown), as shown in FIGS. 5B and 5C. Level 50 is formed before the layers of the memory level 70 are formed over level 50 to allow the select gates 50 to be separated.

Figure 6A:
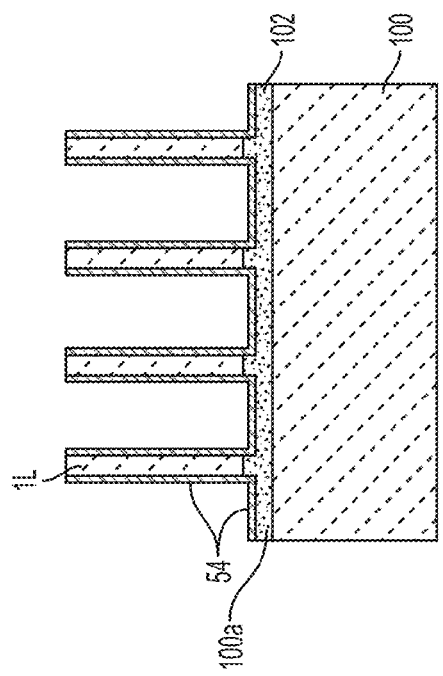
FIGS. 6A, 6B, 6C and 6D are side cross sectional views of steps in the method of making the lower select gate device level of the NAND memory device of an embodiment of the disclosure.

FIGS. 6A-6D illustrate steps in forming this level 50 shown in FIG. 5A. As shown in FIG. 6A, the lower portions 1L of the channel 1 may be formed by etching a silicon substrate 100 to form silicon pillars 1L using any suitable lithography and etching technique. Alternatively, pillars 1L may be grown in openings in a mask located over the substrate 100. In this case, the select gate device level 50 is lifted up over the substrate 100 surface 100a, so that the select transistors 16L have polysilicon channels 1L and CMOS devices may be formed in single crystal silicon substrate 100 under the NAND array. This option is less preferred.

This is followed by oxidizing the pillars 1L to form a silicon oxide gate dielectric 54 on pillar sidewall(s) and on exposed portion of substrate 100 surface 100a. Alternatively, the gate dielectric may be deposited on the pillars 1L and the surface 100A of the substrate 100 by CVD or other suitable methods. In this case, the dielectric 54 may comprise materials other than silicon oxide.

Finally, the upper surface 100A of the substrate 100 is doped (e.g., by ion implantation) to form the source regions 103 and the source electrode 102 (i.e., buried doped source line in substrate 100). The buried source line 102 in the substrate 100 is made by a high dose implant. Alternatively, an optional a buried metal mesh (e.g., tungsten, etc.) may be provided in addition to or instead of the buried implanted lines 102 as the source electrode(s). Source regions 103 may be formed by angled ion implantation (e.g., phosphorus or arsenic implant into a p-type silicon substrate) into the base of the pillars 1L. The implantation may be conducted before or after the dielectric 54 formation or after the select gate 51 formation as it is described below.

Figure 6B:
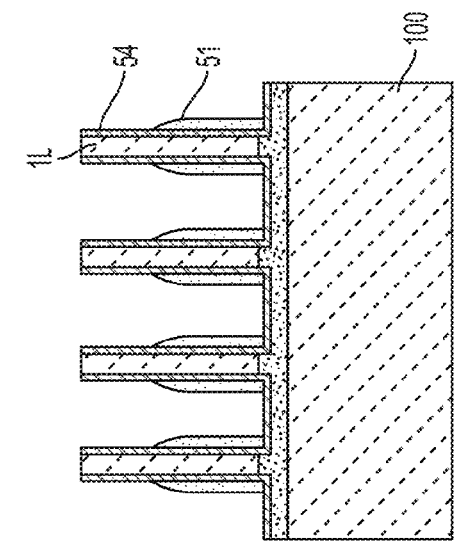

Next, as shown in FIG. 6B, during a step of forming the lower select gate level 50, each lower select gate electrode 51 is separated from adjacent lower select gate electrodes in the array by an air gap or a dielectric filled trench 53. This may be done by forming the select gate 51 layer over the dielectric 54 covered lower portions 1L of the channel 1 followed by anisotripically etching the select gate layer to leave discreet, separated sidewall spacer shaped select gates 51 on the gate dielectric 54 covered lower portions 1L of the channel. The space between the spacer gates 51 may be left as an air gap or filled with an dielectric fill 53. Alternatively, select gates 51 may be formed by depositing a conductive layer and patterning it by lithography and etching into discreet gates 51. If desired, portions of the gates 51 of transistors 16L may be silicided.

The select gate lines 52 are then formed to connect the discreet select gates into rows. The lines 52 may be formed by depositing one or more conductive layers and then performing lithography and etching to form the strip shaped lines 52. The lines 52 are separated from each other in the A-A direction but not in the B-B direction in FIG. 5C.

Figure 6C:
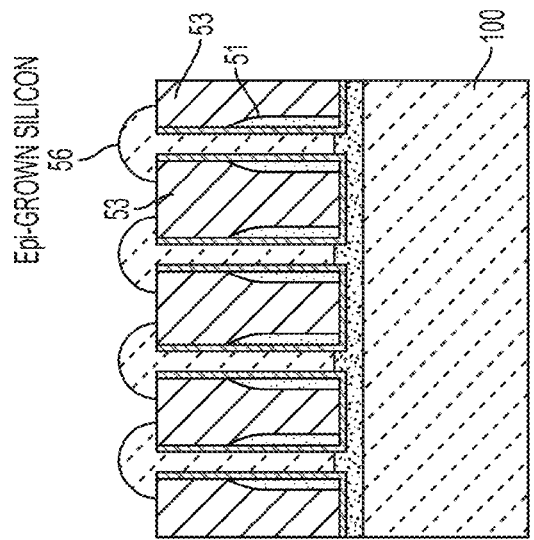
Figure 6D:
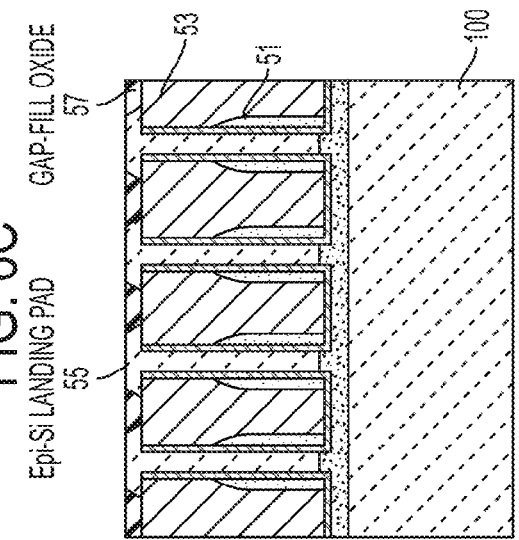

Then, as shown in FIGS. 6C-6D, the optional semiconductor landing pad 55 may epitaxially grown over each lower portion 1L of the plurality of semiconductor channels 1 exposed in the dielectric filled trenches 53 in the lower select gate level 50, such that the landing pad has a larger width or diameter than an underlying lower portion of the channel.

The landing pad 55 formation may comprise epitaxially growing a "mushroom head" shaped overgrown silicon 56 on exposed portions 1L of the channels 1. This silicon overgrowth 56 is then covered by an insulating gap fill layer (e.g., silicon oxide or nitride). The silicon mushroom head 56 and the gap fill layer are then planarized (e.g., by CMP) to form planar landing pads 55 on each pillar 1L separated by an insulating gap fill 57, as shown in FIG. 6D.

FIGS. 7-10 illustrate a method of making the lower portion of the memory device levels 70 of FIGS. 4A and 3A after the step of forming a lower select gate level 50 according to an embodiment of the disclosure. The memory device levels 70 comprise a plurality of NAND string portions.

Referring to FIG. 7, a stack 120 of alternating layers 121 (121a, 121b, etc.) and 132 (132a, 132b etc.) is formed over the completed lower select gate device level 50 which is located over major surface of the substrate 100. Layers 121, 132 may be deposited over the substrate by any suitable deposition method, such as sputtering, CVD, PECVD, MBE, etc. The layers 121, 132 may be 6 to 100 nm thick. The stack 120 may be covered with an optional cap layer of insulating material 200 different from materials 121 and 132.

In this embodiment, the first layers 121 comprise an electrically insulating material, such as silicon oxide, silicon nitride, high-k dielectric (e.g., organic or inorganic metal oxide), etc. The second layers 132 are sacrificial layers. Any sacrificial material that can be selectively etched compared to material 121 may be used for layers 132, such as conductive or insulating or semiconducting material. For example, the sacrificial material for layers 132 may be silicon nitride when material of layers 121 is silicon oxide.

The deposition of layers 121, 132 is followed by etching the stack 120 to form a plurality of memory holes 84. An at least a 3×3, such as an at least 6×6 array of memory holes 84 may be formed in locations where vertical channels of NAND strings will be subsequently formed.

The middle semiconductor channel 1 portions 1M are then formed on the landing pads 55 exposed in the memory holes 84. The channel portions 1M may be filled with insulating fill 2 (as shown in FIG. 4A) or may comprise a solid rod (as shown in FIGS. 3A and 7).

Preferably, the channel 1 portions 1M material comprises lightly doped p-type or n-type (i.e., doping below $10^{17}$ cm$^{-3}$) silicon material (e.g., polysilicon). An n-channel device is preferred since it is easily connected with n+ junctions (i.e., source 103 and drain 203 n+ doped regions having a doping concentration between $10^{17}$ cm$^{-3}$ and $10^{21}$ cm$^{-3}$). However, a p-channel device may also be used. Other semiconductor materials (e.g., SiGe, SiC, Ge, III-V, II-VI, etc.) may also be used.

The semiconductor channel 1 may be formed by any desired methods. For example, the semiconductor channel material 1 may be formed by depositing semiconductor (e.g., polysilicon) material in the holes 84 and over the stack 120 (e.g., by CVD), followed by a step of removing the upper portion of the deposited semiconductor layer by chemical mechanical polishing (CMP) or etchback using top surface of the stack 120 as a polish stop or etch stop.

In some embodiments, a single crystal silicon or polysilicon vertical channel 1 may be formed by metal induced crystallization ("MIC", also referred to as metal induced lateral crystallization) without a separate masking step. The MIC method provides full channel crystallization due to lateral confinement of the channel material in the hole 84.

In the MIC method, an amorphous or small grain polysilicon semiconductor (e.g., silicon) layer can be first formed in the holes 84 and over the stack 120, followed by forming a nucleation promoter layer over the semiconductor layer. The nucleation promoter layer may be a continuous layer or a plurality of discontinuous regions. The nucleation promoter layer may comprise any desired polysilicon nucleation promoter materials, for example but not limited to nucleation promoter materials such as Ge, Ni, Pd, Al or a combination thereof.

The amorphous or small grain semiconductor layer can then be converted to a large grain polycrystalline or single crystalline semiconductor layer by recrystallizing the amorphous or small grain polycrystalline semiconductor. The recrystallization may be conducted by a low temperature (e.g., 300 to 600 C) anneal.

The upper portion of the polycrystalline semiconductor layer and the nucleation promoter layer can then be removed by CMP or etchback using top surface of the stack 120 as a stop, resulting in the structure as shown in FIG. 7. The removal may be conducted by selectively wet etching the remaining nucleation promoter layer and any formed silicide in the top of layer following by CMP of the top of silicon layer using the top of the stack 120 as a stop.

Following formation of the channel 1 portions 1M, at least one slit trench 81 (also shown in FIG. 4B) is formed in the stack 120. The openings 81, 84 may be formed by forming a mask (e.g., a photoresist mask) by photolithography followed by etching unmasked areas. The slit trench opening 81 may be in the shape of a cut traversing more than one NAND string as illustrated in FIG. 4B. The slit trenches 81 allow back side access to the vertical NAND strings located in memory holes 84 for the control gate 3 formation in the "gate last" process.

Next, as shown in FIG. 8, the sacrificial material 132 is selectively etched compared to the first layer 121 material to form recesses 62. The recesses 62 may be formed by selective, isotropic wet or dry etching which selectively etches the sacrificial material 132 compared to the first layer insulating material 121 through the slit trenches 81. The recess 62 extends to the channel 1 portions 1M. Preferably, the entire layers of first sacrificial material 132 between the first layers 121 are removed up to the channel 1 portions 1M.

The memory film 13 is then formed in the recesses 62 as shown in FIG. 9. This includes forming a tunnel dielectric 11 in the recesses over the channel portions 1M located in the memory openings 84, forming a charge storage region 9 over the tunnel dielectric, and forming a blocking dielectric 7 over the charge storage region in the recesses 62. The blocking dielectric 7 may comprise a silicon oxide layer deposited by conformal atomic layer deposition (ALD) or chemical vapor deposition (CVD). Other high-k dielectric materials, such as hafnium oxide, may be used instead or in addition to silicon oxide. Dielectric 7 may have a thickness of 6 to 20 nm. The charge storage region 9 may comprise a silicon nitride layer deposited by any suitable method, such as ALD, CVD, etc., and have a thickness of 3 to 20 nm. The tunnel dielectric may comprise a relatively thin insulating layer (e.g., 4 to 10 nm thick) of silicon oxide or other suitable material, such as oxynitride, oxide and nitride multi layer stacks, or a high-k dielectric (e.g., hafnium oxide). The tunnel dielectric may be deposited by any suitable method, such as ALD, CVD, etc. Alternatively, the tunnel dielectric may be formed by thermally oxidizing the exposed sidewalls of the middle portions 1M of the channel 1 exposed in the recesses 62.

The control gates 3 are then formed on the blocking dielectric in the remaining portions of the recesses 62 through the slit trench(es) 81, as shown in FIG. 10. The control gates 3 are preferably metal or metal alloy gates, such as tungsten gates, formed by MOCVD or other suitable methods. Finally, if desired, the slit trenches 81 between array blocks may be filled with a dielectric fill material or they may be left unfilled as air gap trenches. This completes the lower portion of the memory device levels 70.

Then, a landing pad/built-in resistor 25 is formed over the channel 1M, as will be described below with respect to FIG. 16A. The process of FIGS. 7-10 is repeated again one or more times to form one or more upper portions of the memory levels 70 over the completed lower portion of the memory levels 70, as shown in FIG. 16B, and described in more detail below.

FIGS. 11A-11C illustrate the upper select gate level 60 of the device. FIG. 11C shows a top cross sectional view (along lines A-A and B-B in FIGS. 11A and 11B, respectively, with bit line 202 not shown) and FIGS. 11A and 11B illustrate side cross sectional views along lines A-A' and B-B' in FIG. 11C. The upper select gate level 60 is formed over the plurality of memory device levels 70, preferably after levels 70 are completed and preferably without using the stack 120 layers. The upper select gate level 60 comprises upper portions 1U of the plurality of semiconductor channels 1, and a plurality of upper drain electrodes (e.g., bit lines) 202. Each upper source or drain electrode 202 is electrically connected to each of the plurality of upper portions 1U of the semiconductor channels via the drain regions 203. Level 60 also includes a plurality of upper select gate electrodes 61. Each upper select gate electrode 61 is located adjacent to a gate dielectric 64 contacting the upper portion 1U of each semiconductor channel 1. The channel portion 1U, gate dielectric 64 and select gate 61 form the upper (drain) select transistor 16U of each NAND string. The upper select gate lines 66 separated from each other by insulating fill 63 connect the select gates 61 in rows.

The upper select gate level 60 may be formed in the same manner as the lower select gate level 50, except as follows. First, the upper portions 1U (i.e., the channels of the upper select gate transistors 16U) of the channels 1 are grown on the respective middle portions 1M of the channels. Thus, portion 1U may comprise polycrystalline semiconductor (e.g., polysilicon) or recrystallized, nearly single crystal silicon (e.g., recrystallized by the MIC process).

Second, rather than forming landing pads 55, the tops of the pillars 1U are doped with a dopant of the opposite conductivity type (e.g., n-type) than that of the channel 1 portion 1U (e.g., p-type) to form drain regions 203. This may be performed by ion implanting P or As into exposed portions of silicon pillars 1U. Third, as shown in FIG. 11B, the bit lines 202 are formed by a damascene process in rail shaped trenches in a dielectric layer 204 or by forming the dielectric layer 204 around bit line 202 rails. Otherwise, the upper select gate electrodes 61 may be formed by a sidewall spacer process on gate dielectric 64 covered silicon channels 1L of the upper select gate transistors 16U in the same matter as the lower select gate electrodes 51. If desired, portions of the gates 61 and/or the drain 203 of transistors 16U may be silicided.

FIGS. 12A and 12B illustrate exemplary dimensions (in nanometers) of the select transistors 16 and elements of levels 50 and 60, respectively, in units of nanometers. The above configuration provides a dense array for larger block sizes. The CVNAND scales below 5 nm effective half pitch (F/n), where F is the minimum feature size and n is the number of device levels.

The above described NAND device may be programmed and read by conventional NAND techniques. However, since the select gates for each NAND string are separated, the erase operation of the above device may be advantageously performed by a gate induced drain leakage (GIDL) process through the lower select gate source transistor 16L in the lower select gate device level 50. The effective GIDL erase allows erasing of very tall stacks by optimizing the bottom SGS transistor 16L with respect to GIDL current (during erase) and off/leakage currents (during inhibit). This also provides an effective erase from source line 102 side only, which allows optimization of off current and leakage current (during inhibit and read) for top SGD transistor 16U. This allows the device to open up an inhibit window and reduce read current leakage for non selected blocks. It is believed that sub block erase could become effective compared to prior art three dimensional NAND.

Figure 13A:
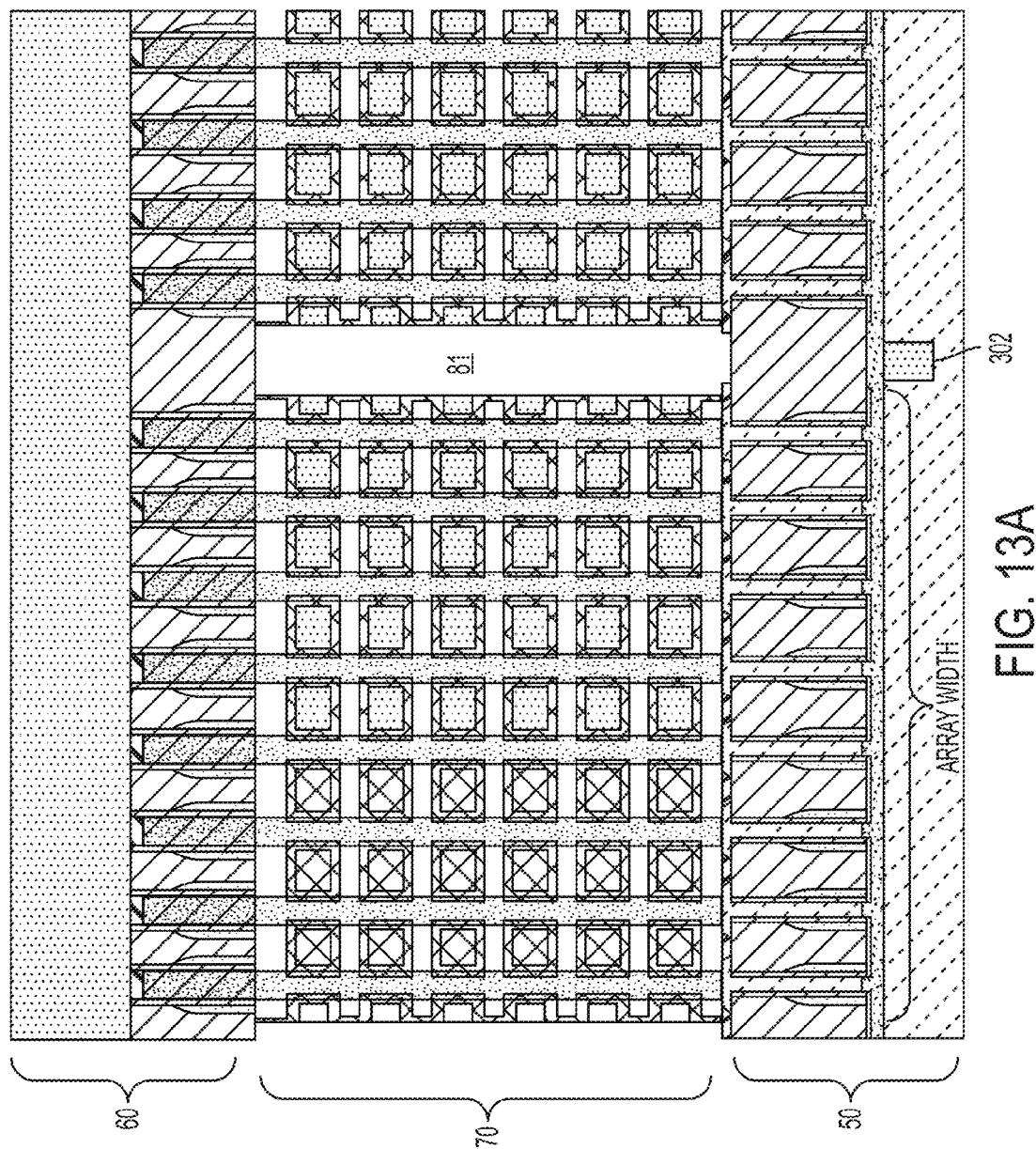
FIGS. 13A and 13B are side cross sectional views of NAND memory devices of other embodiments of the disclosure.
Figure 13B:
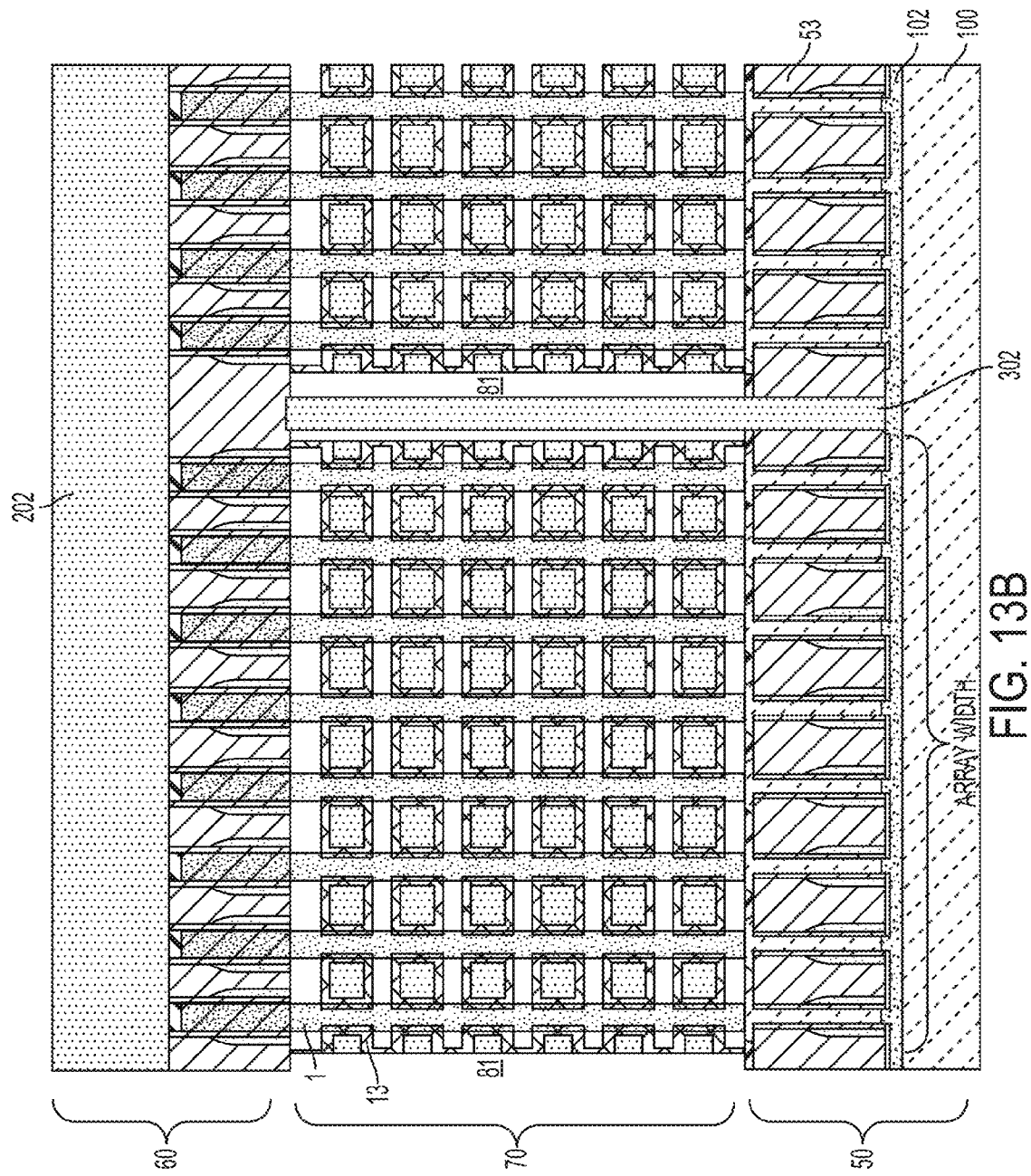

FIGS. 13A and 13B are side cross sectional views of a NAND memory device of embodiments of the disclosure. The devices shown in FIGS. 13A and 13B are similar to the device shown in FIG. 3A above, except that the devices shown in FIGS. 13A and 13B contain a local interconnect (source contact) 302. The local interconnect 302 may extend below the array in the embodiment of FIG. 13A (e.g., the local interconnect may extend in and out of the page under the array in the view of FIG. 13A). Alternatively, the local interconnect 302 may extend in the slit trenches 81 in the embodiment of FIG. 13B. The local interconnect 302 may comprise any suitable conductive material, such as tungsten, aluminum, copper, etc.

In the embodiment of FIG. 13B, the local interconnect 302 comprises a vertical pillar which electrically contacts the lower electrode 102 (e.g., the heavily doped semiconductor region source electrode in the major surface of the semiconductor substrate 100 or another electrode located over the substrate). The upper portion of the local interconnect 302 is in electrical contact with a source line.

In the present embodiment, the slit trenches 81 and the local interconnect 302 extend through the memory device levels 70 and through the dielectric trench fill material 53 to an exposed upper surface of the lower electrode 102. Preferably, the sidewalls of the slit trenches 81 are coated with an insulating layer 304, such as silicon oxide (see FIGS. 14D and 14E), and the local interconnect is formed in the middle of the slit trenches 81 between the insulating layer 304 portions.

As shown in FIG. 13B, the width of the array of vertical NAND strings is defined by the space between adjacent trenches 81, at least one or more of which can be filled with the local interconnect 302. The local interconnect 302 may contact a common lower electrode 102 of adjacent arrays of strings to provide source side erase for the strings in plural arrays of NAND strings at the same time.

The local interconnect may be formed by etching the trenches 81 as described above all the way to the lower electrode 102, forming the insulating layer 304 in the trenches 81 and filling the remaining central space in the trenches with the conductive material of the local interconnect 302. The portions of the conductive layer of the local interconnect 302 and/or insulating layer 304 which extends out of the trenches 81 may be removed by planarization, such as CMP. In the alternative embodiment of FIG. 13A, the local interconnect is formed under the array prior to formation of the array.

Figure 14C:
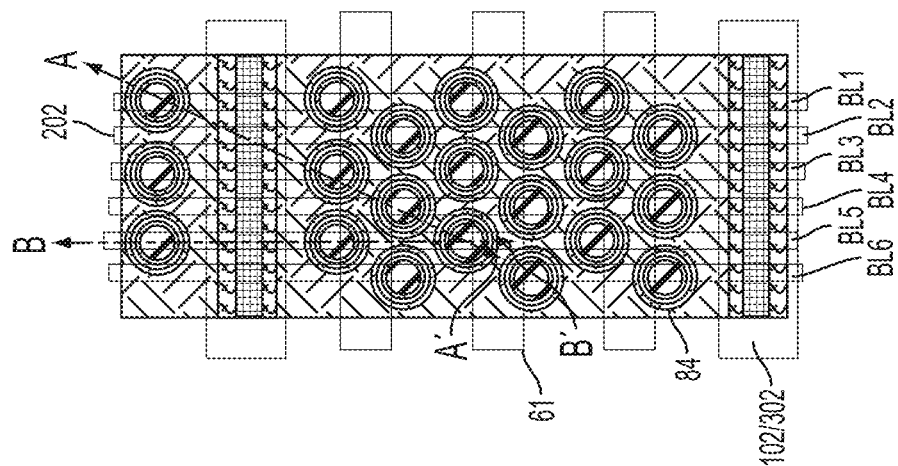
FIG. 14A is a top cross sectional view of the prior art device and FIGS. 14B and 14C are a top cross sectional views of NAND memory devices according to embodiments of the disclosure.
Figure 14B:
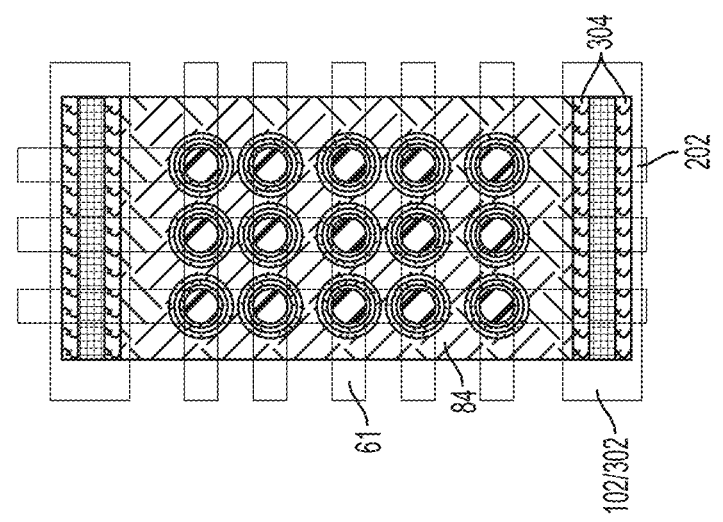
Figure 14A:
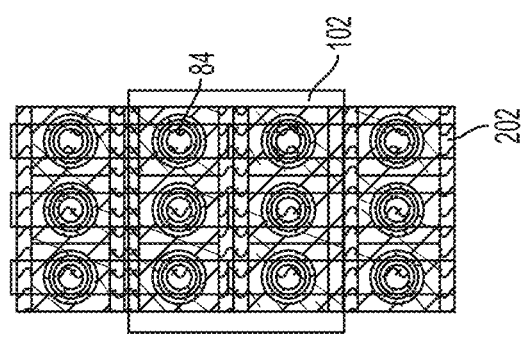

FIG. 14A is a top cross sectional view of the prior art BiCS NAND device shown in FIGS. 1B and 2B. FIGS. 14B and 14C are a top cross sectional views of the CVNAND memory devices according to embodiments of the disclosure.

As shown in FIG. 14B, the filled memory holes 84 (i.e., holes 84 containing the pillar channel 1 and memory film 13) are arranged in a square or rectangular layout with the memory holes located at corners of an imaginary rectangle or square, similar to the BiCS layout in FIG. 14A. The upper select gates 61, bit lines 202 and local interconnect 302 extending to the lower electrode 102 are also shown in FIG. 14B.

FIG. 14C illustrates an alternative embodiment in which the filled memory holes 84 (i.e., the NAND string channel 1 and memory film 13) are arranged in a substantially hexagonal pattern. This pattern comprises a repeating unit pattern of seven filled memory holes 84 having a central hole 84 surrounded by six other holes 84 arranged in a hexagonal layout around the central hole 84. In other words a central semiconductor channel 1 and memory film 13 unit is surrounded by six other semiconductor channel and memory film units arranged in a hexagonal layout around the central semiconductor channel and memory film unit. The hexagonal pattern has three axes of symmetry, in the same plane, about a point the array. The three axes are separated by substantially 60 degrees from one another. Hence, the memory holes 84 are arranged on a hexagonal grid which is also known as hexagonal tiling, bitruncated hexagonal tiling, or omnitruncated hexagonal tiling. Advantageously, hexagonal packing of the takes only about 87% of the area typically used by the same number of cells using standard rectangular layout shown in FIG. 14A.

The memory holes 84 in the hexagonally tiled configuration of FIG. 14C are staggered along each select gate 51, 61 when viewed from the top. The hexagonally tiled configuration of FIG. 14C provides a relaxed layout (i.e., larger pitch) for the select gates 51, 61 compared to the layout of FIGS. 14A and 14B. However, the density of the array with the hexagonally tiled configuration of FIG. 14C can be increased compared to the layout of FIGS. 14A and 14B, with the bit line 202 pitch reduced by a factor of 2 compared to the one in the layout of FIGS. 14A and 14B.

Figure 14D:
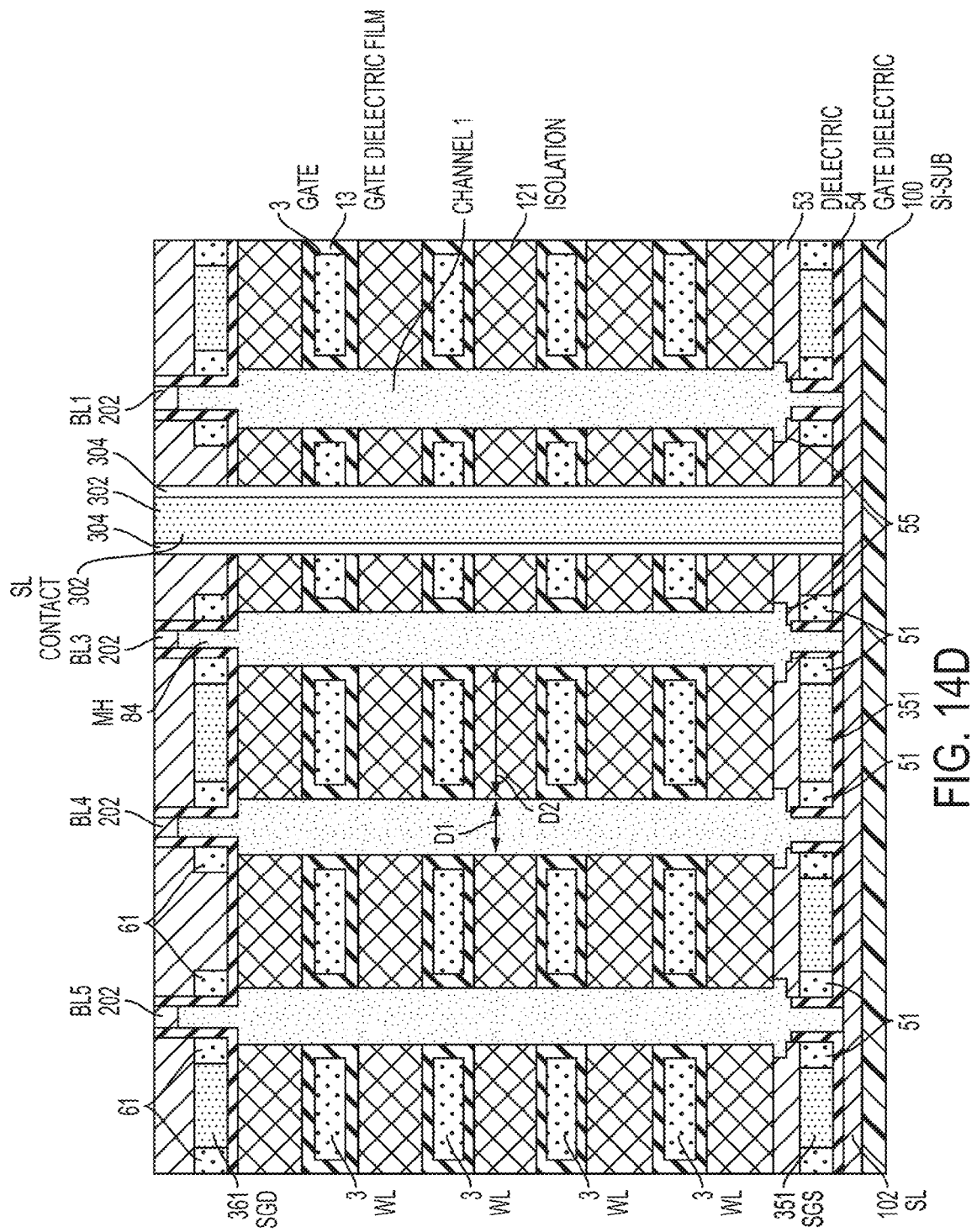
FIGS. 14D and 14E are respective side cross sectional views along lines A-A' and B-B' in FIG. 14C of a NAND memory device of an embodiment of the disclosure.
Figure 14E:
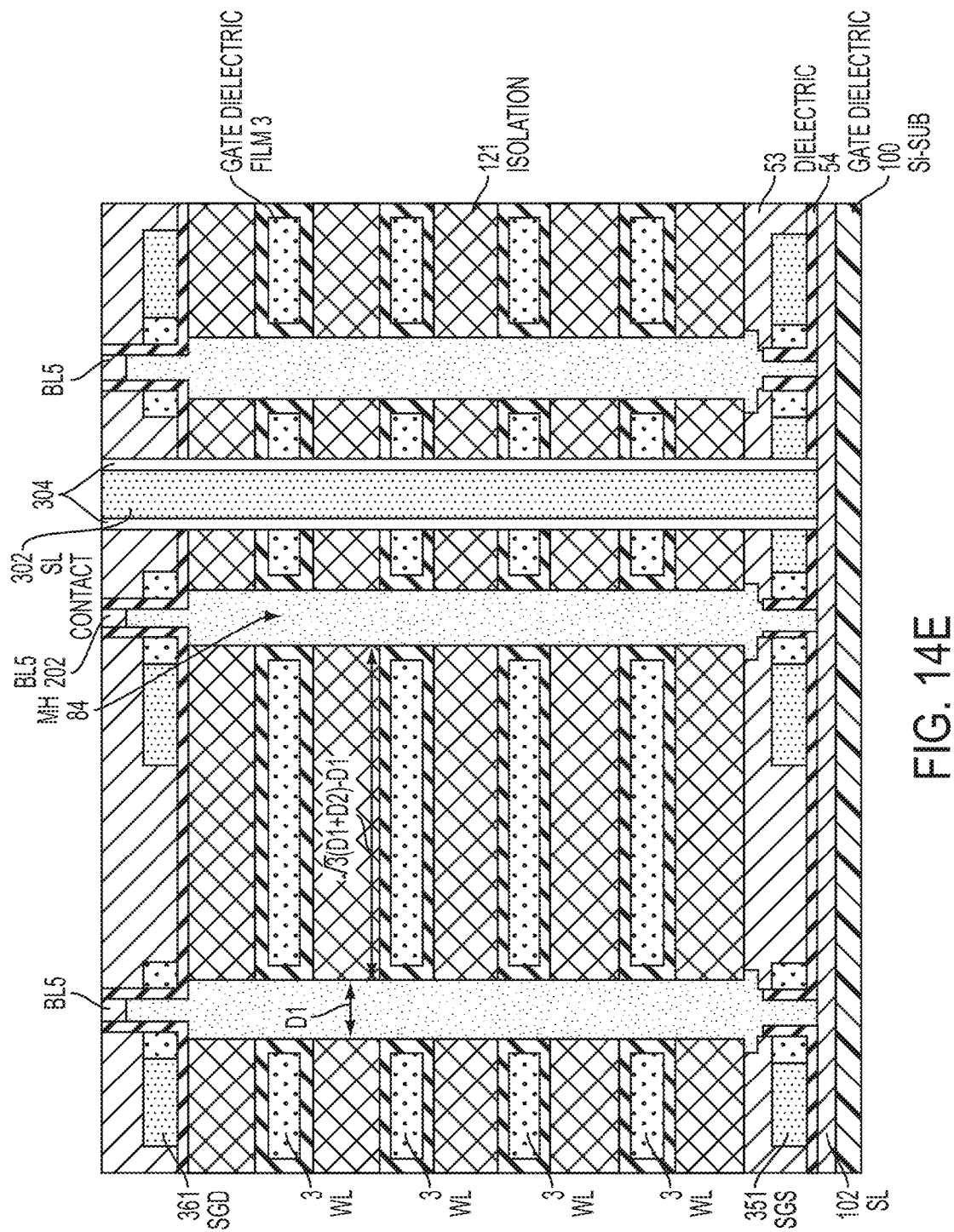

FIGS. 14D and 14E are respective side cross sectional views along lines A-A' and B-B' in FIG. 14C of the CVNAND memory device with the hexagonally tiled memory hole 84 configuration. Line A-A' is a diagonal line through filled memory holes 84 located on bit lines 1, 3, 4 and 5. Line B-B is a line along bit line 5. In the example shown in FIG. 14C, there are six bit lines (BL1, BL2, BL3, BL4, BL5 and BL6) and three select gates 61 which form a 6×3 hexagonally tiled array of eighteen NAND strings between adjacent local interconnects 302. Arrays having a configuration other than 6×3 may also be used as desired.

FIGS. 14D and 14E also illustrate the connector lines 351, 361 for the respective lower select gates 51 and upper select gates 61 of the respective SGS 16L and SGD 16U select transistors. The lines 351, 361 may comprise any suitable conductor, such as tungsten, and may connect the select gates to the driver/control circuits (not shown).

As shown in FIG. 14D, the diameter of each memory hole 84 is labeled d1 and the distance between adjacent memory holes 84 (along the diagonal line A-A' in FIG. 14C) is labeled d2. The distance between adjacent memory holes 84 (along a given bit line, BL5, along the vertical line B-B' in FIG. 14C) is $\sqrt{3}*(d1+d2)-d1$.

FIGS. 15A to 15H are schematic side cross sectional views of steps in the method of making the TCAT type NAND memory device with one or more landing pads 25 shown in FIG. 2A. In this method, a lower portion of the channel 1 is formed in the respective lower portion of the memory opening 84 in the lower portion of the stack. This is followed by forming the landing pad 25, forming at least one additional portion of the stack, forming at least one additional portion of the memory opening to expose the landing pad 25 and forming at least one additional portion of the channel 1 in the memory opening in contact with the landing pad 25.

Figure 15A:
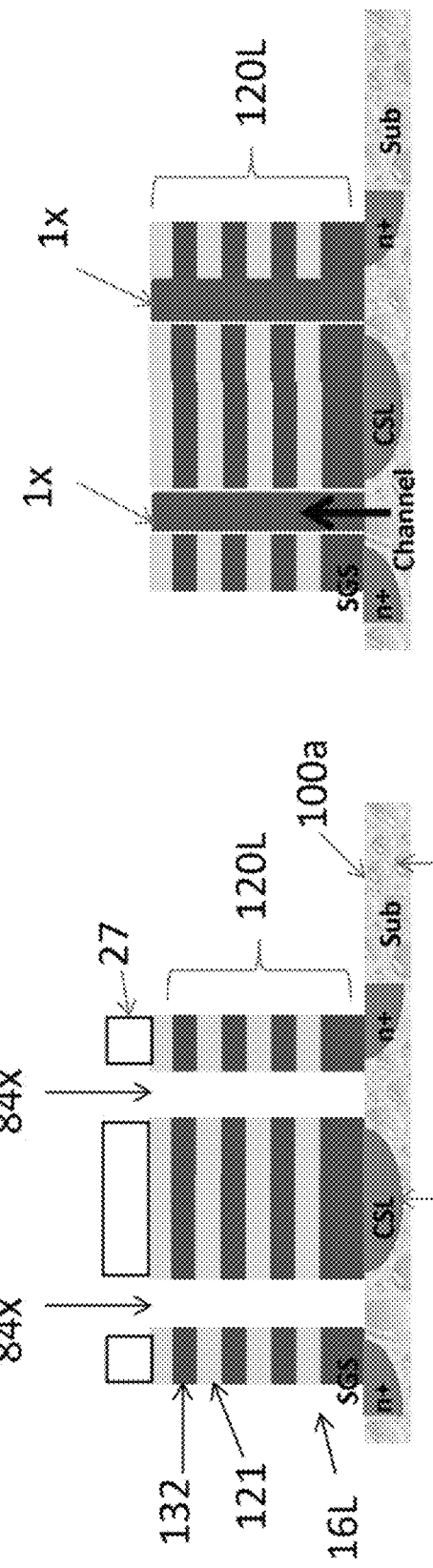

The method begins by forming the lower electrode 102, such as by implanting a heavily doped diffusion region 102 in the upper surface 100a of the substrate 100. For example, region 102 may comprise an n+ doped region in a p-type substrate 100, as shown in FIG. 15A. The conductivity types may be reversed if desired. Diffusion (doped) region 102 serves as a common source line of the lower select gate transistor 16L.

The lower portion of the memory stack 120L is then formed over the upper surface 100a of the substrate 100. The stack contains alternating insulating layers 121, such as silicon oxide layers, and sacrificial layers 132, such as silicon nitride layers. A hard mask 27 is formed over the lower portion of the stack. The hard mask is patterned (e.g., by lithography) and is used as a mask to etch the lower portions of the memory openings 84x in the lower portion of the stack 120L. The etching may comprise an RIE or another suitable etching. The hard mask 27 may then be removed or retained in the device. Alternatively, the hard mask is consumed during the etching process.

Figure 15B:
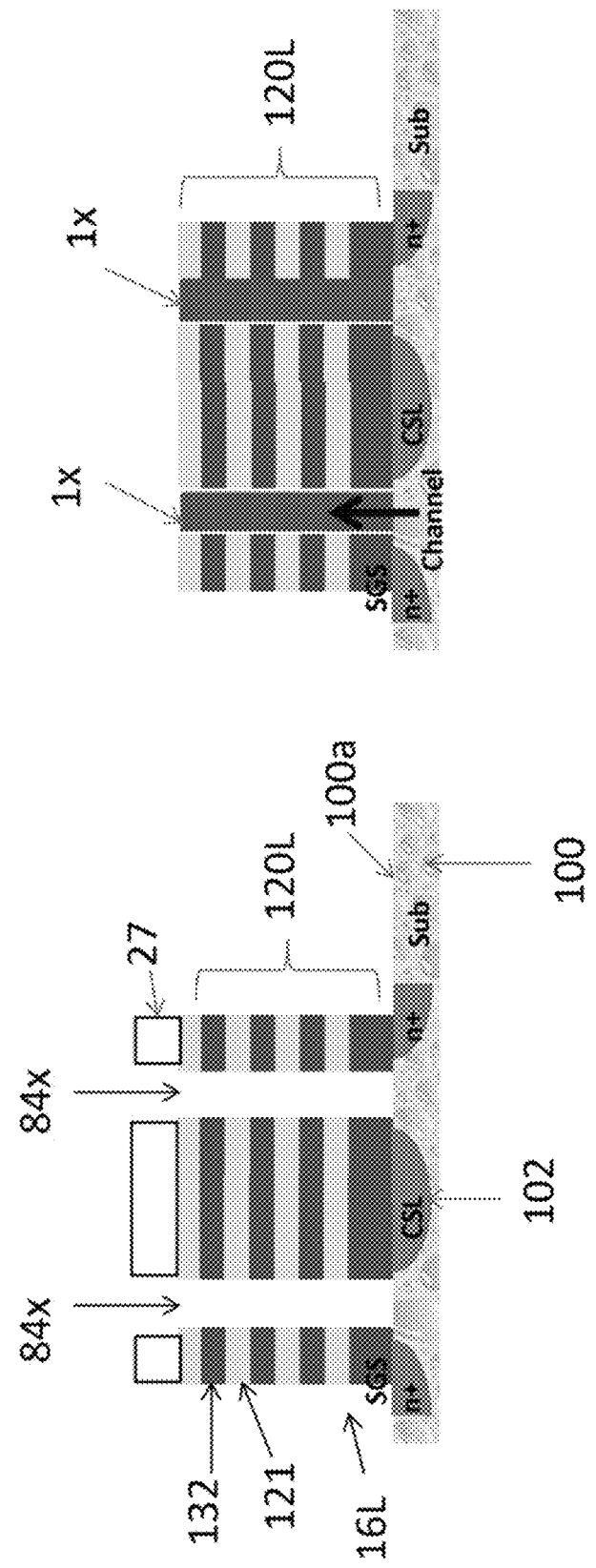

Then, the lower portion of the channels 1x are formed in the lower portion of the memory openings 84x, as shown in FIG. 15B. Any suitable formation method may be used, such as the method described above with respect to FIGS. 7-10.

The landing pad 25 is then formed on top of the lower portion of the channel 1x, as shown in FIG. 15C. The landing pad 25 may be formed using any suitable method, such as the method described above for forming the additional landing pad 55 with respect to FIGS. 6C-6D.

For example, a semiconductor landing pad 25 may be epitaxially grown over the each lower portion of the channels 1x exposed in the lower portion of the stack 120L, such that the landing pad has a larger width or diameter than an underlying lower portion of the channel 1x. The landing pad 25 formation may comprise epitaxially growing a "mushroom head" shaped overgrown silicon on exposed lower portions of the channels 1x. This silicon overgrowth is then covered by an insulating gap fill layer (e.g., silicon oxide or nitride). The silicon mushroom head and the gap fill layer are then planarized (e.g., by CMP) to form planar landing pads 25 on each portion of the channel 1x separated by an insulating gap fill 521, as shown in FIG. 15C.

Alternatively, the landing pads 25 may be formed by depositing a conductive or semiconductor layer over the lower portion of the stack 120L and then patterning the layer by lithography and etching to leave landing pads 25 having a larger width than that of the lower channel portion 1x.

A lower portion of the word line cut or trench 86x may then be formed in the lower portion of the stack 120L. This cut or trench 86x may be formed by photolithography and etching. The cut or trench 86x may be filled with a sacrificial or insulating material to protect it during subsequent processing. Alternatively, the portion of the cut or trench 86x is omitted and the entire cut or trench 86 is formed in a single etching step after all of the memory levels are completed. This completes the lower memory level of the NAND device.

Then, the above process may be repeated one or more times to form one or more additional memory levels over the lower memory level. As shown in FIG. 15D, the process of FIGS. 15A-15C is repeated for the middle portion of the stack 120M. Specifically, the middle portion of the stack 120M is formed over the landing pads 25 and the lower portion of the stack 120L containing the lower portions of the channels 1x. Another hard mask is formed over the middle portion of the stack 120M, and the middle portions of the memory openings 84y are etched into the middle portion of the stack 120M to expose the landing pads 25, as shown in FIG. 15D. It should be noted that the lower 84x and middle 84y portions of each memory opening 84 may be partially or completely misaligned with each other, as long the landing pads 25 are exposed in respective middle portions of the memory openings 84y.

Then, the middle portion of the channels 1y are formed in the middle portions of the memory openings 84y, as shown in FIG. 15D. The landing pad 25 is then formed on top of the middle portion of the channel 1y. The landing pad 25 may be formed using any suitable method, such as the method described above. A middle portion of the word line cut or trench 86y may then be formed in the middle portion of the stack 120M. This cut or trench 86y may be formed by photolithography and etching, and optionally filled with a sacrificial or insulating material. This completes the middle memory levels.

If desired, one or more additional middle or upper portions of the memory levels are then formed over the middle memory levels. As shown in FIG. 15E, the process of FIGS. 15A-15C is repeated for the upper portion of the stack 120U. Specifically, the upper portion of the stack 120U is formed over the landing pads 25 and the middle portion of the stack 120M containing the middle portions of the channels 1y. Another hard mask is formed over the upper portion of the stack 120U, and the upper portions of the memory openings 84z are etched into the upper portion of the stack 120U to expose the landing pads 25, as shown in FIG. 15E. It should be noted that the middle 84y and upper 84z portions of each memory opening 84 may be partially or completely misaligned with each other, as long the landing pads 25 are exposed in respective upper portions of the memory openings 84z.

Then, the upper portion of the channels 1z are formed in the upper portions of the memory openings 84z, as shown in FIG. 15F. The landing pad 25 is then formed on top of the upper portion of the channel 1z. The landing pad 25 may be formed using any suitable method, such as the method described above. The upper select transistor 16U may also be formed during this step or during a separate step.

An upper portion of the word line cut or trench 86z is then formed in the upper portion of the stack 120U. This cut or trench 86z may be formed by photolithography and etching. If the cut or trench portions 86x, 86y were filled with a sacrificial material, then the sacrificial material is removed at this time and the cut or trench may be subsequently refilled with an insulating material. Alternatively, the entire cut or trench 86 is formed in a single etching step at this time through the entire stack 120.

Figure 15G:
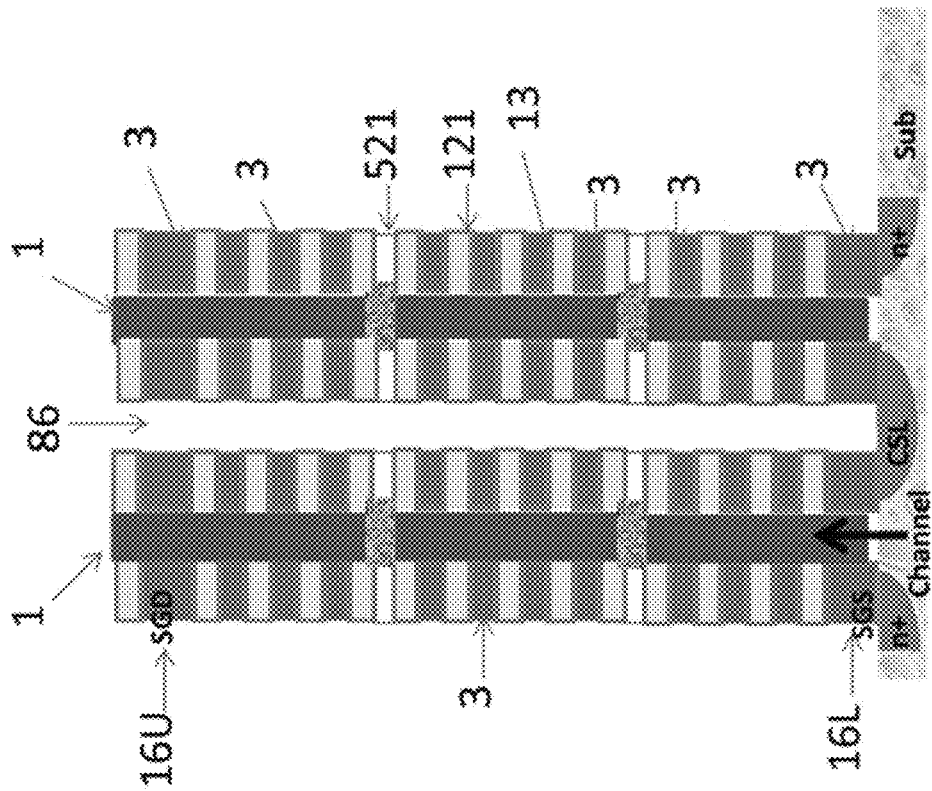

The memory films and the control gate electrodes are then formed in the entire stack 120 using a back side process (similar to the process shown in FIGS. 8-10). First, as shown in FIG. 15F, the sacrificial material layers 132 (such as the silicon nitride layers), are removed from the stack 120 through the cut or trench 86 using a selective wet etch to leave recesses 62 between the insulating layer 121 in the stack 120. The memory film 13 (e.g., an ONO film) is then formed on the surface of the recesses 62 through the cut or opening 86, as shown in FIG. 15G. The control gate electrodes 3 are then formed in the recesses 62 on the memory films 13 through the cut or opening 86, as shown in FIG. 15H.

Figure 15H:
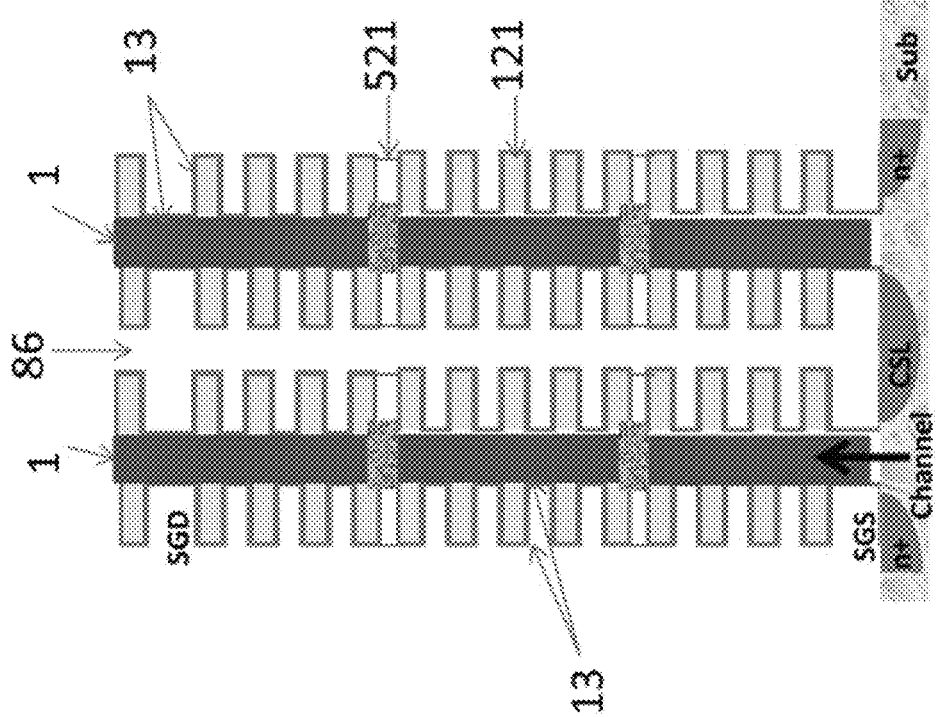

In an alternative embodiment, the back side process shown in FIGS. 15F-15H is performed on each portion of the stack between the channel and landing pad formation steps rather than on the entire stack. In this alternative method, after the lower portion of the channels 1x are formed in the lower stack portion 120L in FIG. 15B, the cut or trench 86x is formed in the lower portion of the stack 120L and sacrificial material layers 132 are removed to leave recesses 62. The recesses are then filled with the memory films 13 and the control gate electrodes 3. The cut or trench 86x may be filled with an insulating or sacrificial material and the landing pads 25 are then formed on the lower portion of the channels 1x. The process then continues as shown in FIG. 15D.

Then, after the middle portion of the channels 1y are formed in the middle stack portion 120M in FIG. 15D, the cut or trench 86y is formed in the middle portion of the stack 120M and sacrificial material layers 132 are removed to leave recesses 62. The recesses are then filled with the memory films 13 and the control gate electrodes 3. The cut or trench 86y may be filled with an insulating or sacrificial material and the landing pads 25 are then formed on the middle portion of the channels 1y. The process then continues as shown in FIG. 15E.

Then, after the upper portion of the channels 1z are formed in the upper stack portion 120U in FIG. 15E, the cut or trench 86z is formed in the upper portion of the stack 120L and sacrificial material layers 132 are removed to leave recesses 62. The recesses are then filled with the memory films 13 and the control gate electrodes 3. The cut or trench 86z may be filled with an insulating or sacrificial material. This results in the device shown in FIG. 15H.

After the control gate electrodes 3 are formed, either by the method of FIGS. 15A-15H or by the alternative method described above, the bit line contact 202 is then formed in contact with the upper channel portion 1z as shown in FIG. 2A to complete the TCAT type VNAND with landing pads 25.

Figure 16A:
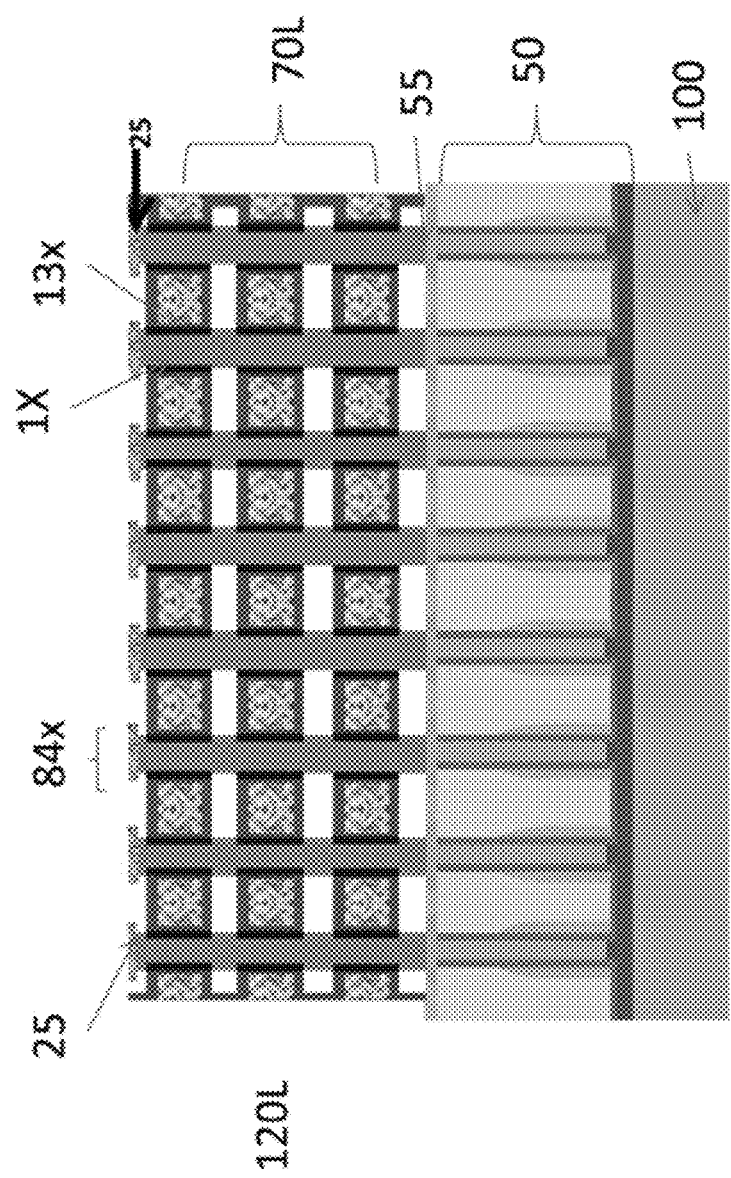
FIGS. 16A to 16B are side cross sectional views of steps in the method of making the NAND memory device shown in FIG. 3A.
Figure 16B:
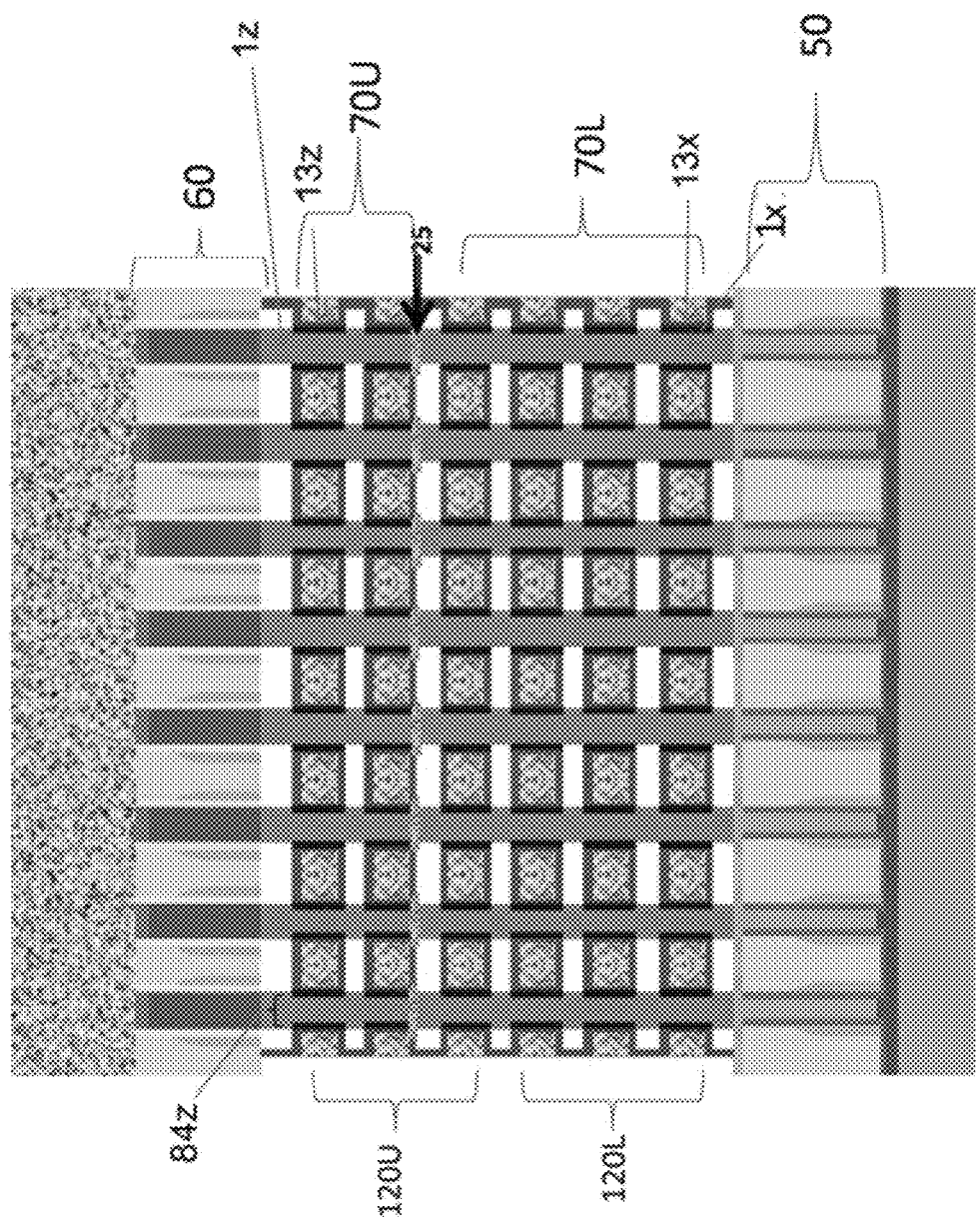

A similar method may be used to form the CVNAND of FIGS. 3A-14E, as shown in FIGS. 16A and 16B. As shown in FIG. 16A, the lower portion of the memory levels 70L is formed over the lower select gate level 50, which is formed using the methods shown in FIGS. 5A-6D. The lower portion of the memory levels 70L includes the lower portion of the memory stack 120L. A hard mask is formed over the lower portion of the stack. The hard mask is patterned (e.g., by lithography) and is used as a mask to etch the lower portions of the memory openings 84x in the lower portion of the stack 120L. The etching may comprise an RIE or another suitable etching. The hard mask may then be removed or retained in the device. Alternatively, the hard mask is consumed during the etching process.

Then, the lower portions of the memory films 13x and the channel 1x are formed in the lower portions of the memory openings 84x as shown in FIG. 16A. Any suitable formation method may be used, such as the method described above with respect to FIGS. 7-10 or the front side method described below with respect to FIGS. 17A-17H. The landing pad 25 is then formed on top of the lower portion of the channel 1x. The landing pad 25 may be formed using any suitable method, such as the method described above. This completes the lower memory levels 70L of the NAND device.

Then, the above process may be repeated one or more times to form one or more additional memory levels 70U over the lower memory levels 70L. As shown in FIG. 16B, the process of FIG. 16A is repeated for the upper portion of the stack 120U. Specifically, the upper portion of the stack 120U is formed over the landing pads 25 and the lower portion of the stack 120L containing the lower portions of the channels 1x. Another hard mask is formed over the upper portion of the stack 120U, and the upper portions of the memory openings 84z are etched into the upper portion of the stack 120U to expose the landing pads 25. It should be noted that the lower 84x and upper 84z portions of each memory opening 84 may be partially or completely misaligned with each other, as long the landing pads 25 are exposed in respective upper portions of the memory openings 84z.

Then, the upper portions of the memory films 13z and the channel 1z are formed in the upper portions of the memory openings 84z as shown in FIG. 16B. The upper select transistor level 60 is then formed over the upper memory levels 70U using the method shown in FIGS. 11A-12B. A similar method to the one described in FIGS. 15A-15F and 16A-16B may be used to form other VNAND devices with landing pads, such as P-BiCS type devices.

In another embodiment, a different method is used to form the P-BiCS type VNAND devices, as illustrated in FIGS. 17A through 17H. In this embodiment method, lower portions of the memory openings 84x are formed in the lower portion of the stack 120L. This is followed by filling the lower parts 84s of the lower portions of the memory openings 84x with a sacrificial material 31, and widening the remaining exposed top parts 84t of the of the lower portions of the memory openings 84x where the landing pad 25 will be subsequently formed. The widened part 84t is then filled with a sacrificial material. Then, at least one additional portion of the stack 120U is formed over the lower portion of the stack 120L. At least one additional portion (e.g., the upper portions) of the memory openings 84z are formed in the additional portion of the stack 120U to expose the sacrificial material in part 84t of the lower portions of the memory openings 84x. Then, the sacrificial material is removed from the entire opening 84 and the entire memory films 13 are formed in the memory openings 84 followed by forming the entire channels 1 and the landing pads 25 in the memory openings 84 in the same growth step (e.g., CVD growth step). Thus, in this method, the entire channel 1 (including landing pads 25 built into the channel 1) is formed in one step rather than in plural steps by using the sacrificial material to temporarily fill the memory opening portion 84x.

As shown in FIG. 17A, a lower portion of the stack 120L of alternating layers 3, 121 is formed over the major surface 100a of the substrate 100. Layers 3, 121 may be deposited over the substrate by any suitable deposition method, such as sputtering, CVD, PECVD, MBE, etc. The layers 3, 121 may be 6 to 100 nm thick. The substrate 100 may contain a sacrificial material region 29, such as a carbon or other suitable material.

The lower portion of the stack 120L may be covered with an optional cap layer of insulating material 123. The cap layer 123 is preferably thicker than layers 3, 121. For example, layer 123 may be 50-200 nm thick, such as 60-75 nm thick. The cap layer may comprise a silicon oxide layer, such as a silicon oxide layer formed by CVD using a TEOS precursor.

In this embodiment, the first layers 121 comprise an electrically insulating material, such as silicon oxide, silicon nitride, high-k dielectric (e.g., organic or inorganic metal oxide), etc. The second layers 3 comprise control gate material layers rather than the sacrificial material layers 132. The control gate material may comprise any one or more suitable conductive or semiconductor control gate material known in the art, such as doped polysilicon or a metal, such as tungsten, copper, aluminum, tantalum, titanium, cobalt, titanium nitride or alloys thereof. Thus, the stacks 120 in the TCAT, P-BiCS and/or CVNAND type devices may comprise alternating insulating 121 and sacrificial 132 layers (in the "back-side" process where the sacrificial material layers 132 are removed from the stack and the memory films 13 and control gate electrodes 3 are formed in place of layers 132 through the back side cut and recesses) or alternating insulating 121 and control gate 3 material layers (in a process where the control gate material layers are part of the initial stack and the memory film is formed through the memory holes 84).

The deposition of layers 3, 121 is followed by etching the lower stack portion 120L to form a plurality of lower portions of the memory openings 84x. Then, as shown in FIG. 17B, the etch is continued into the sacrificial material region 29 to remove the sacrificial material and leave a connecting opening 30 which connects two adjacent lower portions of memory openings 84x. The openings 84x will eventually contain the two wing portions 1a and 1b of the U-shape semiconductor channel which extend substantially perpendicular to the major surface 100a of the substrate 100, and the connecting opening 30 will contain the connecting portion 1c of the U-shape semiconductor channel 1 which connects the two wing portions 1a, 1b and which extends substantially perpendicular (i.e., horizontally) to the major surface 100a of the substrate 100.

As shown in FIG. 17C, the lower parts 84s of the lower portions of the memory openings 84x and the connecting opening 30 are filled with a sacrificial material 31. The sacrificial material may comprise any material which may be selectively etched compared to the materials of layers 3 and 121 and the material of the substrate 100. For example, for a silicon substrate 100, polysilicon control gate material layers 3 and silicon oxide layers 121, the sacrificial material 31 may comprise carbon, such as amorphous carbon. However, any other material may also be used.

Then, as shown in FIG. 17D, the remaining exposed top parts 84t of the lower portions of the memory openings 84x are widened such that the top parts 84t have a larger width (e.g., larger diameter) than the bottom part 84s. Preferably, the width (e.g., diameter) of the top part 84t is the same as the intended width (e.g., diameter) of the landing pad 25 which will be subsequently formed in the top part 84t. The widening may be performed by isotropically etching the cap layer 123 without substantially etching the sacrificial material 31 in the lower parts 84s of the lower portions of the memory openings 84x. The widened top parts 84t are then refilled with the sacrificial material 31a. Material 31a may be the same or different from material 31. Material 31a may be recessed to the top of the cap layer 123 by CMP or etchback.

Then, at least one additional portion of the stack (e.g., the upper portion of the stack) 120U is formed over the lower portion of the stack 120L, as shown in FIG. 17E. The additional portion of the stack 120U may also comprise alternating layers 3 and 121 described above. At least one additional portion (e.g., the upper portions) of the memory openings 84z are formed in the additional portion of the stack 120U to expose the sacrificial material 31a in the top part 84t of the lower portions of the memory openings 84x. If desired, the upper portions of the memory openings 84z may be intentionally or unintentionally misaligned with the lower parts 84s of the lower portions of the memory openings 84x, as long as the upper portions of the memory openings 84z expose a portion of the sacrificial material 31a in the widened top parts 84t of the lower portions of the memory openings 84x.

As shown in FIG. 17F, the sacrificial material 31, 31a is removed from the entire memory opening 84 (i.e., from both parts 84s and 84t). This may be performed by selectively etching away the sacrificial material in the memory opening. This forms the continuous memory openings 84 that extend through both the lower 120L and upper 120U portions of the stack 120. Each memory opening 84 includes portions 84z and 84x (which is made up of parts 84s and 84t) and the connecting opening 30.

The entire memory films 13 are then formed in the memory openings 84 in the entire stack, as shown in FIG. 17G. The memory films 13 are formed as hollow cylinders around the sidewalls of the openings 84.

This is followed by forming the entire U-shaped channels 1 and the landing pads 25 in the memory openings 84 in the same growth step inside the hollow memory film 13 cylinder. The two wing portions 1a and 1b of the U-shape semiconductor channel 1 extend substantially perpendicular to the major surface 100a of the substrate 100 in portions 84z, 84x of the memory openings, and the connecting portion 1c of the U-shape semiconductor channel 1 which connects the two wing portions 1a, 1b extends substantially perpendicular (i.e., horizontally) to the major surface 100a of the substrate 100 in the connecting opening 30. In this embodiment, the landing pad 25 may be relatively thick and contact dummy control gates 3d, as shown in FIG. 17G. Dummy control gates 3d (i.e., dummy word lines) are not connected to outside control circuitry and are not provided with a current or voltage during NAND operation.

A slit trench or cut 86A is then formed between the select gates 3 and the wings or arms of the U-shaped channel 1, as shown in FIG. 17H. The slit trench or cut 86 may be etched until the etch stop layer 89 shown in FIG. 2B is reached during the etching. The trench or cut 86A may be filled with an insulating material 87, such as silicon nitride. The select gate transistors 16, the source line 102 and the bit line 202 are then formed above the device, as shown in FIG. 2B. Optionally, the substrate may include a body contact gate (e.g. bottom gate) 91 located adjacent to the connecting portion 1c of the U-shape semiconductor channel 1, as shown in FIG. 2B.

If desired, the substrate may comprise a silicon on insulator type substrate containing one or more insulating layers 93 (e.g., silicon oxide/silicon nitride/silicon oxide stack) over a silicon wafer, as shown in FIG. 2B.

Thus, as described above, the method of FIGS. 17A-17G includes the steps of forming a lower portion 84x of memory openings in the lower portion of the memory stack 120L containing layers 3 and 121 and at least partially filling the lower portion 84x of the memory openings with a sacrificial material 31, as shown in FIGS. 17A and 17C. The method also includes forming an upper portion of the memory stack 120U over the lower portion of the memory stack and over the sacrificial material 31 and forming an upper portion 84z of the memory openings in the upper portion of the memory stack to expose the sacrificial material 31 in the lower portion of the memory openings 84, as shown in FIG. 17E. The method also includes removing the sacrificial material 31 to connect the lower portion 84x of the memory openings with a respective upper portion 84z of the memory openings to form continuous memory openings 84 extending through the upper and the lower portions of the memory stack and forming a semiconductor channel 1 in each continuous memory opening 84, as shown in FIGS. 17F and 17G.

FIGS. 18A to 18G illustrate an alternative embodiment method of forming the memory openings in which the lower portion of the memory openings is at least partially filled with a sacrificial material, an upper portion of the memory stack is formed over the lower portion of the memory stack and over the sacrificial material, an upper portion of the memory openings is formed in the upper portion of the memory stack, and the sacrificial material is removed to connect the lower portion of the memory openings with a respective upper portion of the memory openings.

In the embodiment of FIGS. 18A-18G, the step of at least partially filling the lower portion of the memory openings with a sacrificial material includes selectively growing a germanium sacrificial material using exposed edges of the polysilicon control gate material layers in the lower portion of the memory openings as a seed until the germanium sacrificial material completely fills the lower portion of the memory openings.

Figure 18A:
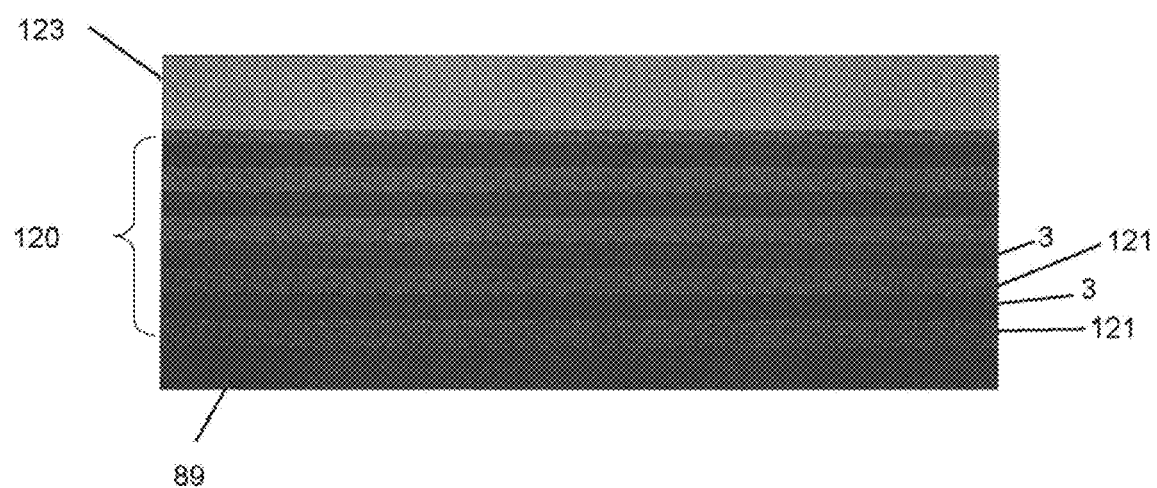
FIGS. 18A to 18G are side cross sectional views of steps in the method of making the NAND memory device according to an embodiment.

As shown in FIG. 18A, a lower portion of the stack 120L of alternating layers 3, 121 is formed over an etch stop layer 89 located over the major surface of the substrate. In this embodiment, the stack portion 120L includes alternating insulating layers 121, such as silicon oxide layers, and polysilicon control gate material layers 3. Layers 3, 121 may be deposited over the substrate by any suitable deposition method, such as sputtering, CVD, PECVD, MBE, etc. The layers 3, 121 may be 6 to 100 nm thick, such as 10-50 nm thick. Preferably, the top insulating layer 121 in the lower stack portion 120L is thinner than other insulating layers in the lower stack portion 120L. While a few layers 3, 121 are shown, any suitable number of layers, such as 24-32 pairs of layers 3, 121 may be formed in the lower portion of the stack 120L. The substrate 100 may contain a sacrificial material region, such as carbon, polysilicon, germanium or other suitable material, (not shown in FIG. 18A for clarity but shown in FIG. 17A).

The lower portion of the stack 120L may be covered with an optional hard mask layer or cap layer of insulating material 123. The hard mask or cap layer 123 is preferably thicker than layers 3, 121. For example, layer 123 may be 50-200 nm thick, such as 60-75 nm thick. The hard mask or cap layer 123 may comprise a silicon oxide layer, such as a silicon oxide layer formed by CVD using a TEOS precursor or an amorphous carbon hard mask material. If desired layer 123 may comprise a composite lower silicon oxide and upper carbon hard mask film.

Figure 18B:
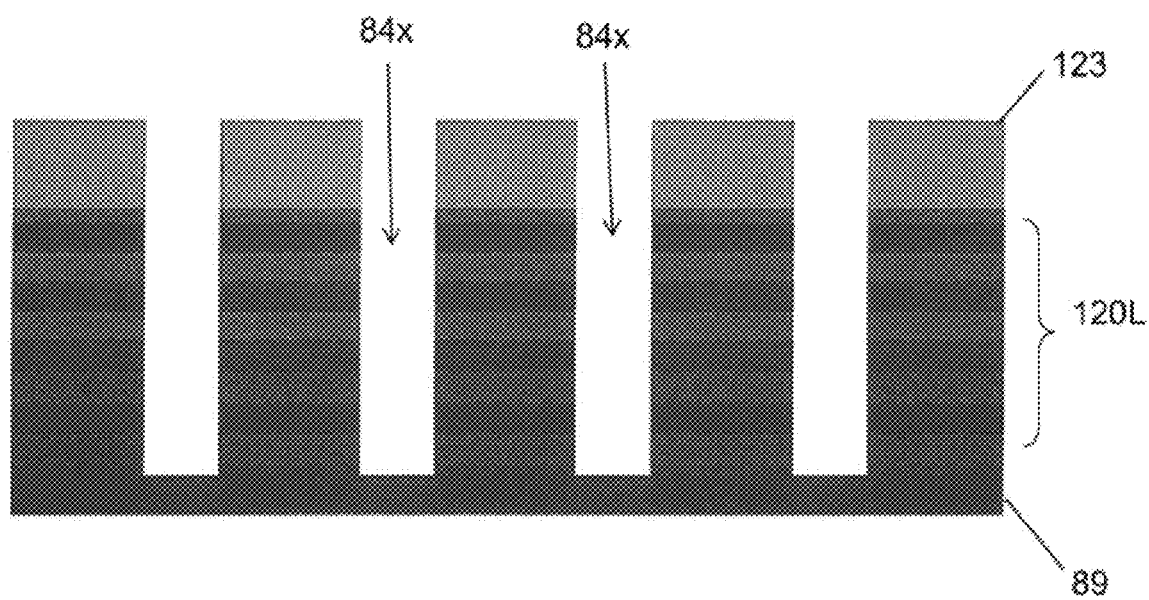

The deposition of layers 3, 121 is followed by etching the lower stack portion 120L to form a plurality of lower portions of the memory openings 84x, as shown in FIG. 18B. The hard mask layer 123 may be partially or completely consumed in this etching step. If the sacrificial material region 29 is present, then the etch is continued to remove the sacrificial material and leave a connecting opening 30 which connects two adjacent lower portions 84x of memory openings, as shown in FIG. 17B.

Figure 18C:
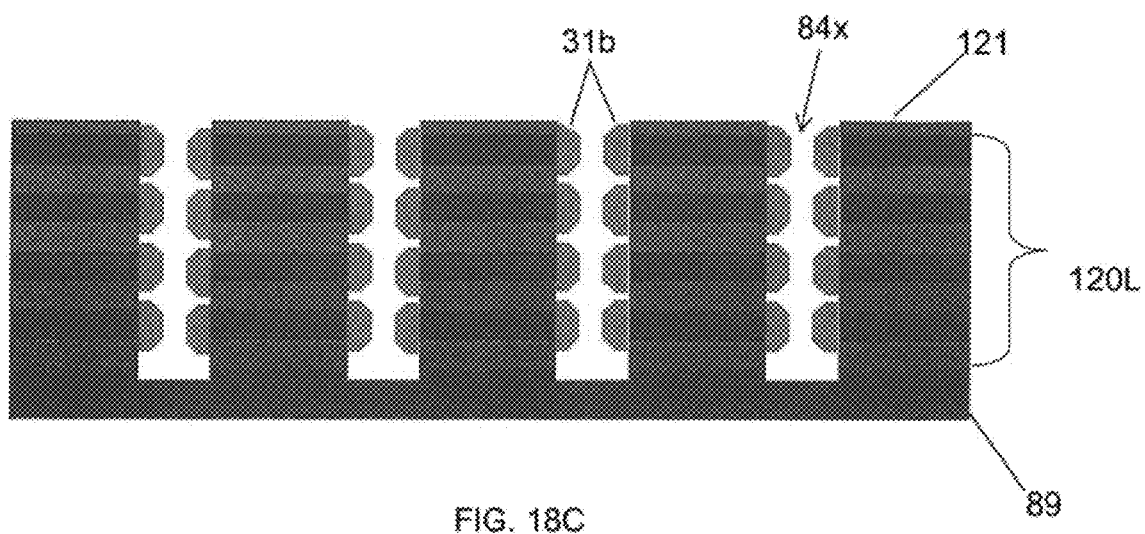

As shown in FIG. 18C, any remaining hard mask layer 123 material is removed by ashing (e.g., oxygen plasma ashing for a carbon hard mask) and/or wet cleaning. Then, the lower portion 84x of the memory openings are at least partially filled with a sacrificial material 31b. In this embodiment, at least partially filling the lower portion of the memory openings with a sacrificial material comprises selectively growing a germanium sacrificial material 31b using exposed edges of the polysilicon control gate material layers 3 in the lower portion 84x of the memory openings as a seed. The germanium sacrificial material 31b is grown laterally from the edges of layers 3 into the openings such that material 31b does not grow on an upper surface of the top insulating layer 121 of the lower stack portion 120L. The partially filled lower portion 84x of the memory openings are shown in FIG. 18C.

Figure 18D:
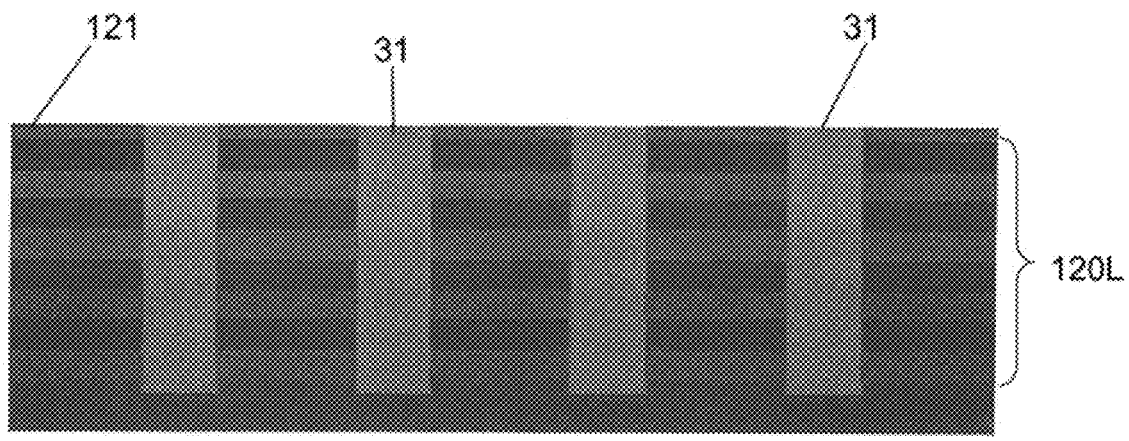

Preferably, the germanium sacrificial material growth continues until the germanium sacrificial material 31b completely fills the lower portion 84x of the memory openings, as shown in FIG. 18D. In other words, with adequate deposition time, the germanium crystals from adjacent seeds will coalesce and completely fill the lower portion 84x of the memory openings. Any suitable selective germanium growth on polysilicon seeds may be used, such as low temperature, low pressure chemical vapor deposition (LP-CVD). For example, a growth temperature of 330 C to 600 C, such as 340 to 400 C, a pressure of 0.1 to 10 torr, such as 0.25 to 1.5 torr, and a germane source gas in nitrogen and/or hydrogen may be used.

A configuration where the top insulating layer 121 is preferably thinner than the other layers in the lower portion of the stack 120L ensures that the germanium sacrificial material 31b completely fills the lower portion 84x of the memory openings. In case the germanium sacrificial material 31b overfills the lower portion 84x of the memory openings, a controlled etch back or CMP step may be conducted to planarize material 31b with the top of the lower portion of the stack 120L. If desired, the diameter of the top part of the lower portion 84x of the memory openings may optionally be widened for easier alignment in the subsequent lithography and etching steps and/or to form the landing pad 25, as shown in FIGS. 17D and 17H. Thus, the top parts may have a larger width (e.g., larger diameter) than the bottom parts of the lower portion 84x of the memory openings.

In an alternative method, rather than using a selective germanium sacrificial material 31b, a spin-on sacrificial carbon or polymer material may be used instead. In this step, the sacrificial carbon or polymer material is spun on over the device such that completely filling the lower portion 84x of the memory openings without covering the top of the lower portion of the stack 120L.

Figure 18E:
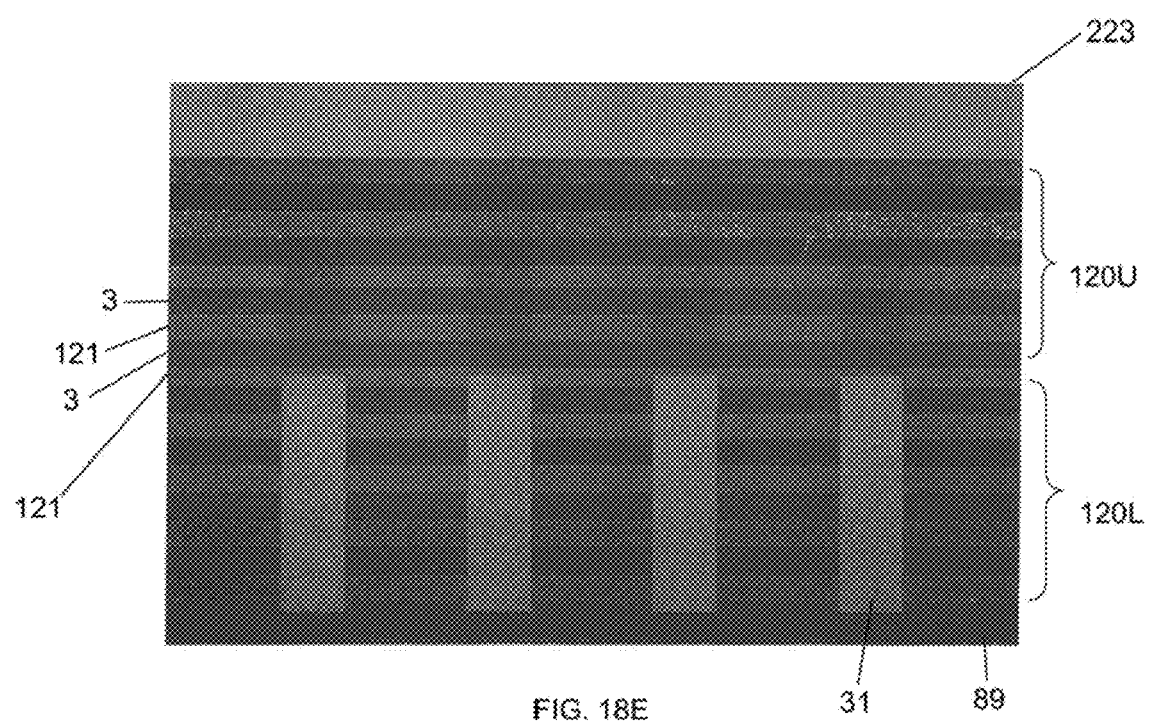

The method then proceeds in a similar manner as the method shown in FIGS. 17E-17H. At least one additional portion of the stack (e.g., the upper portion of the stack) 120U is formed over the lower portion of the stack 120L, as shown in FIG. 18E. The additional portion of the stack 120U may also comprise alternating layers 3 and 121 described above, such as 24-32 pairs of these layers.

Figure 18F:
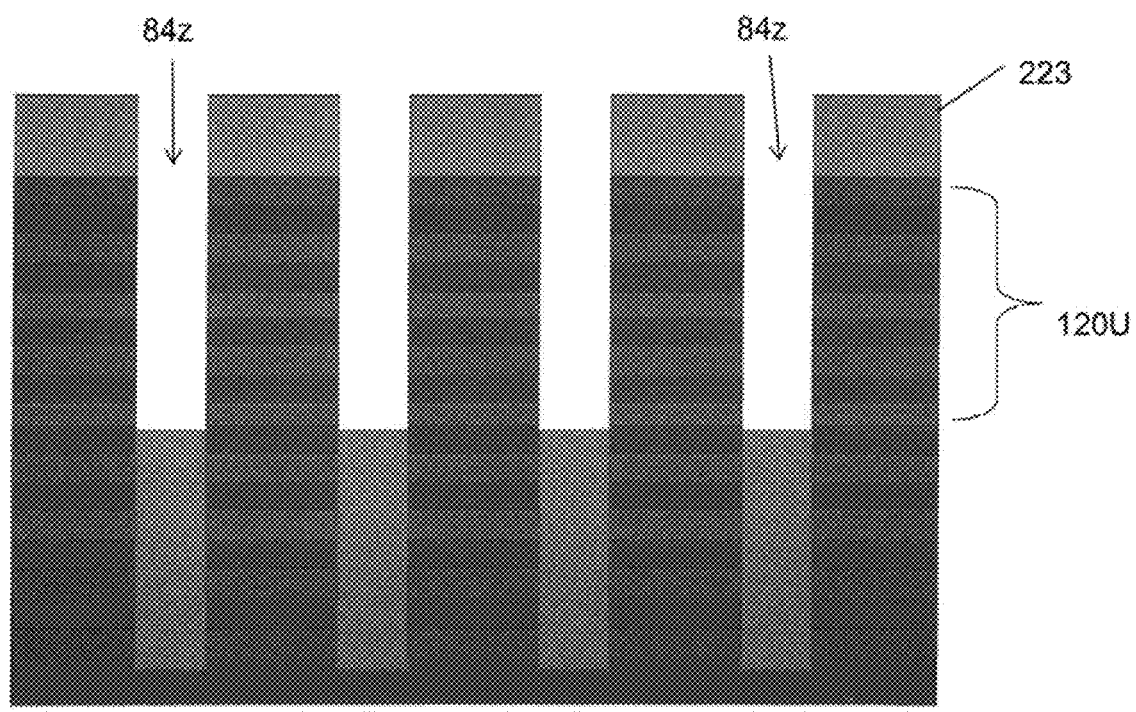

If desired, at least one second hard mask layer 223 is formed over the additional (e.g., upper) portion of the stack 120U, as shown in FIG. 18E. Layer 223 may comprise the same or different material as the hard mask layer 123. At least one additional portion (e.g., the upper portion) 84z of the memory openings are formed in the additional portion of the stack 120U to expose the sacrificial material 31b in the top part of the lower portion 84x of the memory openings, as shown in FIG. 18F.

If desired, the upper portion 84z of the memory openings may be intentionally or unintentionally misaligned with the lower portion 84x of the memory openings, as long as the upper portion 84z of the memory openings exposes a portion of the sacrificial material 31b in the optionally widened top parts of the lower portions 84x of the memory openings.

Figure 18G:
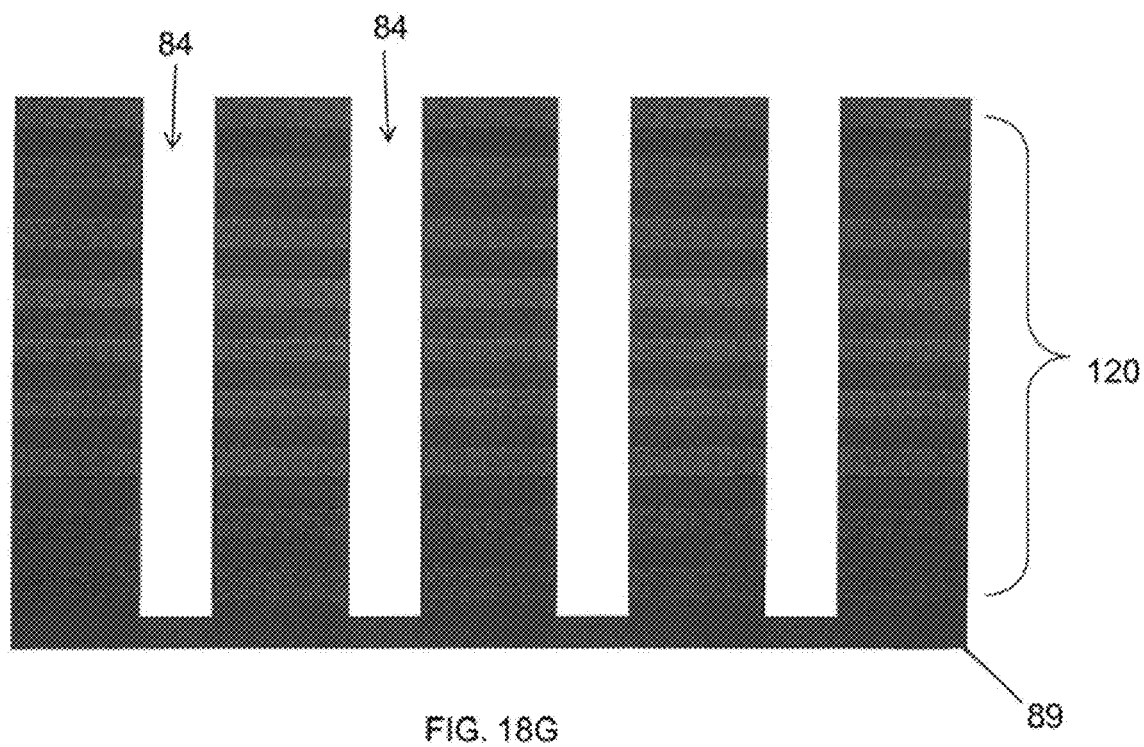

As shown in FIG. 18G, the sacrificial material 31b is removed from the lower portion 84x of memory opening 84 in the stack 120. This may be performed by using a highly germanium selective dry or wet etch. In one aspect, etching the upper portion of the memory stack 120U and removing the sacrificial material 31b occur in a same dry etching step by changing the etch chemistry from the polysilicon/silicon oxide selective etch chemistry to a germanium selective etch chemistry.

Alternatively, these etch steps may be different etching steps, such as using a dry etching step to form the upper portion 84z of the memory openings and using a wet etch to remove the sacrificial material 31b. For example, the dry etching step used to form the upper portion 84z of the memory openings may comprise a reactive ion etching step using a carbon hard mask layer 223. The etching exposes the sacrificial material 31b in the bottom of the upper portion 84z of the memory openings. Next, an oxygen containing plasma ashing step is used to remove the carbon hard mask layer 223. The oxygen containing plasma converts the germanium sacrificial material exposed in the upper portion of the memory openings to germanium oxide. Then, a germanium oxide selective wet clean or etch step (e.g., a peroxide containing etching liquid, such as a water and hydrogen peroxide based liquid) is used to remove the germanium oxide sacrificial material 31b.

If a spin-on carbon or polymer sacrificial material 31b is used, then it may be removed by oxygen plasma ashing together with the hard mask layer 223 and/or by any other suitable etching or thermal decomposition method.

The method of FIGS. 18A-18G may be used to form any suitable VNAND devices described above (e.g., TCAT, P-BiCS or CVNAND type devices). As described above, the entire memory films 13 are then formed in the memory openings 84 in the entire stack, as shown in FIG. 17G. The memory films 13 are formed as hollow cylinders around the sidewalls of the openings 84. This is followed by forming the entire channels 1 in the memory openings 84 in the same growth step inside the hollow memory film 13 cylinder, as shown in FIG. 17H. Optionally, for a P-BiCS type device with a U-shaped channel, a slit trench or cut 86A is then formed between the select gates 3 and the wings or arms of the U-shaped channel 1, as shown in FIG. 17H.

In another alternative embodiment shown in FIGS. 19A to 19H, a silicon or silicon germanium sacrificial material region 29 below the lower portion of the stack 120L is used as a seed for selective germanium sacrificial material 31b in the lower portion 84x of the memory openings 84. This method may be used to form a P-BiCS type VNAND having a U-shaped channel.

Figure 19A:
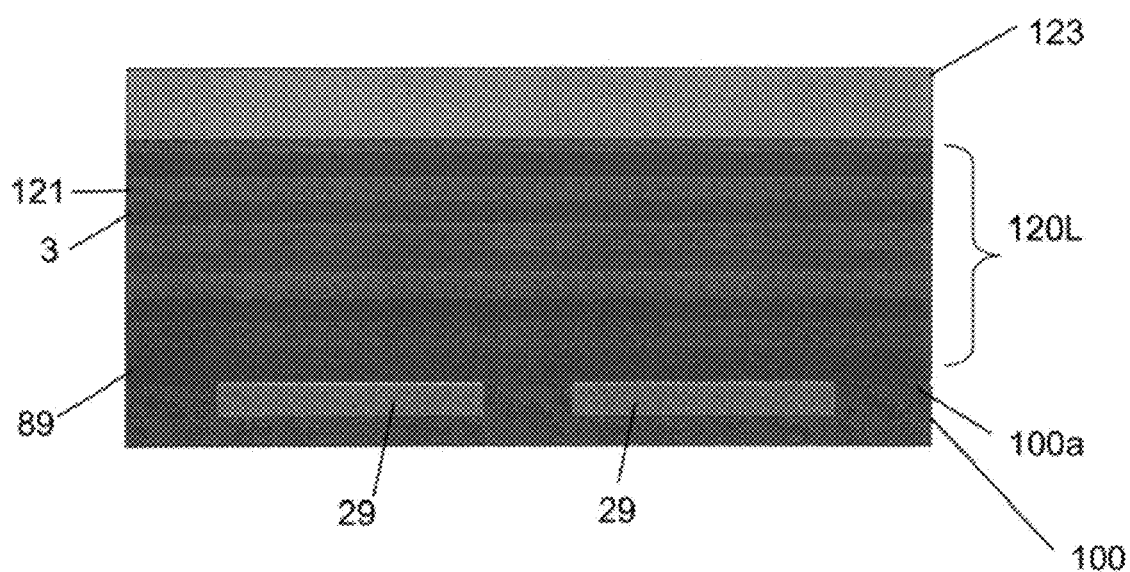

As shown in FIG. 19A, a lower portion of the stack 120L of alternating layers 3, 121 is formed over the major surface 100a of the substrate 100. In this embodiment, the lower stack portion 120L also preferably includes alternating insulating layers 121, such as silicon oxide layers, and polysilicon control gate material layers 3, as described above. The substrate 100 contains a connecting sacrificial material region 29, such as germanium or silicon germanium which can act as a seed for selective germanium growth, below the lower stack portion 120L. The lower portion of the stack 120L may be covered with an optional hard mask layer or cap layer of insulating material 123, as described above.

Figure 19B:
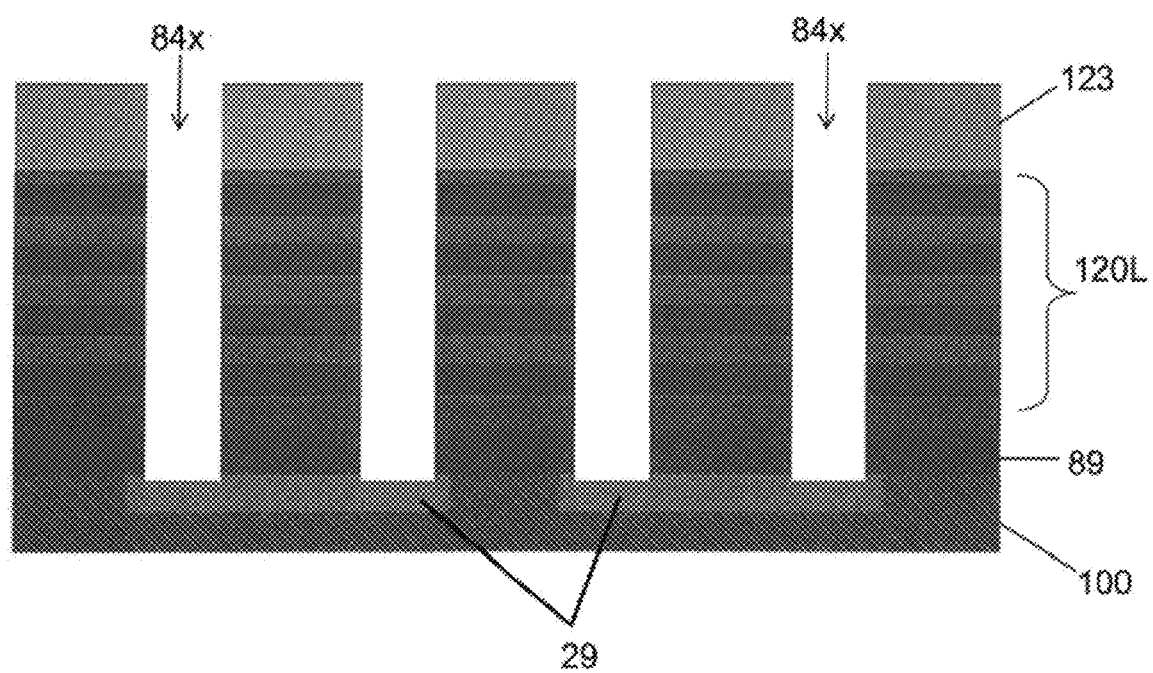

The deposition of layers 3, 121 is followed by etching the lower stack portion 120L to form a plurality of lower portions of the memory openings 84x, as shown in FIG. 19B. The etch stops on the sacrificial material region 29 such that the upper surface of region 29 is exposed at the bottom of the lower portions of the memory openings 84x. If an etch stop layer is present above region 29 below the stack, then the etch stops on the etch stop layer, the etch chemistry is changed and the lower portions of the memory openings 84x are etched through the etch stop layer. The hard mask layer 123 may be partially or completely consumed in the memory opening etching step.

Figure 19C:
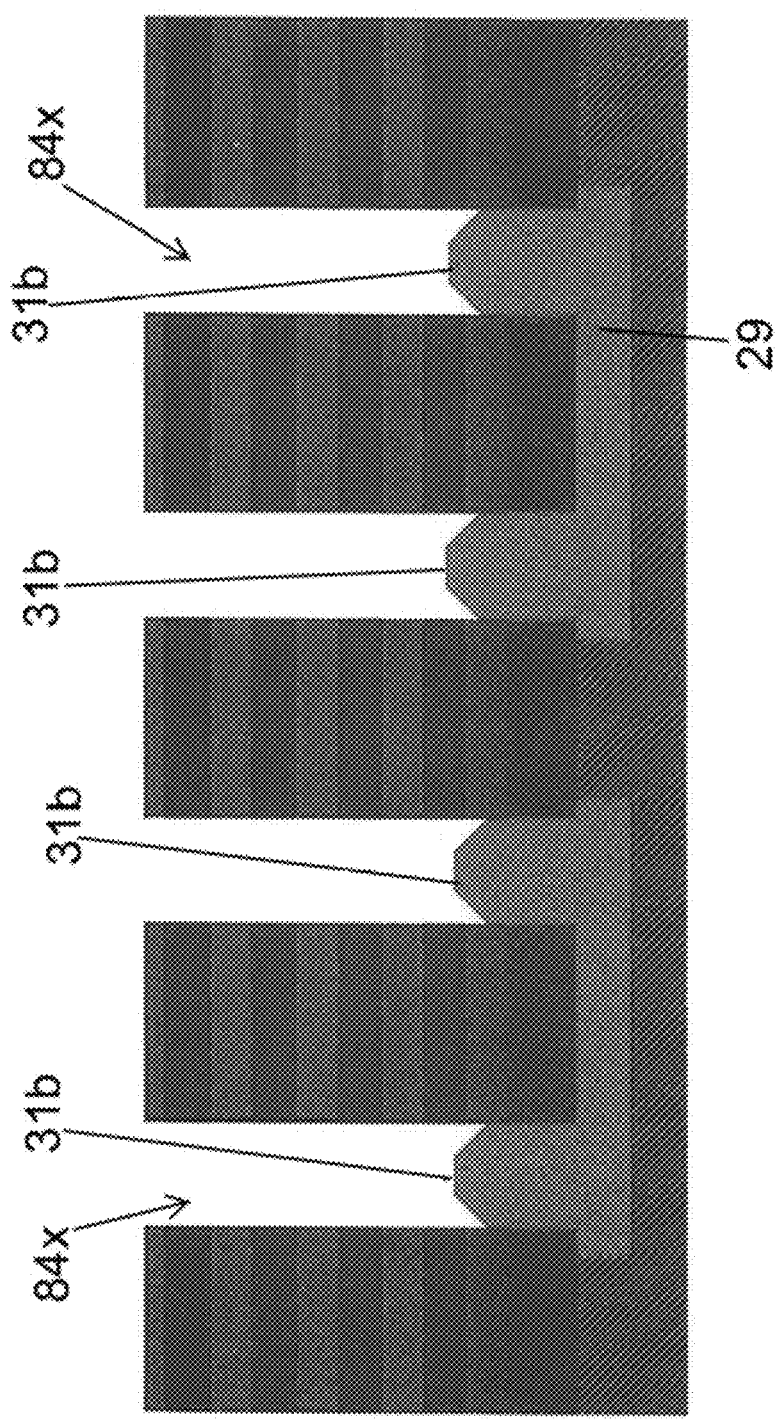

As shown in FIG. 19C, any remaining hard mask layer 123 material is removed by ashing (e.g., oxygen plasma ashing for a carbon hard mask) and/or wet cleaning. Then, the lower portions of the memory openings 84x are at least partially filled with a sacrificial material 31b. In this embodiment, at least partially filling the lower portion of the memory openings with a sacrificial material comprises selectively growing a germanium sacrificial material 31b using the exposed connecting sacrificial material 29 as a seed. The germanium sacrificial material 31b is grown vertically into the openings such that material 31b does not grow on an upper surface of the top insulating layer 121 of the lower stack portion 120L. The partially filled lower portion 84x of the memory openings are shown in FIG. 19C.

Figure 19D:
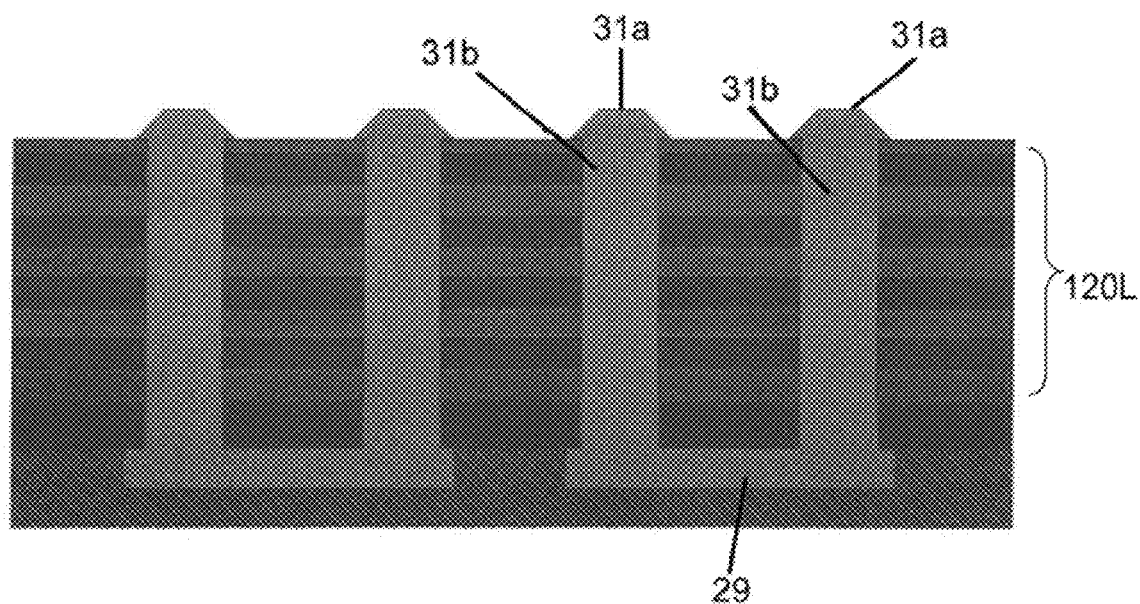

Preferably, the germanium sacrificial material growth continues until the germanium sacrificial material 31b completely fills the lower portion 84x of the memory openings, as shown in FIG. 19D. In other words, with adequate deposition time, the germanium crystals from adjacent seeds will completely fill the lower portion 84x of the memory openings. Any suitable selective germanium growth on Ge or SiGe seeds may be used, such as low temperature, low pressure chemical vapor deposition (LPCVD). For example, a growth temperature of 330 C to 600 C, such as 340 to 400 C, a pressure of 0.1 to 10 torr, such as 0.25 to 1.5 torr, and a germane source gas in nitrogen and/or hydrogen may be used.

As shown in FIG. 19D, the germanium sacrificial material 31b may overfill the lower portion 84x of the memory openings. This overfill may be retained as sacrificial material 31a which is used to form the landing pads, as shown in FIGS. 17D-17F.

Figure 19E:
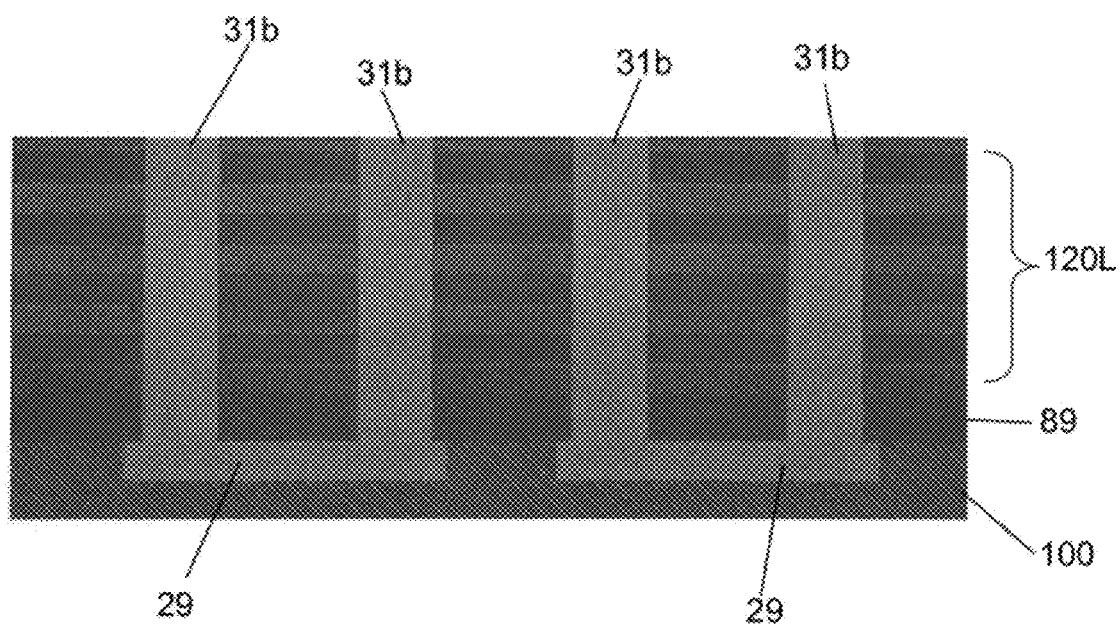

Alternatively, controlled etch back or CMP step may be conducted to remove the overfill 31a and planarize material 31b with the top of the lower portion of the stack 120L, as shown in FIG. 19E. If desired, the diameter of the top part of the lower portion 84x of the memory openings may optionally be widened for easier alignment in the subsequent lithography and etching steps and/or to form the landing pad 25, as shown in FIGS. 17D and 17H. Thus, the top parts may have a larger width (e.g., larger diameter) than the bottom parts of the lower portion 84x of the memory openings.

Figure 19F:
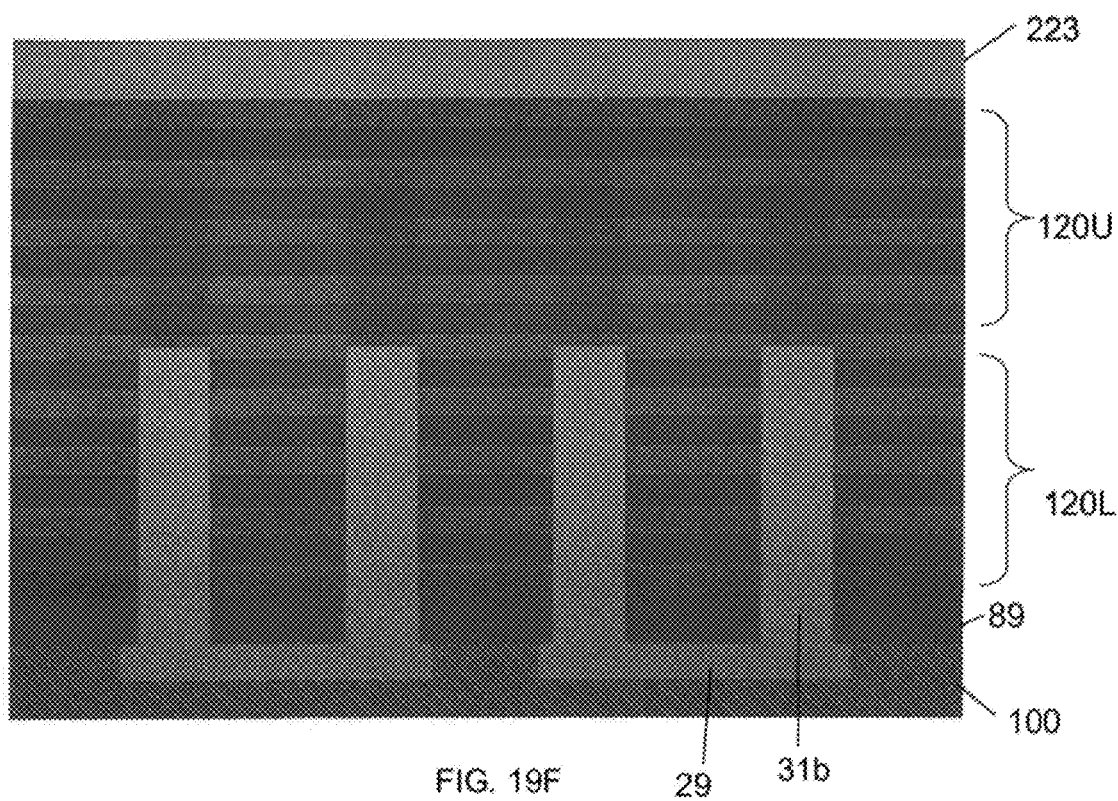

The method then proceeds in a similar manner as the method shown in FIGS. 17E-17H and 18E-18G. At least one additional portion of the stack (e.g., the upper portion of the stack) 120U is formed over the lower portion of the stack 120L, as shown in FIG. 19F. The additional portion of the stack 120U may also comprise alternating layers 3 and 121 described above, such as 24-32 pairs of these layers.

Figure 19G:
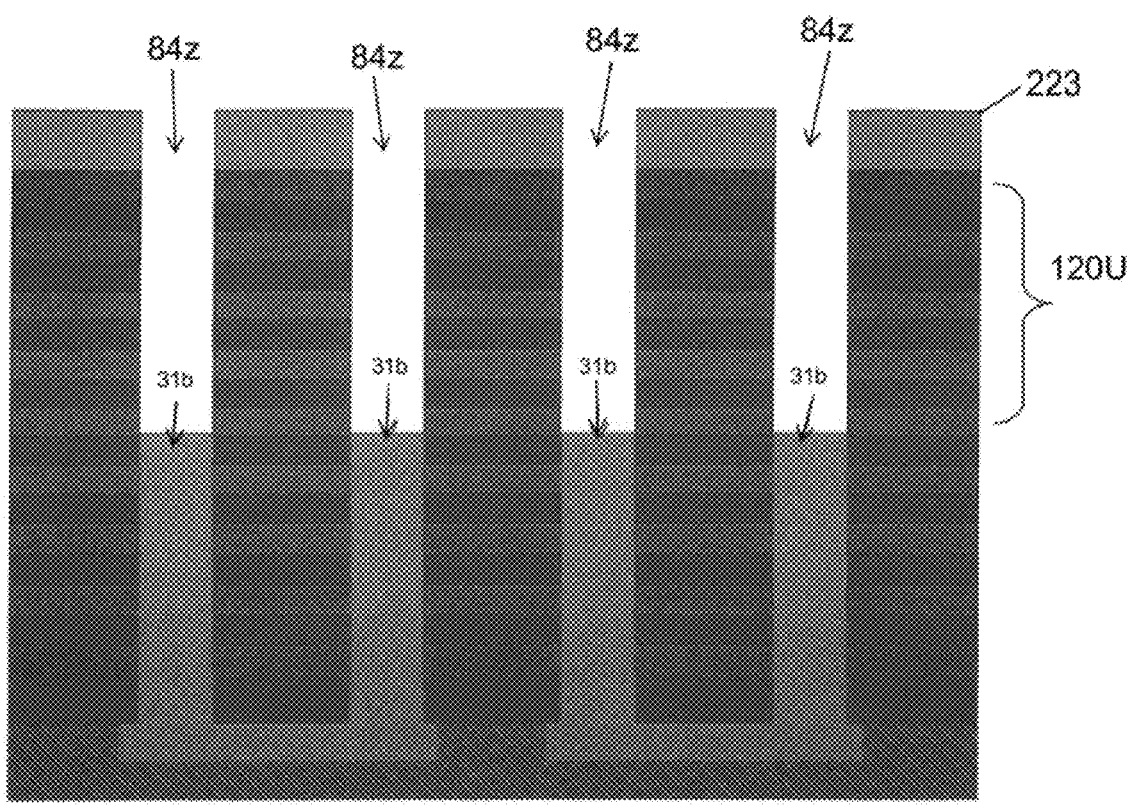

If desired, at least one second hard mask layer 223 is formed over the additional (e.g., upper) portion of the stack 120U, as shown in FIG. 19F. Layer 223 may comprise the same or different material as the hard mask layer 123. At least one additional portion (e.g., the upper portion) 84z of the memory openings are formed in the additional portion of the stack 120U to expose the sacrificial material 31b in the top part of the lower portion 84x of the memory openings, as shown in FIG. 19G.

If desired, the upper portion 84z of the memory openings may be intentionally or unintentionally misaligned with the lower portion 84x of the memory openings, as long as the upper portion 84z of the memory openings exposes a portion of the sacrificial material 31b in the optionally widened top parts of the lower portions 84x of the memory openings.

As shown in FIG. 19H, the sacrificial material 31b is removed from the lower portion 84x of memory openings 84 in the stack 120 and the connecting sacrificial region 29 is removed to form the connecting opening 30. The connecting sacrificial region 29 may be removed by selectively etching the Ge or SiGe connecting sacrificial region material during the step of selectively etching the germanium sacrificial material 31b in the memory openings 84 or in subsequent selective etching step. The etching of material 31b and region 29 may be conducted as described above with respect to FIG. 18G.

The etching step(s) form(s) the continuous memory openings 84 that extend through both the lower 120L and upper 120U portions of the stack 120. Each memory opening 84 includes portions 84z and 84x and the connecting opening 30. The entire memory films 13 are then formed in the memory openings 84 in the entire stack, as shown in FIG. 17G. The memory films 13 are formed as hollow cylinders around the sidewalls of the openings 84.

This is followed by forming the entire U-shaped channels 1 (and optionally the landing pads 25) in the memory openings 84 in the same growth step inside the hollow memory film 13 cylinder. The two wing portions 1a and 1b of the U-shape semiconductor channel 1 extend substantially perpendicular to the major surface 100a of the substrate 100 in portions 84z, 84x of the memory openings, and the connecting portion 1c of the U-shape semiconductor channel 1 which connects the two wing portions 1a, 1b extends substantially perpendicular (i.e., horizontally) to the major surface 100a of the substrate 100 in the connecting opening 30.

A slit trench or cut 86A is then formed between the select gates 3 and the wings or arms of the U-shaped channel 1, as shown in FIG. 17H. The slit trench or cut 86 may be etched until the etch stop layer 89 shown in FIG. 2B is reached during the etching. The trench or cut 86A may be filled with an insulating material 87, such as silicon nitride. The select gate transistors 16, the source line 102 and the bit line 202 are then formed above the device, as shown in FIG. 2B. Optionally, the substrate may include a body contact gate (e.g. bottom gate) 91 located adjacent to the connecting portion 1c of the U-shape semiconductor channel 1, as shown in FIG. 2B.

In another alternative embodiment illustrated in 20A to 20J, a combination of a spin-on self decomposable polymer material and an overlying sacrificial porous layer are used instead of the germanium sacrificial material.

Figures 20A, 20B, 20C:
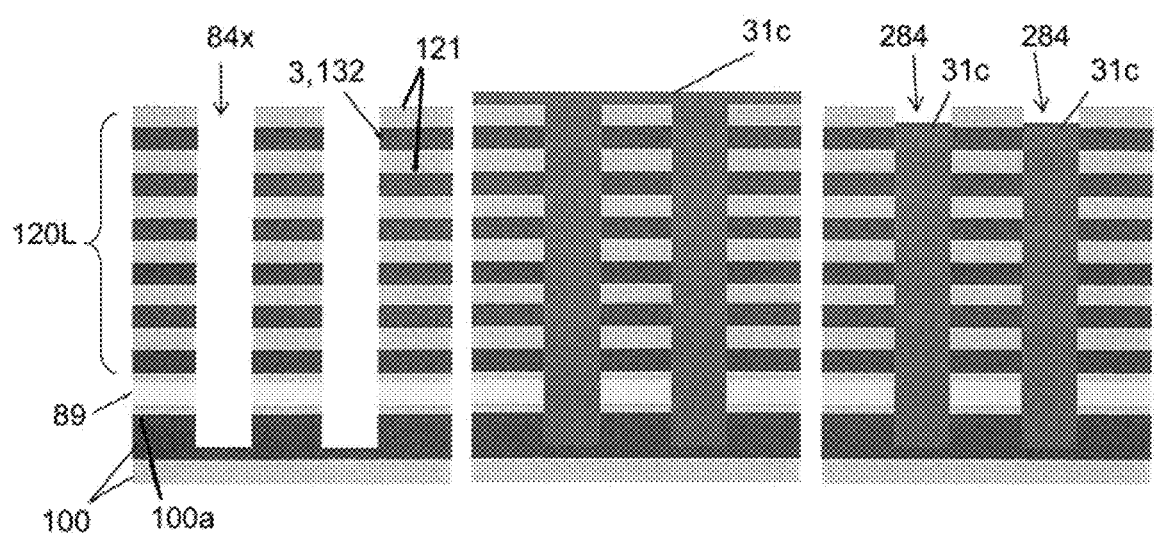

As shown in FIG. 20A, a lower portion of the stack 120L of alternating layers 3, 121 is formed over the major surface 100a of the substrate 100. In this embodiment, the stack portion 120L may include either the alternating insulating layers 121, such as silicon oxide layers, and polysilicon control gate material layers 3, described above with respect to FIG. 18A, or the alternating insulating layers 121 and sacrificial layers 132 as described above with respect to FIG. 7. The sacrificial material layers 132 are subsequently removed and replaced with a memory film and control gate electrodes, as described above. The lower portion of the stack 120L may be covered with an optional hard mask layer or cap layer of insulating material described above. An optional etch stop layer 89 may be located between the substrate 100 and the lower portion of the stack 120L.

The deposition of layers 3, 121 is followed by etching the lower stack portion 120L to form a plurality of lower portion 84x of the memory openings, as shown in FIG. 20A. The hard mask layer may be partially or completely consumed in this etching step. If the sacrificial material region 29 is present, then the etch is continued to remove the sacrificial material and leave a connecting opening 30 which connects two adjacent lower portions 84x of memory openings, as shown in FIG. 17B.

As shown in FIG. 20B, any remaining hard mask layer material is removed by ashing (e.g., oxygen plasma ashing for a carbon hard mask) and/or wet cleaning. Then, the lower portions of the memory openings 84x are at least partially filled with a sacrificial material. In this embodiment, at least partially filling the lower portion of the memory openings with a sacrificial material comprises filling the lower portion 84x of the memory opening with a spin-on self decomposable polymer material 31c and forming a sacrificial porous layer 31d over the polymer material 31c.

As shown in FIG. 20B, the polymer material 31c may be deposited by spin coating such that it overfills the lower portion 84x of the memory opening and remains on the top surface of the stack. In this case, the polymer material is etched back by any suitable selective etching method such that it is recessed below the top layer of the lower portion of the stack 120L to leave a recess 284 in the top part of the lower portion 84x of the memory openings, as shown in FIG. 20C. Alternatively, the polymer material 31c may be deposited by spin coating to underfill the lower portion 84x of the memory opening such that the recess 284 is formed at the end of the spin coating process.

Next, as shown in FIG. 20D, a sacrificial porous material 31d is deposited over the polymer material 31c. Any suitable porous material 31d may be used that permits gas or vapor to pass through it but which can support a solid overlying material. In one embodiment, the porous material 31d may comprise a microporous silicon oxide material, such as an ultra-low temperature ("ULT") silicon dioxide deposited by atomic layer deposition (ALD) or spin coating at a temperature below 300 C, such as −20 C to 200 C. For example, the microporous silicon dioxide may be formed by using semi-fluorinated surfactant sources at a temperature of 0 C and below.

As shown in FIG. 20D, the porous material 31D may be deposited such that it completely fills the recesses 284 and overfills the lower portion 84*x* of the memory opening and remains on the top surface of the stack. In this case, the porous material is planarized by any suitable etch back or planarization method such that its top surface is substantially planar with the top surface of the lower portion of the stack 120L, as shown in FIG. 20E.

Next, the polymer material 31*c* is heated to decompose the polymer material 31*c* into a vapor. The vapor flows out of the lower portion 84*x* of the memory openings through the pores in the sacrificial porous layer 31*d* to leave an air gap 384 in the lower portion 84*x* of the memory opening under the sacrificial porous layer 31*d*, as shown in FIG. 20F. Thus, the sacrificial porous layer 31*d* remains as plugs at the top of unfilled lower portion 84*x* of the memory openings. Any suitable heating, such as furnace annealing at 100-200 C may be used which is sufficient to vaporize the polymer material 31*c*.

The method then proceeds in a similar manner as the method shown in FIGS. 17E-17H. At least one additional portion of the stack (e.g., the upper portion of the stack) 120U is formed over the lower portion of the stack 120L, as shown in FIG. 20G. The additional portion of the stack 120U may also comprise alternating layers 3 and 121 (or 132 and 121) described above, such as 24-32 pairs of these layers. The sacrificial porous layers 31*d* may be used as an alignment mark during this step.

Figure 20J:
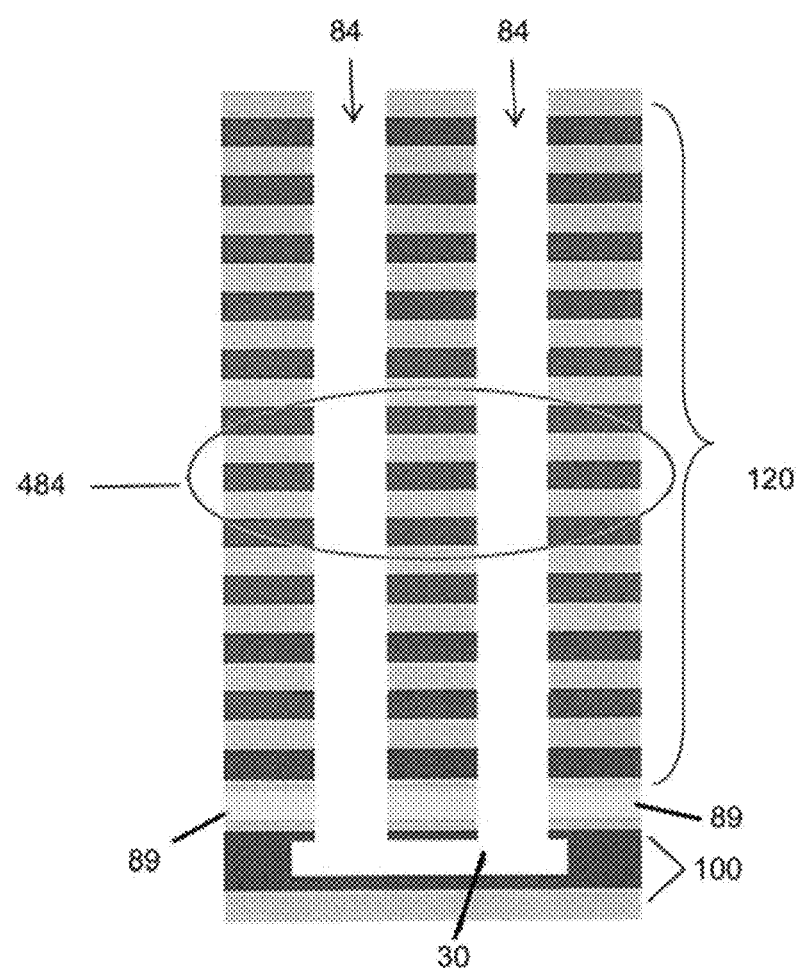

If desired, at least one second hard mask layer 223 is formed over the additional (e.g., upper) portion of the stack 120U, as shown in FIG. 20H. At least one additional portion (e.g., the upper portion) 84*z* of the memory openings are formed in the additional portion of the stack 120U to expose sacrificial porous layer 31*d* in the top part of the lower portions 84*x* of the memory openings, as shown in FIG. 20I. If desired, the etching of the upper portions 84*z* of the memory openings may continue through the sacrificial porous layer 31*d* if layers 31*d* and 121 comprise the same material (e.g., silicon oxide) to remove the layer 31*d* and form the continuous memory openings 84 in stack 120, as shown in FIG. 20J. Alternatively, a separate etching step may be used to remove layer 31*d* from the openings 84. In this case, if layer 31*d* is used as an alignment mark, then misalignment of the lower portion 84*x* and the upper portion 84*z* of the memory openings 84 in area 484 may be reduced or avoided and dummy word lines would not be needed.

The method of FIGS. 20A-20J may be used to form any suitable VNAND devices described above (e.g., TCAT, P-BiCS or CVNAND type devices). As described above, the entire memory films 13 are then formed in the memory openings 84 in the entire stack 120, as shown in FIG. 17G. The memory films 13 are formed as hollow cylinders around the sidewalls of the openings 84. This is followed by forming the entire channels 1 in the memory openings 84 in the same growth step inside the hollow memory film 13 cylinder, as shown in FIG. 17H. Optionally, for a P-BiCS type device with a U-shaped channel, the memory opening etching is continued into the sacrificial material region 29 to remove the sacrificial material and leave a connecting opening 30 which connects two adjacent lower portions of memory openings 84*x*, and the sacrificial a slit trench or cut 86A is formed between the select gates 3 and the wings or arms of the U-shaped channel 1, as shown in FIGS. 17A, 17B and 17H.

In another alternative embodiment illustrated in FIGS. 21A to 21F, a non-conformal sacrificial layer is formed over the lower portion of the memory openings such that the sacrificial layer pinches off a top of the lower portion of the memory openings and leaves an air gap below it in the lower portion of the memory openings.

Figure 21A:
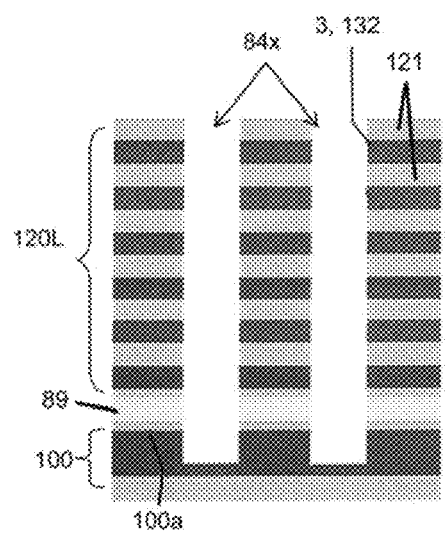

As shown in FIG. 21A, a lower portion of the stack 120L of alternating layers 3, 121 is formed over the major surface 100*a* of the substrate 100. In this embodiment, the stack portion 120L may include either the alternating insulating layers 121, such as silicon oxide layers, and polysilicon control gate material layers 3, described above with respect to FIG. 18A, or the alternating insulating layers 121 and sacrificial layers 132 as described above with respect to FIG. 7. The sacrificial material layers 132 are subsequently removed and replaced with a memory film and control gate electrodes, as described above. The lower portion of the stack 120L may be covered with an optional hard mask layer or cap layer of insulating material described above. An optional etch stop layer 89 may be located between the substrate 100 and the lower portion of the stack 120L.

The deposition of layers 3, 121 is followed by etching (e.g., by reactive ion etching) the lower stack portion 120L to form a plurality of lower portions 84*x* of the memory openings, as shown in FIG. 21A. The hard mask layer may be partially or completely consumed in this etching step. If the sacrificial material region 29 is present, then the etch is continued to remove the sacrificial material and leave a connecting opening 30 which connects two adjacent lower portions 84*x* of memory openings, as shown in FIG. 17B.

As shown in FIG. 20B, any remaining hard mask layer material is removed by ashing (e.g., oxygen plasma ashing for a carbon hard mask) and/or wet cleaning. Then, the lower portion 84*x* of the memory openings are at least partially filled with a sacrificial material. In this embodiment, at least partially filling the lower portion of the memory openings with a sacrificial material comprises forming a non-conformal sacrificial layer 31*e* over the lower portion 84*x* of the memory openings such that the sacrificial layer 31*e* pinches off a top of the lower portion of the memory openings and leaves an air gap 384 below it in the lower portion 84*x* of the memory openings, as shown in FIG. 21B.

Any suitable non-conformal layer 31*e* which does not fill an underlying opening may be used. For example, a silicon nitride layer 31*e* formed by high pressure chemical vapor deposition (HPCVD) and/or by plasma enhanced CVD (PECVD) at a temperature of 400 C to 525 C may be non-conformal. Materials other than silicon nitride, such as a non-conformal silicon oxide may also be used.

Figure 21B:
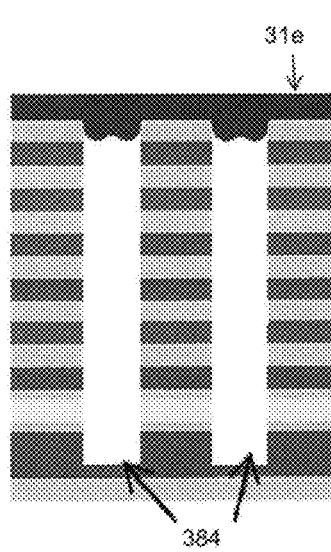
Figure 21C:
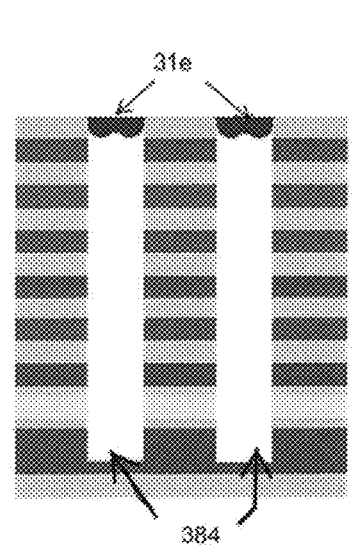

The silicon nitride layer 31*e* may be deposited such that it overfills the lower portion 84*x* of the memory opening and remains on the top surface of the stack, as shown in FIG. 21B. In this case, the layer 31*e* is planarized by any suitable etch back or planarization method such that its top surface is substantially planar with the top surface of the lower portion of the stack 120L, as shown in FIG. 21C. Thus, forming the non-conformal sacrificial layer 31*e* comprises forming a sacrificial silicon nitride layer by high pressure CVD over the entire lower portion of the memory stack 120L and in the top of the lower portion 84*x* of the memory openings, followed by planarization or etch-back to leave the sacrificial silicon nitride 31*e* only in the top of the lower portion 84*x* of the memory openings as a plug.

The method then proceeds in a similar manner as the method shown in FIGS. 17E-17H. At least one additional portion of the stack (e.g., the upper portion of the stack) 120U is formed over the lower portion of the stack 120L, as shown in FIG. 21D. The additional portion of the stack 120U may also comprise alternating layers 3 and 121 (or 132 and 121) described above, such as 24-32 pairs of these layers. The silicon nitride layer 31e may be used as an alignment mark during this step.

If desired, at least one second hard mask layer 223 (e.g., a carbon advanced patterning film hard mask) is formed over the additional (e.g., upper) portion of the stack 120U, as shown in FIG. 21E. At least one additional portion (e.g., the upper portion) 84z of the memory openings are formed in the additional portion of the stack 120U to expose sacrificial silicon nitride layer 31e in the top part of the lower portion 84x of the memory openings, as shown in FIG. 21E.

Next, the sacrificial silicon nitride layer 21E is removed in a separate etching step (e.g., a silicon nitride selective etch, such as a hot phosphoric acid etch) from the openings 84, as shown in FIG. 21F. Alternatively, the etching of the upper portions 84z of the memory openings may continue through the sacrificial non-conformal layer 31e if layers 31e and 121 comprise the same material (e.g., non-conformal silicon oxide 31e and conformal silicon oxide 121) to remove the layer 31e and form the continuous memory openings 84. Thus, removing the sacrificial material layer 31e comprises either etching the silicon nitride 31e during the step of forming the upper portion 84z of the memory openings by etching the upper portion of the memory openings in the upper portion of the memory stack, or etching the silicon nitride 31e using a hot phosphoric acid selective wet etch after the step of forming the upper portion 84z of the memory openings. If layers 31e are used as an alignment mark, then misalignment of the lower portion 84x and the upper portion 84z of the memory openings 84 may be reduced or avoided and dummy word lines would not be needed.

The method of FIGS. 21A-21F may be used to form any suitable VNAND devices described above (e.g., TCAT, P-BiCS or CVNAND type devices). As described above, the entire memory films 13 are then formed in the memory openings 84 in the entire stack 120, as shown in FIG. 17G. The memory films 13 are formed as hollow cylinders around the sidewalls of the openings 84. This is followed by forming the entire channels 1 in the memory openings 84 in the same growth step inside the hollow memory film 13 cylinder, as shown in FIG. 17H. Optionally, for a P-BiCS type device with a U-shaped channel, the memory opening etching is continued into the sacrificial material region 29 to remove the sacrificial material and leave a connecting opening 30 which connects two adjacent lower portions of memory openings 84x, and the sacrificial a slit trench or cut 86A is formed between the select gates 3 and the wings or arms of the U-shaped channel 1, as shown in FIGS. 17A, 17B and 17H.

It should be noted that while the formation of the landing pad 25 was not illustrated in the methods of FIGS. 18-21, it should be understood that the landing pad 25 may optionally be formed using the method of FIGS. 17D-17H in the methods illustrated in FIGS. 18, 19, 20 and/or 21.

Figure 1A:
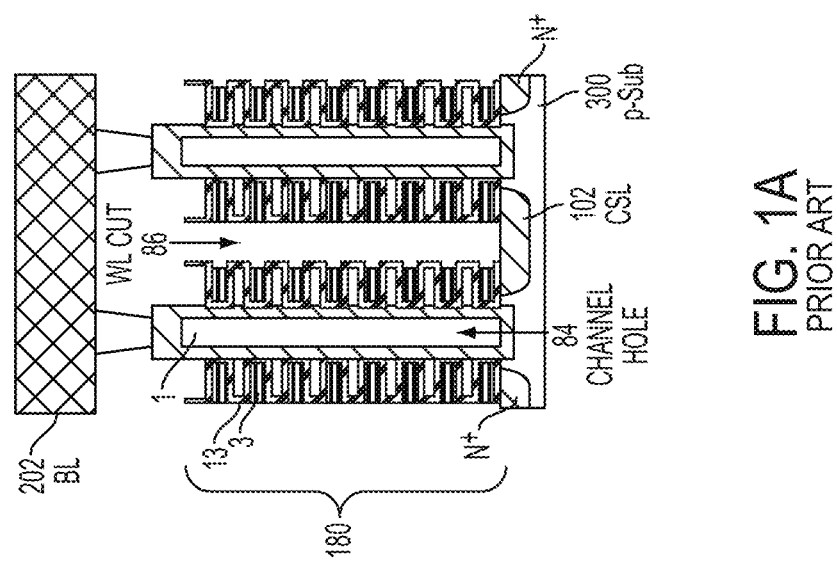
FIG. 1A is a side cross sectional views of a prior art NAND memory device.

In another embodiment of the present disclosure, the VNAND devices described above (e.g., TCAT, P-BiCS or CVNAND type devices) may have a channel 1 comprising a mixed metal oxide semiconductor material. The devices with the mixed metal oxide semiconductor channel may include the landing pads 25 and be made by the sequential stack etching process described above. Alternatively, the VNAND devices with the oxide semiconductor channel may exclude the landing pad and have the entire memory holes etched in one step (e.g., such as the devices shown in FIGS. 1A and 1B).

Any suitable mixed metal oxide semiconductor material may be used. For example, the mixed metal oxide semiconductor comprises at least one first transition metal and at least one second metal selected from Group IIIA of the Periodic Table of Elements. The mixed metal oxide semiconductor my comprise one first transition metal from Group IIB (also known as Group 12) of the Periodic Table of Elements and two metals selected from Group IIIA (also known as Group 13) of the Periodic Table of Elements. Preferably, the mixed metal oxide comprises indium gallium zinc oxide (stoichiometric $InGaZnO_4$ or non-stoichiometric material). Other mixed metal oxide semiconductors, such as zinc tin oxide (stoichiometric $ZnSnO_3$ or non-stoichiometric material) or indium zinc oxide may also be used. The mixed metal oxide channels have a low leakage current and may be deposited at a low temperature (e.g., below 300 C, such as 100-270 C) into high aspect ratio memory holes 84 using atomic layer deposition (ALD) or other suitable methods.

In yet another alternative embodiment illustrated in FIGS. 22A to 21L, a non-conformal sacrificial layer is formed over the lower portion of the memory openings such that the sacrificial layer forms a cavity, i.e., the air gap, that is encapsulated by the non-conformal sacrificial material layer within the memory openings.

As shown in FIG. 22A, a bottom dielectric layer 2210 can be formed on a major surface 100a of a substrate 100. The bottom dielectric layer 2210 can be a dielectric layer that is employed as a gate dielectric for select gate electrodes to be subsequently formed directly on a top surface of the bottom dielectric layer 2210. The bottom dielectric layer 2210 can be, for example, a silicon oxide layer having a thickness in a range from 2 nm to 10 nm, although lesser and greater thicknesses can also be employed.

A lower portion of the stack 120L including alternating layers (121, 132) is formed over the bottom dielectric layer 2210 of the substrate 100. In this embodiment, the stack portion 120L can include the alternating stack of insulating layers (e.g., silicon oxide) 121 and sacrificial layers (e.g., different insulating layers, such as silicon nitride) 132 as described above with respect to FIG. 7. The sacrificial material layers 132 are subsequently removed and replaced with control gate electrodes and optionally with at least a portion of the memory film, such as a blocking dielectric, as described above. The lower portion of the stack 120L may be covered with an optional hard mask layer or cap layer of insulating material described above.

The deposition of layers (121, 132) is followed by etching (e.g., by reactive ion etching) the lower stack portion 120L to form a plurality of lower portions 84x of the memory openings, as shown in FIG. 22B. A soft mask (such as a photoresist layer) or a disposable hard mask may be employed for forming a pattern of openings over the lower stack portion 120L, and for transferring the pattern of the openings through the lower stack portion 120L to form the plurality of lower portions 84x of the memory openings. The soft mask or the disposable hard mask can be subsequently removed selective to the materials of the lower stack portion 120L and the substrate 100, for example, by ashing (e.g., oxygen plasma ashing for a carbon hard mask) and/or wet cleaning. Each lower portions 84x of the memory openings extends into the substrate 100, and may form a recessed region in the substrate 100. Alternatively, any of the previously described methods for patterning the lower stack portion 120L can be employed.

Referring to FIG. 22C, an epitaxial pedestal 2230 can be optionally formed by a selective epitaxy process from the physically exposed surfaces of the substrate 100 at the bottom of each lower portion 84x of the memory openings. A single crystalline semiconductor material (such as single crystalline silicon) is deposited on the physically exposed semiconductor surfaces (e.g., single crystal silicon surfaces) of the substrate 100 during the selective epitaxy process, while the semiconductor material does not grow from dielectric surfaces of the lower stack portion 120L. The epitaxial pedestal 2230 can have a doping of a same conductivity type as the portion of the substrate 100 that the epitaxial pedestal 2230 contacts. The epitaxial pedestal 2230 can be doped with in-situ doping, or can be doped by ion implantation.

Figures 22D, 22E, 22F:
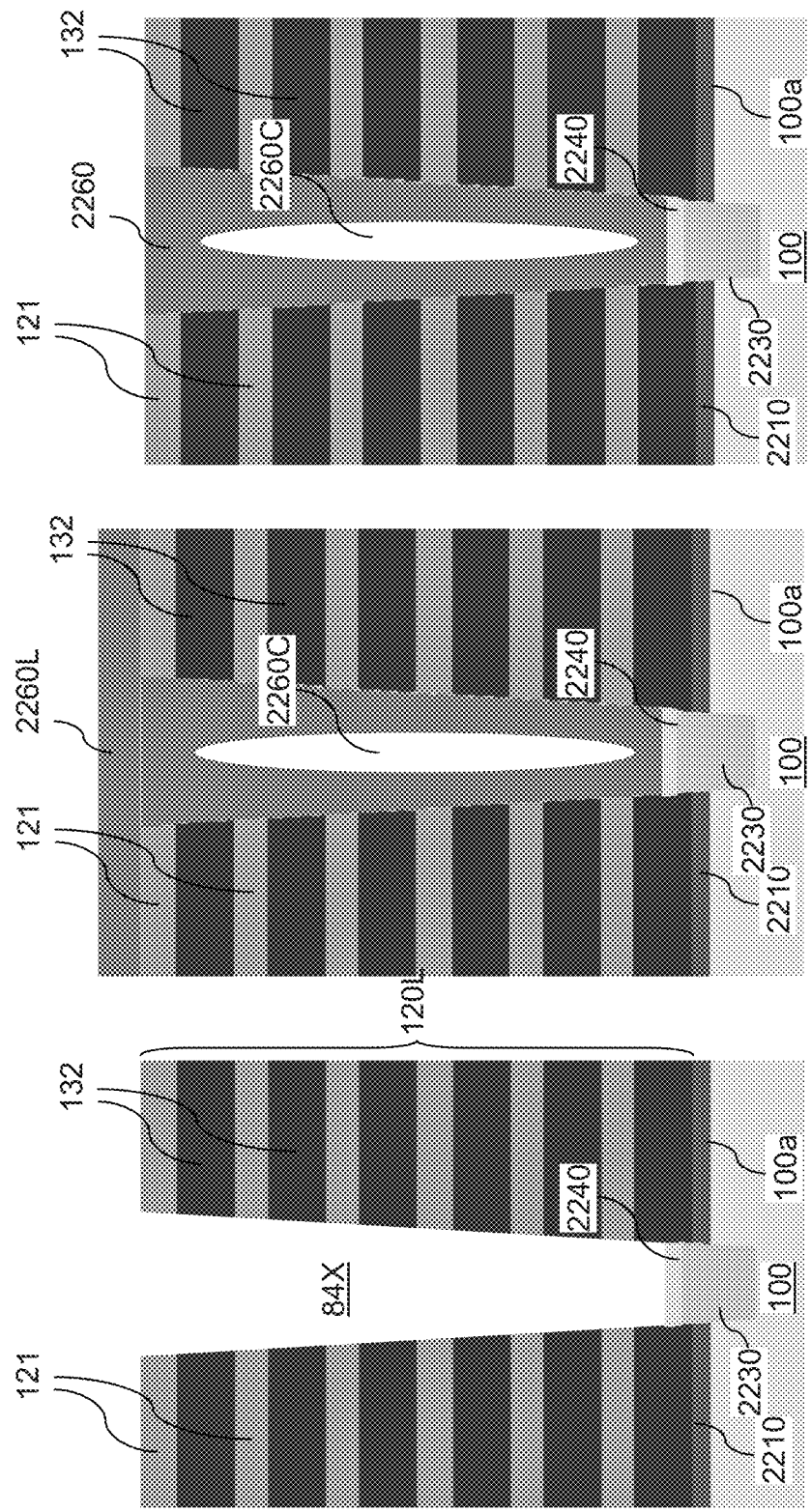

Referring to FIG. 22D, an oxidation process is performed to convert a topmost portion of the epitaxial pedestal 2230 into a semiconductor oxide portion 2240 at a bottom of each lower portion 84x of the memory openings. In one embodiment, the semiconductor oxide portion 2240 can be a silicon oxide portion. Thermal oxidation or plasma oxidation may be employed. In case thermal oxidation is employed, wet oxidation or dry oxidation may be employed. The thickness of the epitaxial pedestal 2230 can be in a range from 2 nm to 10 nm, although lesser and greater thicknesses can also be employed. If the pedestal 2230 is omitted, then the oxide portion 2240 may be formed directly on the exposed portions of the semiconductor (e.g., silicon) substrate 100.

Referring to FIG. 22E, a sacrificial material layer 2260L is deposited in the lower portions 84x of the memory openings and over the lower stack portion 120L by a non-conformal deposition process (such as plasma enhanced chemical vapor deposition (PECVD)). The sacrificial material layer 2260L includes a material that can be removed selective to the silicon oxide portion 2240 and the lower stack portion 120L materials (e.g., insulating materials, such as silicon oxide and silicon nitride). In one embodiment, the sacrificial material layer 2260L can include an amorphous semiconductor material, such as amorphous silicon. The amorphous silicon may be deposited by PECVD with a fast deposition rate in a diffusion control mode to achieve a non-uniform deposition of layer 2260L in the openings.

The non-conformal deposition process deposits the sacrificial material such that the thickness of the deposited sacrificial material layer decreases with the depth from the top surface of the lower stack portion 120L within each lower portion 84x of the memory openings. An encapsulated cavity 2260C is formed within each lower portion 84x of the memory openings. As used herein, an "encapsulated cavity" refers to a cavity of which the entire boundary consists of a set of surfaces of solid material portions. The entire surfaces of each encapsulated cavity 2260C consist of a single contiguous set of surfaces of the sacrificial material layer 2260L.

Referring to FIG. 22F, a planarization process is performed to remove portions of the sacrificial material layer 2260L located above a horizontal plane including the top surface of the lower stack portion 120L. Each remaining portion of the sacrificial material layer 2260L within the lower portions 84x of the memory openings constitutes a sacrificial material portion 2260 that includes an encapsulated cavity 2260C therein. Surfaces of each encapsulated cavity 2260C are inner surfaces of a sacrificial material portion 2260, which are spaced from outer surfaces of the sacrificial material portion 2260 by a non-zero thickness. As shown in FIG. 22F, the semiconductor material of the sacrificial material portion 2260 is located over bottom and side surfaces each lower portion 84x of the memory openings. Thus, the inner surfaces of the sacrificial material portion 2260 form top, bottom and side surfaces of the encapsulated cavity 2260C.

The method then proceeds in a similar manner as the method shown in FIGS. 17E-17H. At least one additional portion of the stack (e.g., the upper portion of the stack) 120U is formed over the lower portion of the stack 120L, as shown in FIG. 22G. The upper portion of the stack 120U may comprise an additional alternating stack of insulating layers (e.g., silicon oxide) 121 and sacrificial layers (e.g., silicon nitride) 132.

Referring to FIG. 22H, additional portions (e.g., the upper portion) 84z of the memory openings are formed in the upper portion of the stack 120U by applying a photoresist layer (not shown), lithographically patterning the photoresist layer to form a pattern of openings that overlies the sacrificial material portions 2260, and transferring the pattern of the openings in the photoresist layer through the upper portion of the stack 120U by an anisotropic etch. Each upper portion 84z of the memory openings extends to an upper portion of an underlying sacrificial material portion 2260.

Referring to FIG. 22I, each sacrificial material portion 2260 is removed in another etching step, which may include an optional anisotropic etch step and an isotropic etch step. In case the sacrificial material portions 2260 include a semiconductor material (such as amorphous silicon), an etchant gas (such as hydrogen chloride) can be employed. The semiconductor sacrificial material portions 2260 can be removed selective to the silicon oxide portions 2240 and the stack (120U, 120L) of alternating insulating layers (121, 132). The semiconductor oxide (e.g., silicon oxide) portion 2240 separates the amorphous silicon of the portions 2260 from the silicon pedestal 2230 or silicon substrate 100. Thus, the oxide portion 2240 acts as an etch stop during the etching of the portions 2260. If desired, another etch stop material portion 2240, such as silicon nitride, may be used instead of silicon oxide. A contiguous memory opening 84 extending through the stack (120U, 120L) of alternating layers (121, 132) is formed within the volume of each stack of a lower portion 84x and an upper portion 84x.

Referring to FIG. 22J, a stack of material layers is formed in the contiguous memory openings 84. The stack of material layers can include, for example, a blocking dielectric layer 2282, a charge storage layer 2284, a tunneling dielectric layer 2286, and a first semiconductor channel layer 2288. The blocking dielectric layer 2282 can include silicon oxide and/or a dielectric metal oxide. The charge storage layer 2284 can include a charge storage material such as silicon nitride. The tunneling dielectric layer 2286 can include a suitable tunneling dielectric material such as an ONO stack. The first semiconductor channel layer 2288 can include, for example, amorphous silicon.

Referring to FIG. 22K, an anisotropic etch can be performed to remove horizontal portions of the stack of material layers (2282, 2284, 2286, 2288) and oxide portion 2240 at the bottom of each contiguous memory opening 84, thereby physically exposing surfaces of the epitaxial pedestals 2230. Openings are formed through the stack of material layers (2282, 2284, 2286, 2288) underneath each contiguous memory opening 84. Subsequently, a center portion of each semiconductor oxide portion 2240 can be removed by the anisotropic etch. A remaining portion of each semiconductor oxide portion 2240 can have an annular shape.

Referring to FIG. 22L, an additional semiconductor material is deposited in the cavity within each contiguous memory opening 84. Thus, each contiguous memory opening 84 can be filled with the additional semiconductor material, which contacts the semiconductor surfaces of the substrate 100 or the pedestal 2230 (if the pedestal is present). Portions of the additional semiconductor material can be removed from above a horizontal plane including a top surface of the upper portion of the memory stack 120U by a planarization process, which can be, for example, a chemical mechanical planarization process or a recess etch process. Each remaining contiguous set of the semiconductor material of the first semiconductor channel layer 2288 and the semiconductor material of the additional semiconductor collectively forms a semiconductor channel 2290 within each contiguous memory opening 84. In one embodiment, the channel 2290 fills the entire remaining inner space of the opening 84. In another embodiment, the channel 2290 does not fill the entire remaining inner space of the opening 84, and a dielectric core 2 described with respect to prior embodiments may be formed over the channel 2290 to fill the remaining inner space of the opening 84.

The method of FIGS. 22A-22L may be used to form any suitable vertical NAND devices such as those described above (e.g., TCAT, P-BiCS or CVNAND type devices) or different vertical NAND devices.

The methods of FIGS. 22A-22L can be employed in any of the previously described structures to form sacrificial material portions 2260 including encapsulated cavities 2260C therein. Thus, any of the sacrificial materials described above may be formed as a sacrificial material portion including an encapsulated cavity therein and/or including a semiconductor material, insulating material, polymer material or a carbon material. However, a semiconductor sacrificial material is advantageous in this embodiment over an insulating sacrificial material because it is easier to selectively etch the semiconductor material without damaging the insulating stack layers 121, 132. A semiconductor sacrificial material is also advantageous in this embodiment over polymer sacrificial material because a semiconductor material is easier to handle during planarization (e.g., does not generate polymer residue during CMP) and permits higher stack heights to be used.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:
1. A method of making a vertical NAND device, comprising:
    forming a lower portion of a memory stack over a substrate;
    forming a lower portion of memory openings in the lower portion of the memory stack;
    partially filling each lower portion of the memory openings with a sacrificial material to leave an air gap in each lower portion of the memory openings below the sacrificial material;
    forming an upper portion of the memory stack over the lower portion of the memory stack and over the sacrificial material;
    forming an upper portion of the memory openings in the upper portion of the memory stack to expose the sacrificial material in the lower portion of the memory openings;
    removing the sacrificial material to connect the lower portion of the memory openings with a respective upper portion of the memory openings to form continuous memory openings extending through the upper and the lower portions of the memory stack; and
    forming a semiconductor channel in each continuous memory opening.

2. The method of claim 1, wherein partially filling each lower portion of the memory openings with a sacrificial material to leave an air gap in each lower portion of the memory openings below the sacrificial material comprises forming a sacrificial material portion having the air gap comprising an encapsulated cavity therein within each lower portion of the memory openings.

3. The method of claim 2, wherein the sacrificial material portions comprise a semiconductor material.

4. The method of claim 3, wherein the semiconductor material comprises amorphous silicon deposited by plasma enhanced chemical vapor deposition.

5. The method of claim 3, wherein the semiconductor material of the sacrificial material portion is located over bottom and side surfaces of each lower portion of the memory openings.

6. The method of claim 5, wherein:
    each encapsulated cavity consists of a volume defined by the inner surfaces of a respective sacrificial material portion that are spaced from outer surfaces of the respective sacrificial material portion; and
    the inner surfaces of the respective sacrificial material portion form top, bottom and side surfaces of the encapsulated cavity.

7. The method of claim 2, further comprising forming an epitaxial pedestal comprising a single crystalline material on a physically exposed semiconductor surface of the substrate at a bottom of each lower portion of memory openings.

8. The method of claim 7, further comprising converting an upper portion of each epitaxial pedestal into a semiconductor oxide portion, wherein each sacrificial material portion is formed directly on an underlying semiconductor oxide portion.

9. The method of claim 8, wherein each semiconductor oxide portion is a silicon oxide portion.

10. The method of claim 7, further comprising forming a stack of material layers in each memory opening, wherein the stack of material layers comprises:
    a blocking dielectric layer deposited on sidewalls of the memory openings;
    a charge storage layer deposited on the blocking dielectric layer; and
    a tunneling dielectric layer deposited on the charge storage layer.

11. The method of claim 10, wherein:
    the stack of material layers further comprises a first semiconductor channel layer comprising a semiconductor material and deposited on the tunneling dielectric layer; and
    the method further comprises forming an opening through the stack of material layers underneath each contiguous memory opening by removing horizontal portions of the stack of material layers underneath each contiguous memory opening by an anisotropic etch.

12. The method of claim 11, further comprising removing a center portion of each semiconductor oxide portion after forming the openings through the stack of material layers.

13. The method of claim 12, wherein a remaining portion of each semiconductor oxide portion has an annular shape.

14. The method of claim 12, further comprising:

filling each contiguous memory opening with an additional semiconductor material after removing center portions of the semiconductor oxide portions; and removing portions of the additional semiconductor material from above a horizontal plane including a top surface of the upper portion of the memory stack, wherein each remaining portion of the first semiconductor channel layer and the additional semiconductor material constitutes the semiconductor channel.

15. The method of claim 1, wherein:

the lower and the upper portions of the memory stack comprise alternating insulating and sacrificial layers;

the sacrificial material layers are removed and replaced with control gate electrodes; and the control gate electrodes comprise at least a first control gate electrode located in a first device level and a second control gate electrode located in a second device level located over the major surface of the substrate and below the first device level.

16. The method of claim 15, further comprising forming a memory film which comprises at least one charge storage region located between blocking and tunneling dielectric layers in each continuous memory opening prior to the step of forming the semiconductor channel.

17. The method of claim 16, wherein:

the tunnel dielectric layer is located adjacent to the semiconductor channel;

the charge storage region is located adjacent to the tunnel dielectric layer; and the blocking dielectric layer is located adjacent to the charge storage region.

18. The method of claim 17, wherein:

the control gate electrodes comprise, or are, electrically connected to a respective word line of the vertical NAND device;

the substrate comprises a silicon substrate;

the vertical NAND device comprises an array of monolithic three dimensional NAND strings over the silicon substrate;

at least one memory cell in the first device level of the three dimensional array of NAND strings is located over another memory cell in the second device level of the three dimensional array of NAND strings; and the silicon substrate contains an integrated circuit comprising a driver circuit for the memory device located thereon.

19. The method of claim 1, wherein the lower and the upper portions of the memory stack comprise alternating insulating and control gate material layers.

20. The method of claim 1, wherein the lower portion of the memory openings is formed by etching the lower portion of the memory stack using a first hard mask, and the upper portion of the memory openings is formed by etching the upper portion of the memory stack using at least one second hard mask.

* * * * *